(12) United States Patent
Andersen et al.

(10) Patent No.: US 12,218,268 B2
(45) Date of Patent: Feb. 4, 2025

(54) FAST SPATIAL LIGHT MODULATOR BASED ON ATOMICALLY THIN REFLECTOR

(71) Applicant: President and Fellows of Harvard College, Cambridge, MA (US)

(72) Inventors: Trond I. Andersen, Cambridge, MA (US); Ryan J. Gelly, Cambridge, MA (US); Giovanni Scuri, Cambridge, MA (US); Bo L. Dwyer, Cambridge, MA (US); Dominik S. Wild, Garching (DE); Rivka Bekenstein, Cambridge, MA (US); Andrey Sushko, Cambridge, MA (US); Susanne F. Yelin, Cambridge, MA (US); Philip Kim, Cambridge, MA (US); Hongkun Park, Cambridge, MA (US); Mikhail D. Lukin, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 516 days.

(21) Appl. No.: 17/678,393

(22) Filed: Feb. 23, 2022

(65) Prior Publication Data
US 2022/0271187 A1   Aug. 25, 2022

Related U.S. Application Data

(60) Provisional application No. 63/153,726, filed on Feb. 25, 2021.

(51) Int. Cl.
*H01L 31/113* (2006.01)
*H01L 31/0224* (2006.01)
*H01L 31/032* (2006.01)

(52) U.S. Cl.
CPC .. *H01L 31/1136* (2013.01); *H01L 31/022466* (2013.01); *H01L 31/032* (2013.01)

(58) Field of Classification Search
CPC ......... H01L 31/1136; H01L 31/022466; H01L 31/032; G02F 2203/02; G02F 2203/12;
(Continued)

(56) References Cited

U.S. PATENT DOCUMENTS

| | | | |
|---|---|---|---|
| 2007/0230969 A1* | 10/2007 | Yutani ................. | H04B 10/505 398/183 |
| 2009/0021822 A1* | 1/2009 | Ikeda ..................... | G02F 1/153 359/267 |

(Continued)

Primary Examiner — Karen Kusumakar
Assistant Examiner — Shawn Shaw Muslim
(74) Attorney, Agent, or Firm — FOLEY HOAG LLP

(57) ABSTRACT

An optical device useful for spatial light modulation. The device comprises: a semiconductor layer having a first surface and a second surface, the semiconductor having an electric field-dependent resonance wavelength; a first electrode electrically connected to the semiconductor layer; a first insulating layer adjacent to the first surface of the semiconductor layer, and a second insulating layer adjacent to the second surface of the semiconducting layer, the first and the second insulating layers each being optically transparent at the resonance wavelength; a first group of at least one gate electrodes disposed adjacent to the first insulating layer, and a second group of at least one gate electrodes disposed adjacent to the second insulating layer, each gate electrode being at least 80% optically transparent at the resonance wavelength; wherein the first and the second groups of gate electrodes, taken together, form at least two regions in the semiconductor layer, an electrostatic field in each of the at least two regions being independently controllable by application of voltage to the first and the second groups of gate electrodes, the at least two regions abutting each other along at least one boundary.

15 Claims, 70 Drawing Sheets

(58) Field of Classification Search
CPC ........ G02F 1/218; G02F 1/29; G02F 2203/15;
G02B 2207/101; G02B 26/06
See application file for complete search history.

(56) References Cited

U.S. PATENT DOCUMENTS

| | | | |
|---|---|---|---|
| 2009/0026924 A1* | 1/2009 | Leung | H10K 50/868 |
| | | | 427/164 |
| 2010/0118243 A1* | 5/2010 | Majumdar | H05K 3/046 |
| | | | 428/323 |
| 2021/0223655 A1* | 7/2021 | Shu | G02F 1/155 |
| 2022/0255290 A1* | 8/2022 | Niwa | H01L 31/03046 |
| 2022/0415958 A1* | 12/2022 | Ikehara | G02B 5/22 |
| 2023/0053000 A1* | 2/2023 | Murata | H10K 39/00 |

\* cited by examiner

FAST SPATIAL LIGHT MODULATOR BASED ON ATOMICALLY THIN REFLECTOR

CROSS-REFERENCE TO RELATED APPLICATIONS

This application claims the benefit of U.S. Provisional Application No. 63/153,726, filed Feb. 25, 2021, which is hereby incorporated by reference in its entirety.

STATEMENT REGARDING FEDERALLY SPONSORED RESEARCH OR DEVELOPMENT

This invention was made with government support under FA9550-17-1-0002 awarded by the U.S. Air Force Office of Scientific Research; U.S. Pat. Nos. 1,506,284, 1,125,846, and 1,541,959 awarded by the National Science Foundation; N00014-15-1-2761, N00014-18-1-2877, and N00014-16-1-2825 awarded by the Dept. of Defense/Office of Naval Research. The government has certain rights in the invention.

BACKGROUND

Embodiments of the present disclosure relate to nanoscale optical devices, and more specifically, to fast spatial light modulators based on a controllable atomically thin reflector.

BRIEF SUMMARY

In a first example embodiment, the present invention is an optical device, comprising a semiconductor layer having a first surface and a second surface, the semiconductor having an electric field-dependent resonance wavelength; a first electrode electrically connected to the semiconductor layer; a first insulating layer adjacent to the first surface of the semiconductor layer, and a second insulating layer adjacent to the second surface of the semiconducting layer, the first and the second insulating layers each being optically transparent at the resonance wavelength; a first group of at least one gate electrodes disposed adjacent to the first insulating layer, and a second group of at least one gate electrodes disposed adjacent to the second insulating layer, each gate electrode being at least 80% optically transparent at the resonance wavelength; wherein the first and the second groups of gate electrodes, taken together, form at least two regions in the semiconductor layer, an electrostatic field in each of the at least two regions being independently controllable by application of voltage to the first and the second groups of gate electrodes, the at least two regions abutting each other along at least one boundary.

In another example embodiment, the present invention is a method of changing the reflective properties of a surface, the surface comprising an optical device of the present invention. The method comprises: applying a first voltage to the first group of gate electrodes and, optionally, applying a second voltage to the second group of gate electrodes, wherein the second voltage, if applied, is different from the first voltage, thereby shifting the resonance wavelength within the first region, and, optionally, the second region.

In another example embodiment, the present invention is a method of changing an angle of reflection of an optical beam, the method comprising directing an optical beam at the optical device of the present invention, wherein the optical beam is directed at the at least one boundary; applying a first voltage to the first group of gate electrodes and, optionally, applying a second voltage to the second group of gate electrodes, wherein the second voltage, if applied, is different from the first voltage.

In another example embodiment, the present invention is an optical device, comprising at least one optical device of the present invention; at least one voltage source electrically connected to the first and second groups of gate electrodes; a computing node, operatively coupled to the at least one voltage source, the computing node configured to cause the at least one voltage source to apply a first voltage to the first group of gate electrodes and, optionally, to apply a second voltage to the second group of gate electrodes, wherein the second voltage, if applied, is different from the first voltage, thereby shifting the resonant wavelength within the first region, and, optionally, the second region.

DETAILED DESCRIPTION

Figure 1A:
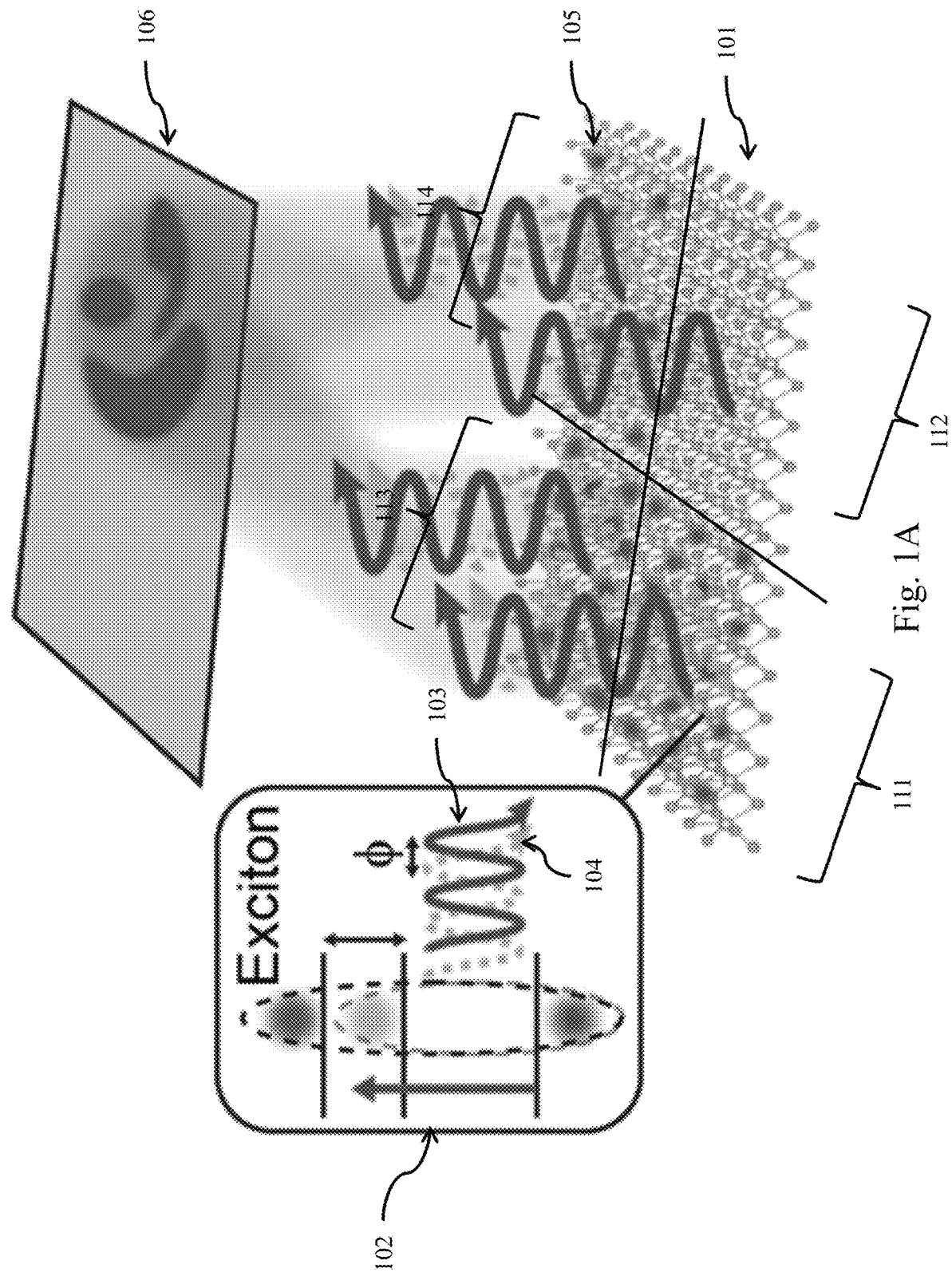
FIGS. 1A-B are schematic views of spatial light modulator structures according to the present disclosure.

Techniques to mold the flow of light on subwavelength scales can enable fundamentally new optical systems and device applications. Realization of programmable, active optical systems with tunable components is among the outstanding challenges in the field. The present disclosure experimentally demonstrates a few-pixel spatial light modulator based on electrostatic gate control of excitons in an atomically thin semiconductor with strong light-matter interactions. By combining the high reflectivity of a $MoSe_2$ monolayer with a graphene split-gate geometry, the wavefront phase profile is shaped to achieve continuously tunable beam deflection with a range of 10°, two-dimensional beam steering, and switching times down to 1.6 nanoseconds. Operating at the fundamental limit of an atomically thin reflector, approaches provided herein open the door for a new class of optical systems with potential applications ranging from fast control of large-scale beam arrays to quantum metasurfaces.

Conventional optical devices, typically made from materials with relatively weak light-matter interactions and a smooth optical response on the wavelength scale, are required to be bulky to accumulate the desired effect on the optical wavefront. Flat optics demonstrate that steep gradients in the phase, amplitude or polarization can be used to control light fields on subwavelength scales, enabling novel optical applications and phenomena, including ultrathin lenses, metasurfaces, non-reciprocity and negative refraction.

Tuning mechanisms including optically and thermally induced phase transitions, as well as magnetically tuned transparency in magneto-plasmonic crystals, may be employed. Another approach involves the use of microelectrical mechanical systems (MEMS) technology to spatially modulate the optical response; however, the operation speed of such devices is typically limited to the kHz or few MHz range. This speed limitation may be overcome through full electrical control. Global ionic gating may be used to reduce the focal intensity of a Fresnel lens based on chemical vapor deposited (CVD) transition metal dichalcogenide (TMD), while the field effect may be used to switch on a subwavelength diffraction grating. In order to achieve fully programmable, scalable devices, a key challenge is to achieve fast, continuous tunability of multiple independent channels.

To address this challenge, the present disclosure provides a continuously tunable, atomically thin optical device based on phase profile modulation in field-effect transistors composed entirely of two-dimensional van der Waals materials. The optically active element of systems set out herein is exfoliated monolayer $MoSe_2$—an atomically thin semiconductor that hosts tightly bound excitons in the optical (visible) domain. In high-quality exfoliated flakes, these excitons can exhibit very strong light-matter interaction, enabling near-perfect reflection from an atomically thin mirror. By employing graphene gates, the exciton resonance can be tuned throughout the whole material, circumventing the effects of screening commonly encountered in bulk semiconductors. These features allow for spatially dependent control of the phase and amplitude of the reflected light, which modifies the beam in the far-field due to interference, enabling wide-ranging possibilities for optical beam control (FIG. 1A).

Referring to FIG. 1, continuously tunable phase patterning in a van der Waals heterostructure is illustrated.

In particular, FIG. 1A is a schematic view of patterned electrostatic doping of atomically thin TMDs, which allows for spatial control of exciton resonance. TMD layer 101 is electrostatically doped as set out further herein. Inset 102 illustrates exciton resonance, which imparts a continuously tunable phase profile on a reflected wavefront (illustrated by offset ϕ between waveforms 103 and 104). In this example, a TMD layer 101 is divided into four quadrants 111 . . . 114 by selective doping. Charge due to electrostatic doping in each quadrant is shown by presence or absence of spheres 105. By selectively doping each region of the TMD layer 101, a continuously tunable phase profile is imparted on a reflected wavefront. This enables wide-ranging possibilities for beam control, illustrated example beam pattern 106.

Figure 1B:
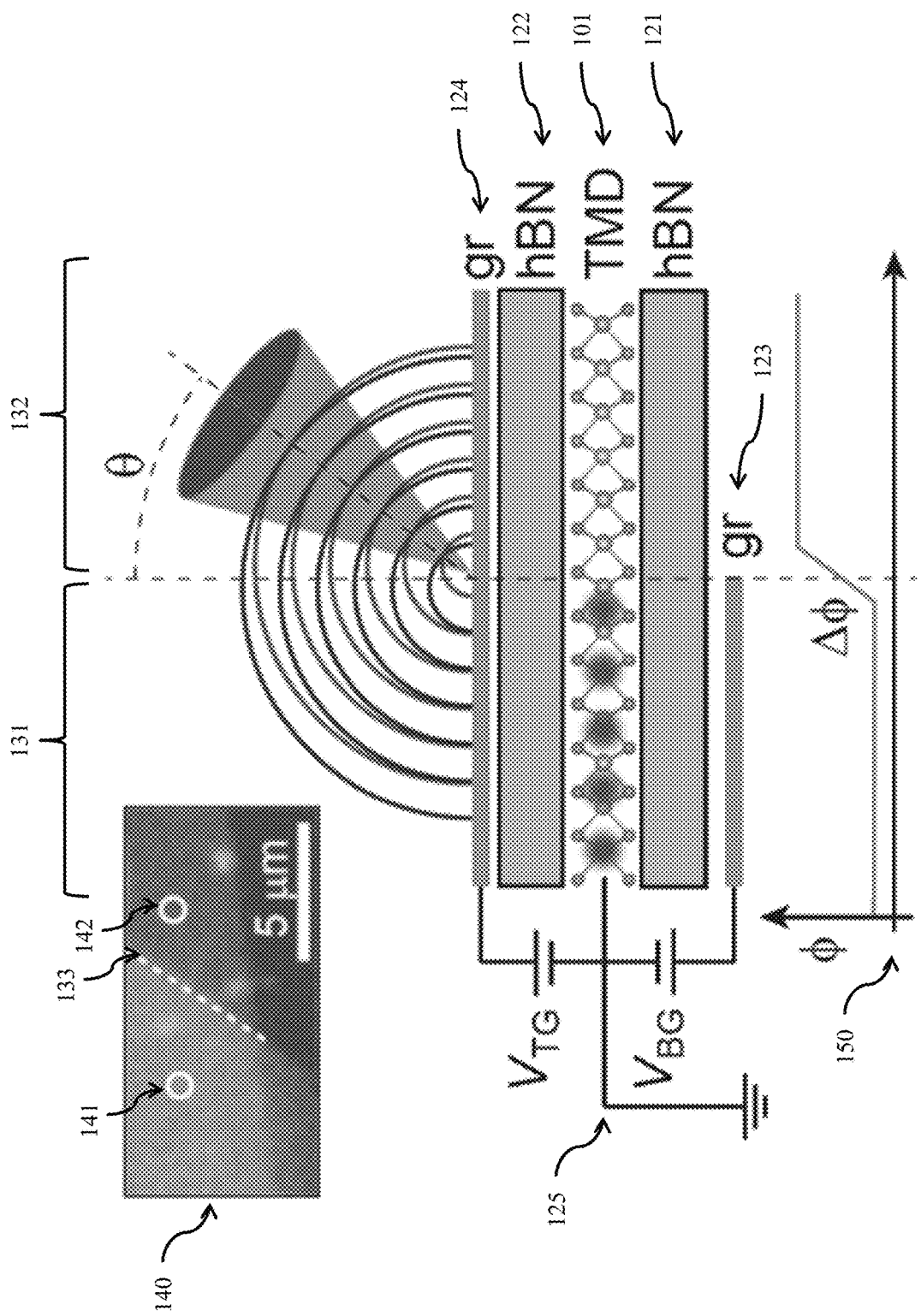

Referring to FIG. 1B, a schematic of a spatial light modulator structure is provided. In this example, semiconductor layer 101 is presented in cross-section. In various embodiments, semiconductor layer 101 comprises a transition metal dichalcogenide (TMD) monolayer. For example, semiconductor layer 101 may comprise a $MoSe_2$, $WSe_2$, $MoS_2$, or $WS_2$ monolayer. More generally, alternative materials are those that have highly reflective excitons in an atomically thin layer.

Semiconductor layer 101 has a first surface and a second surface. A first insulating layer 121 is adjacent to the first surface of the semiconductor layer 101. A second insulating layer 122 is adjacent to the second surface of the semiconducting layer 101. In various embodiments, insulating layers 121 . . . 122 comprise hexagonal boron nitride (hBN). In other embodiments, insulating layers 121 . . . 122 comprise $SiO_2$ (silica), $Al_2O_3$ (alumina), $TiO_2$ (titanium dioxide), or SiN. More generally, alternative materials are those that are optically transparent and electrically insulating.

Gate electrodes 123, 124 are disposed adjacent to insulating layers 121 and 122, respectively. In various embodiments, gate electrodes 123, 124 comprise graphene (gr). In other embodiments, gate electrodes 123, 124 comprise indium tin oxide (ITO), fluorine doped tin oxide (FTO), or doped zinc oxide. More generally, alternative materials are those that are optically transparent and electrically conducting. In this discussion, gate electrode 123 may be referred to as the bottom electrode and gate electrode 124 may be referred to as the top electrode. However, it will be appreciated that this is merely for ease of reference and the devices described herein are operable irrespective of orientation.

An additional electrode 125 is connected to semiconductor layer 101. As shown, electrode 124 is configured to apply a first voltage ($V_{TG}$), and electrode 123 is configured to apply a second voltage ($V_{BG}$). Gate electrode 123 covers a first portion of the semiconductor layer, while gate electrode 124 covers both the first portion 131 and a second portion 132 of the semiconductor layer. In this way, the gate electrodes 123, 124 form two regions 131, 132 of the semiconductor layer that abut each other at a boundary 133. Each region 131, 132 thus has an electrostatic field that is independently controllable by application of voltage to the first and second gate electrodes 123, 124. A top view is provided in inset 140, showing the line boundary 133 between regions 131 and 132.

Since the bottom gate 121 only covers part of the device, the phase can be tuned independently in the two sides 131, 132. The phase discontinuity in the reflected wavefront causes the two halves to constructively interfere at an angle (θ) in the far field. Inset 140 is a zoomed-in optical microscope image of an exemplary device, with gate edge indicated by white dashed line 133. Graph 150 shows the relative phase in regions 131, 132 across boundary 133.

Figure 1C:
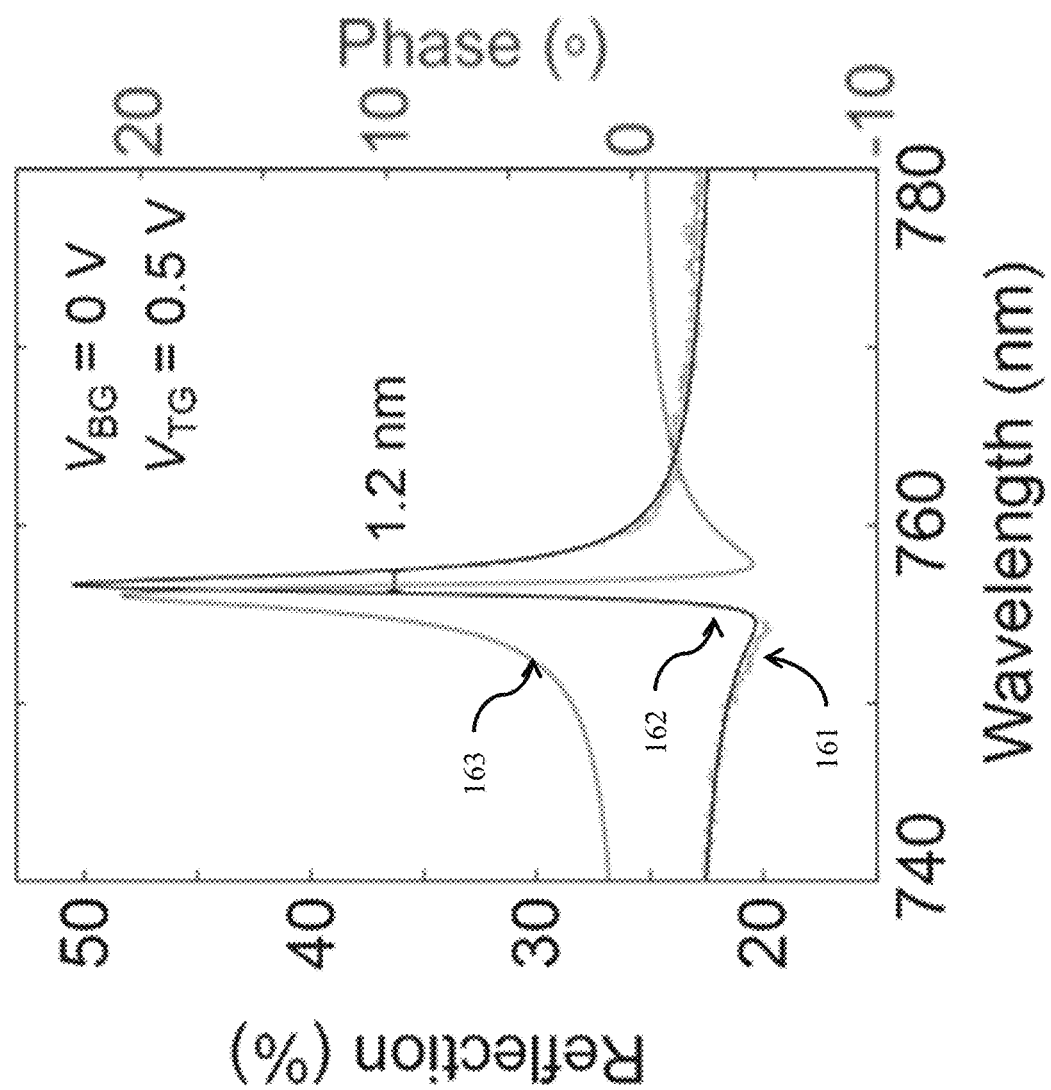
FIG. 1C is a plot of the representative reflection spectrum of an exemplary device according to the present disclosure with asymmetric resonance fit and phase.

FIG. 1C is a plot of the representative reflection spectrum (161) from left side of gate edge in intrinsic regime ($V_{BG}$=0 V and $V_{TG}$=0.5 V), with asymmetric resonance fit (162), which allows for extracting the phase (163).

Figure 1D:
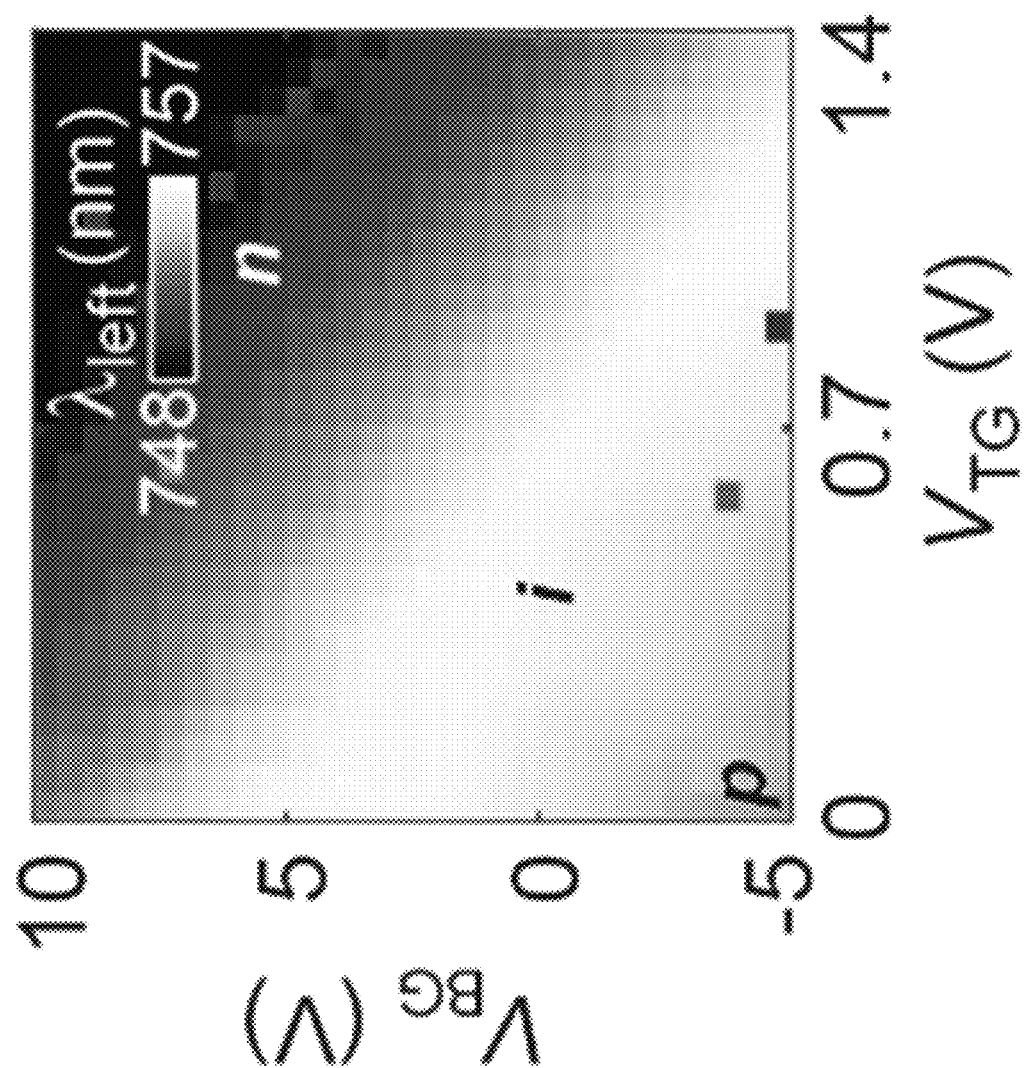
FIGS. 1D-E are heat maps showing the gate-dependent resonant wavelength according to voltage in an exemplary embodiment of the present disclosure.
Figure 1E:
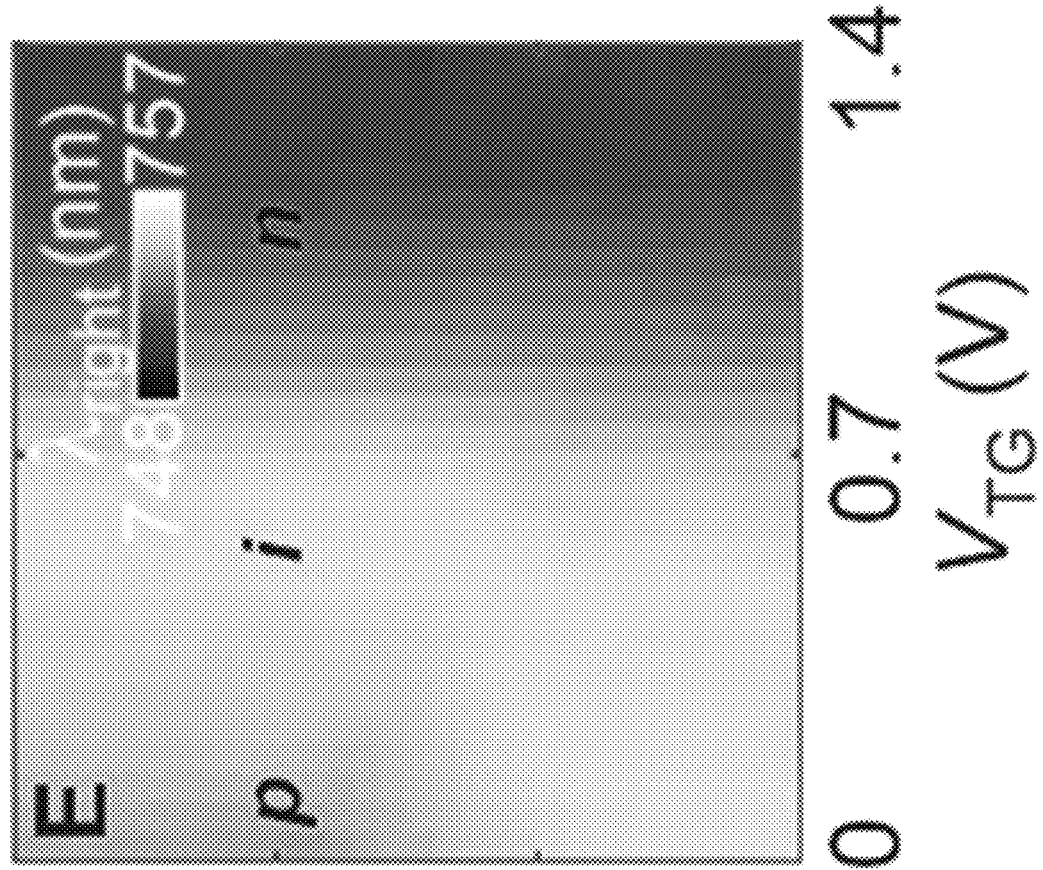

FIGS. 1D-E are heat maps showing the gate dependence of $\lambda_{left}$ and $\lambda_{right}$, respectively (locations indicated by circles 141, 142 in inset of FIG. 1B). The exciton resonance blue-shifts upon electrostatic doping. While $\lambda_{left}$ depends on $8V_{TG}+V_{BG}$, $\lambda_{right}$ is largely independent of $V_{BG}$. The intrinsic regime appears at an offset of $V_{TG}$=0.5 V, likely due to charge collection at the top gate. The small voltage range of the intrinsic regime suggests some doping via in-gap states.

Figure 1F:
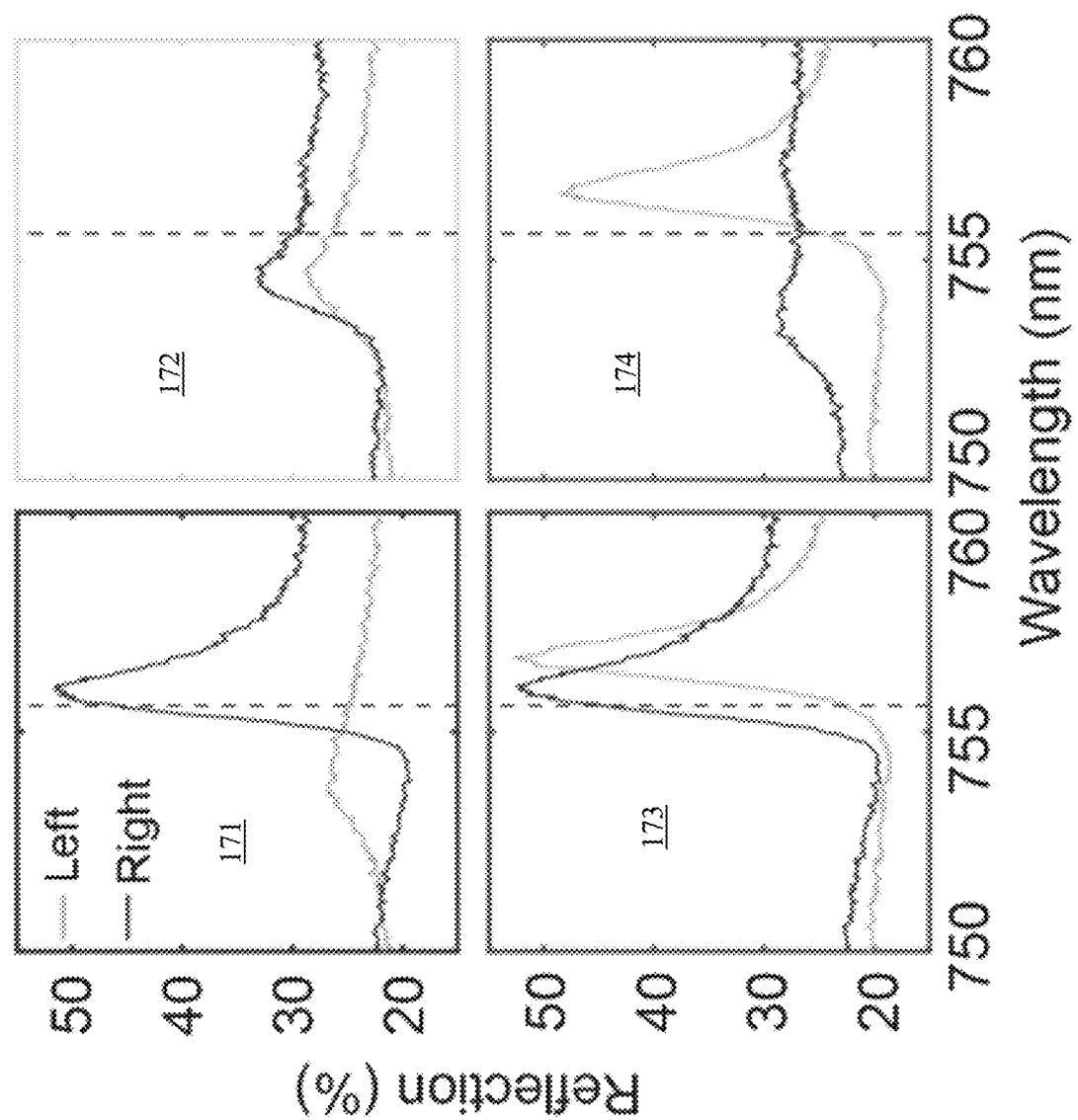
FIG. 1F is a set of graphs of reflection versus wavelength on each side of an exemplary gate edge according to the present disclosure.
Figure 1G:
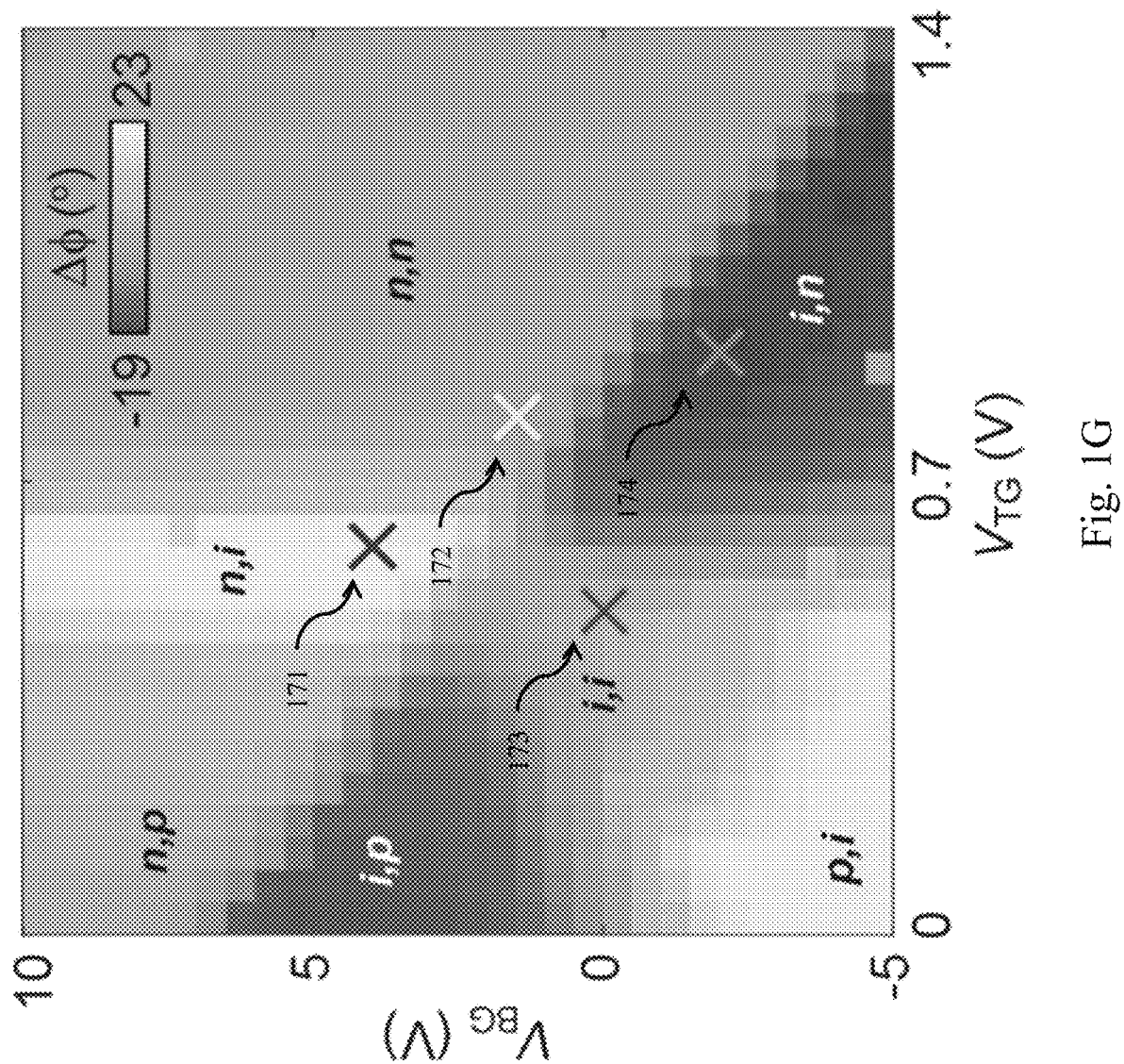
FIG. 1G is a heatmap showing phase difference according to voltage in an exemplary embodiment of the present disclosure.

FIG. 1F shows reflection spectra from left (light) and right (dark) side of gate edge at different gate voltage combinations shown as correspondingly numbered crosses (171 . . . 174) in FIG. 1G. The dashed gray line indicates $\lambda_0$=755.6 nm.

FIG. 1G shows gate dependence of phase difference $\Delta\phi$ between the right and left side at $\lambda_0$=755.6 nm, computed from fits as in FIG. 1C. A tunable $\Delta\phi$-range of 42° is achieved. Large positive $\Delta\phi$ is achieved when $\lambda_{left}<\lambda_0<\lambda_{right}$ (171), while large negative $\Delta\phi$ is achieved when $\lambda_{right}<\lambda_0<\lambda_{left}$ (174). $\Delta\phi$ is closer to zero when either both sides are doped ($\lambda_{left}, \lambda_{right}<\lambda_0$; 172) or both are intrinsic ($\lambda_0<\lambda_{left}, \lambda_{right}$; 173).

The present disclosure demonstrates this approach by realizing fast, continuously tunable beam steering with a split-gate geometry (FIG. 1B). In an exemplary embodiment, using the dry-transfer technique, we assemble our device (FIG. 1B, inset 140) from exfoliated flakes of monolayer $MoSe_2$, graphene (top and bottom gates 123, 124), and hexagonal boron nitride (hBN; gate dielectric 121, 122) into a split-gate field effect transistor (SG-FET) structure, in which the bottom gate (BG 123) only covers part of the device. The gate geometry enables independent electrostatic doping of the two parts of the device, and—since the exciton resonance shifts with doping—a very steep phase gradient near the gate edge. The non-zero width of this step is due to stray electric fields and is comparable to the thickness of the gate dielectric (~50 nm). By focusing light on the gate-edge, the two halves of the reflected wavefront gain a different phase ($\Delta\phi$) and thus constructively interfere at an angle in the far-field (FIG. 1B).

FIG. 1C shows the absolute reflectance spectrum, collected away from the gate edge in the intrinsic regime (T~6 K). The $MoSe_2$ features a sharp excitonic resonance at $\lambda_{intrinsic}$~757 nm, with a linewidth of 1.2 nm. The asymmetric line-shape is attributed to the interference between the Lorentzian exciton reflection and light reflected from other interfaces within the vdW heterostructure. Due to the interference, the corresponding reflection from a freestanding TMD is substantially higher than that obtained by simply subtracting the background level. By fitting the asymmetric resonance profile (162), we extract the phase of the reflected light (163). We note that the phase of the exciton reflection itself changes by 180° (π) across the resonance, but the interference with the background reflections reduces the overall phase range.

In order to tune the phase at a given wavelength, we shift the exciton resonance by electrostatically doping the $MoSe_2$ with the top and bottom gates ($V_{TG}$ and $V_{BG}$, respectively). FIGS. 1D-E show the gate-dependence of the resonance wavelengths, $\lambda_{left}$ and $\lambda_{right}$, on the left and right sides of the gate edge, respectively. The exciton resonance blue-shifts by several linewidths in the p- and n-doped regimes, resulting from bandgap renormalization and repulsive polaron formation. In the left (dual-gated) side of the device (FIG. 1D), the resonance depends on both $V_{TG}$ and $V_{BG}$; more specifically the weighted sum, $8V_{TG}+V_{BG}$, due to unequal top and bottom hBN thicknesses. In contrast, the exciton resonance on the right (single-gated) side of the device only depends on $V_{TG}$, except for a slight $V_{BG}$-dependence of the onset of the p-doped regime due to contact activation (FIG. 1E). These distinct dependencies of $\lambda_{left}$ and $\lambda_{right}$ on the gate voltages allow for tuning their relative positioning (FIG. 1F) and are key to creating the abrupt doping (and phase) discontinuity.

Fitting the spectra at all gate voltage combinations in FIGS. 1D-E, the gates dependence of the phase difference ($\Delta\phi$) between the two sides of the device at $\lambda_0$=755.6 nm is shown (FIG. 1G), indicating a continuously tunable range of 42°. The wavelength is chosen to be blue-detuned relative to the intrinsic exciton resonance, such that the exciton resonance is swept through $\lambda_0$ upon electrostatic gating. Inspecting FIG. 1G, four regimes are identified that are central to the operation of the system, distinguished by the relative positioning of $\lambda_{left}$ and $\lambda_{right}$: a large positive phase difference is achieved when the resonance on the left side is blue-shifted past $\lambda_0$, while $\lambda_{right}$ is kept red-shifted (FIG. 1F, 171). Conversely, a large negative phase difference is realized when $\lambda_{right}$<$\lambda_0$<left (FIG. 1F, 174). Finally, the magnitude of the phase difference is much smaller when the two sides are either both doped (FIG. 1F, 172) or both intrinsic (FIG. 1F, 173). As can be seen in FIG. 1F, the doping induced blue-shift is accompanied by a decrease in amplitude, reducing the maximum phase of the combined reflection in the doped regimes.

Having demonstrated independent phase tunability in the two sides of the device, we next measure the beam steering capabilities by focusing the laser beam ($\lambda_0$=755.6 nm; numerical aperture, NA=0.75) onto the gate edge and imaging the reflected beam in the Fourier plane. The Fourier plane polar coordinates $r_F$ and $\phi_F$ are converted to angular deflection via $\theta$=$\sin^{-1}(r_F/f)$, where f is the focal length of the objective, and decomposed into $\theta_x$=$\theta\cdot\cos(\phi_F)$ and $\theta_y$=$\theta\cdot\sin(\phi_F)$. The undeflected beam is approximately Gaussian with an angular width (standard deviation) of 17°.

Figure 2A:
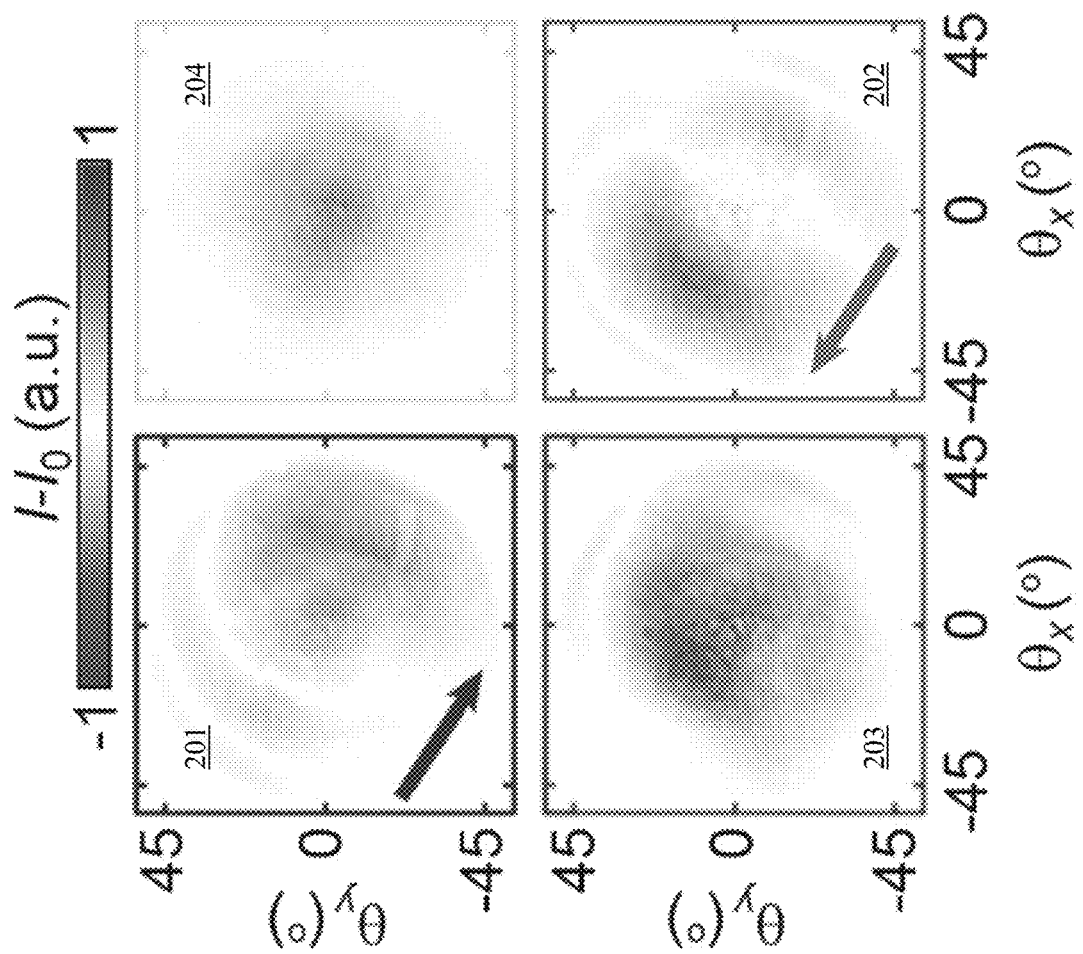
FIG. 2A shows Fourier images of reflected beams in an exemplary embodiment of the present disclosure.

FIG. 2A shows Fourier images of reflected beam ($\lambda_0$=755.6 nm) in the four regimes after subtracting the reflection in the highly doped regime ($V_{BG}$=10 V and $V_{TG}$=1.4 V). When the exciton resonance is blue-shifted past $\lambda_0$ in only one side of the device (201, 202), the beam is deflected away from that side. If neither or both are blue-shifted past $\lambda_0$, the phase difference is small and little deflection is observed (203, 204).

Figure 2B:
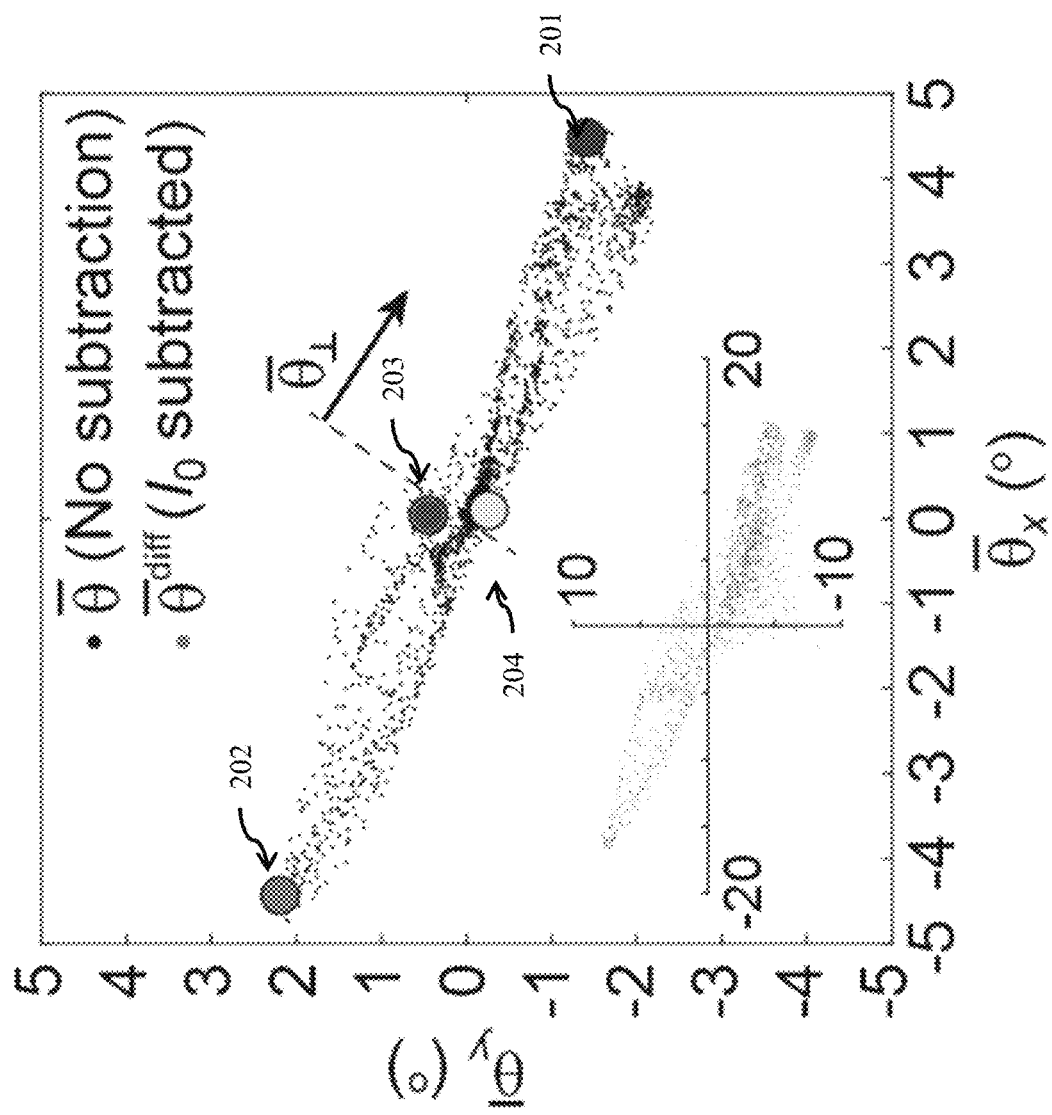
FIG. 2B is a scatter plot of the beam deflection for a range of gate voltages in an exemplary embodiment of the present disclosure.

FIG. 2B is a scatter plot of the beam deflection ($\bar{\theta}_x$, $\bar{\theta}_y$) for the full range of gate voltages, showing that the deflection is perpendicular to the gate edge (dashed line) and continuously tunable. Inset: background-subtracted deflection, $$\theta_i^{diff} = \frac{\sum (I - I_0)\theta_i}{\sum |I - I_0|}.$$

Figure 2C:
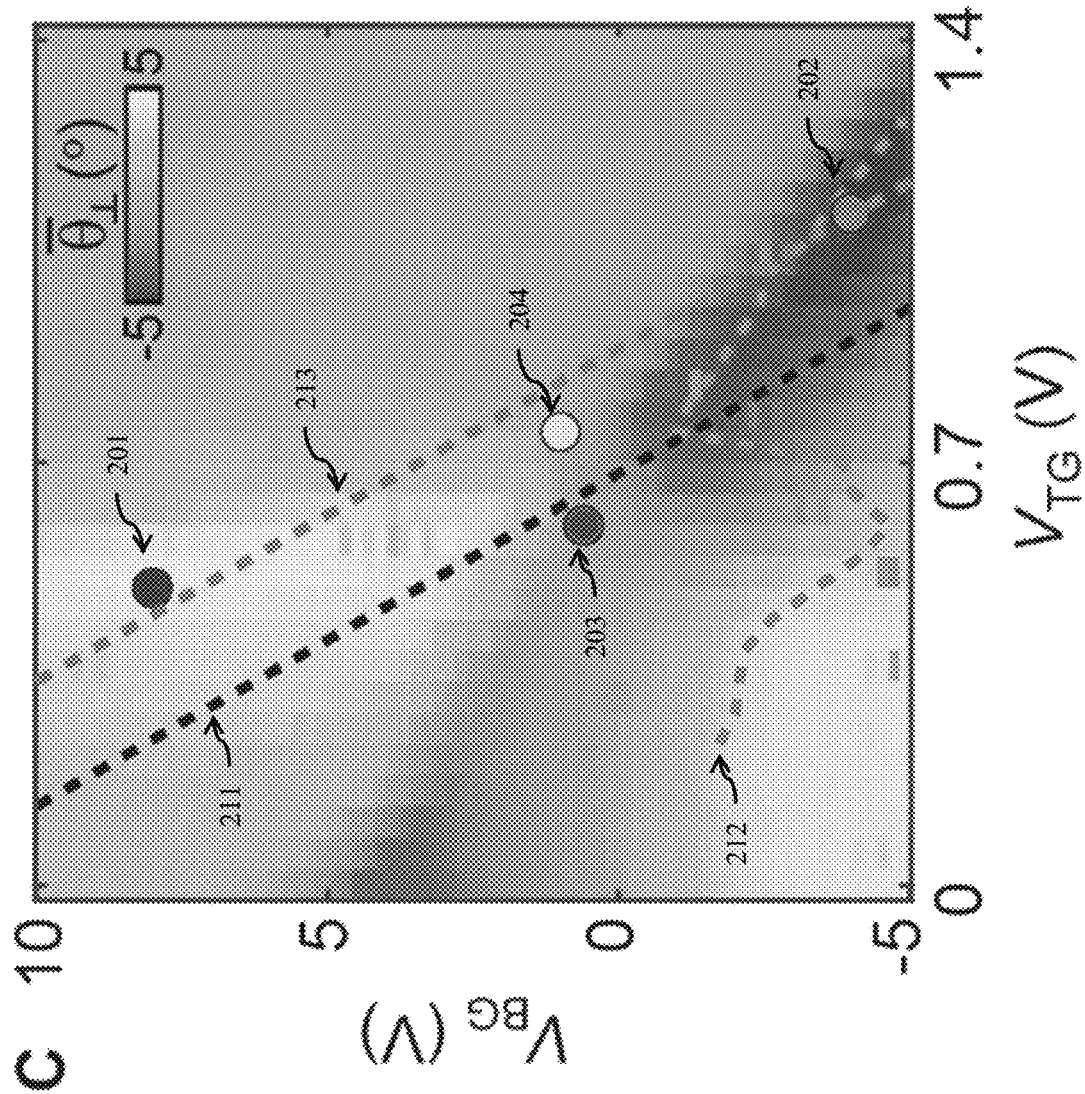
FIG. 2C is a heatmap showing beam deflection according to voltage in an exemplary embodiment of the present disclosure.

FIG. 2C shows the gate dependence of the deflection perpendicular to gate edge ($\bar{\theta}_\perp$) is in very good agreement with that of the phase difference shown in FIG. 1G.

Figure 2D:
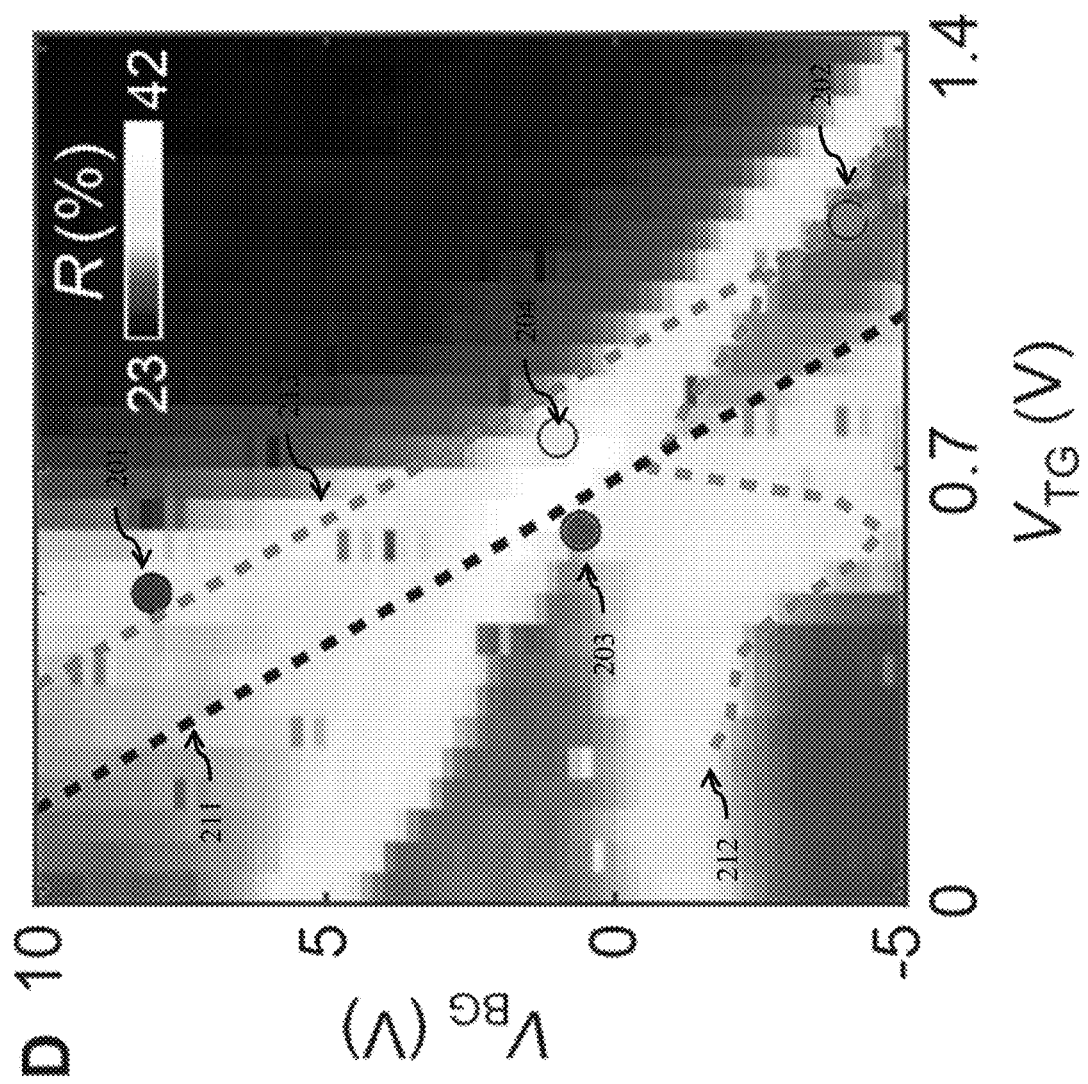
FIG. 2D is a heatmap showing reflection amplitude according to voltage in an exemplary embodiment of the present disclosure.

FIG. 2D shows gate-dependence of reflection amplitude. Regions with high reflection indicate that one of the resonances crosses through $\lambda_0$.

Figure 2E:
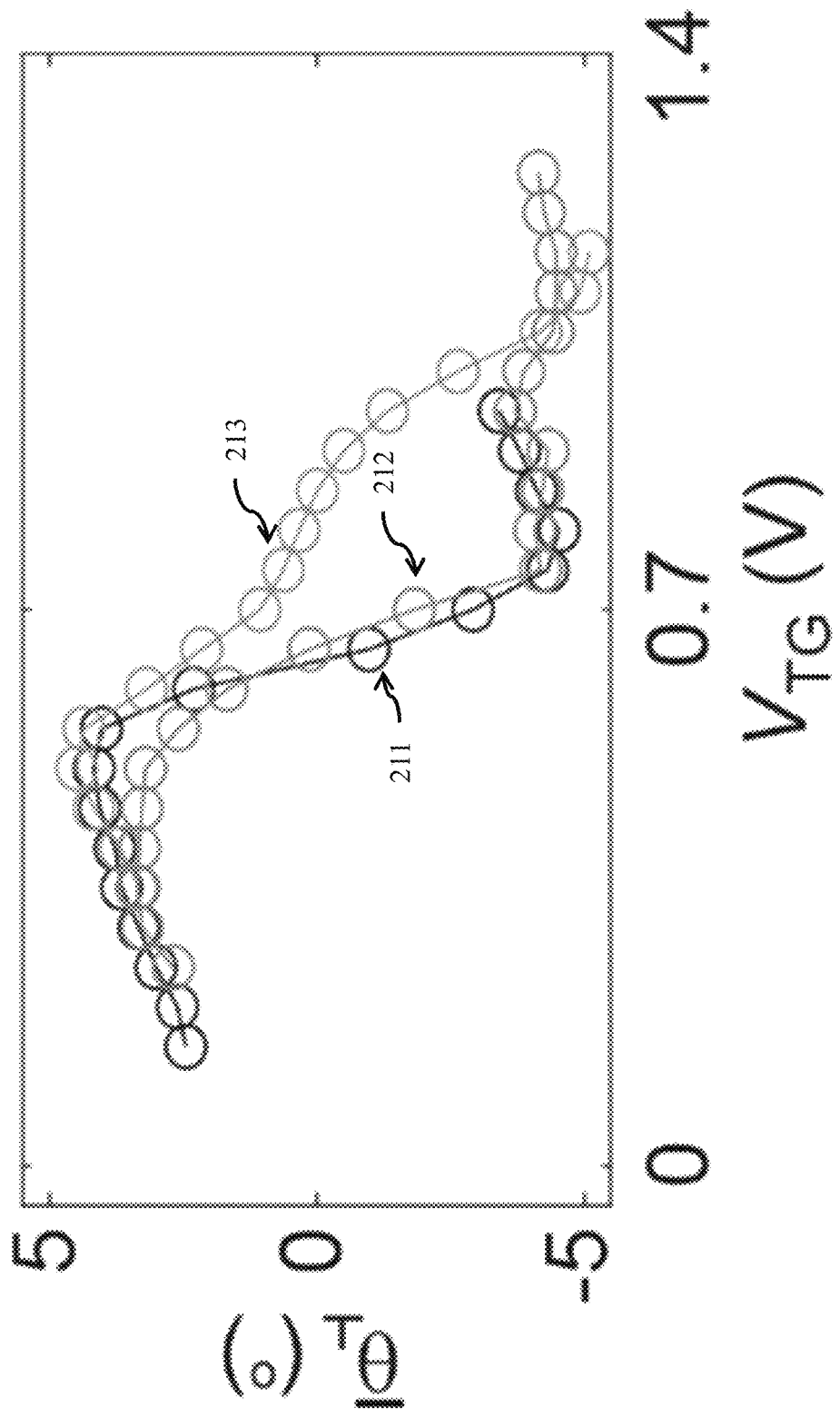
FIG. 2E is a graph of beam deflection according to voltage in an exemplary embodiment of the present disclosure.
Figure 2F:
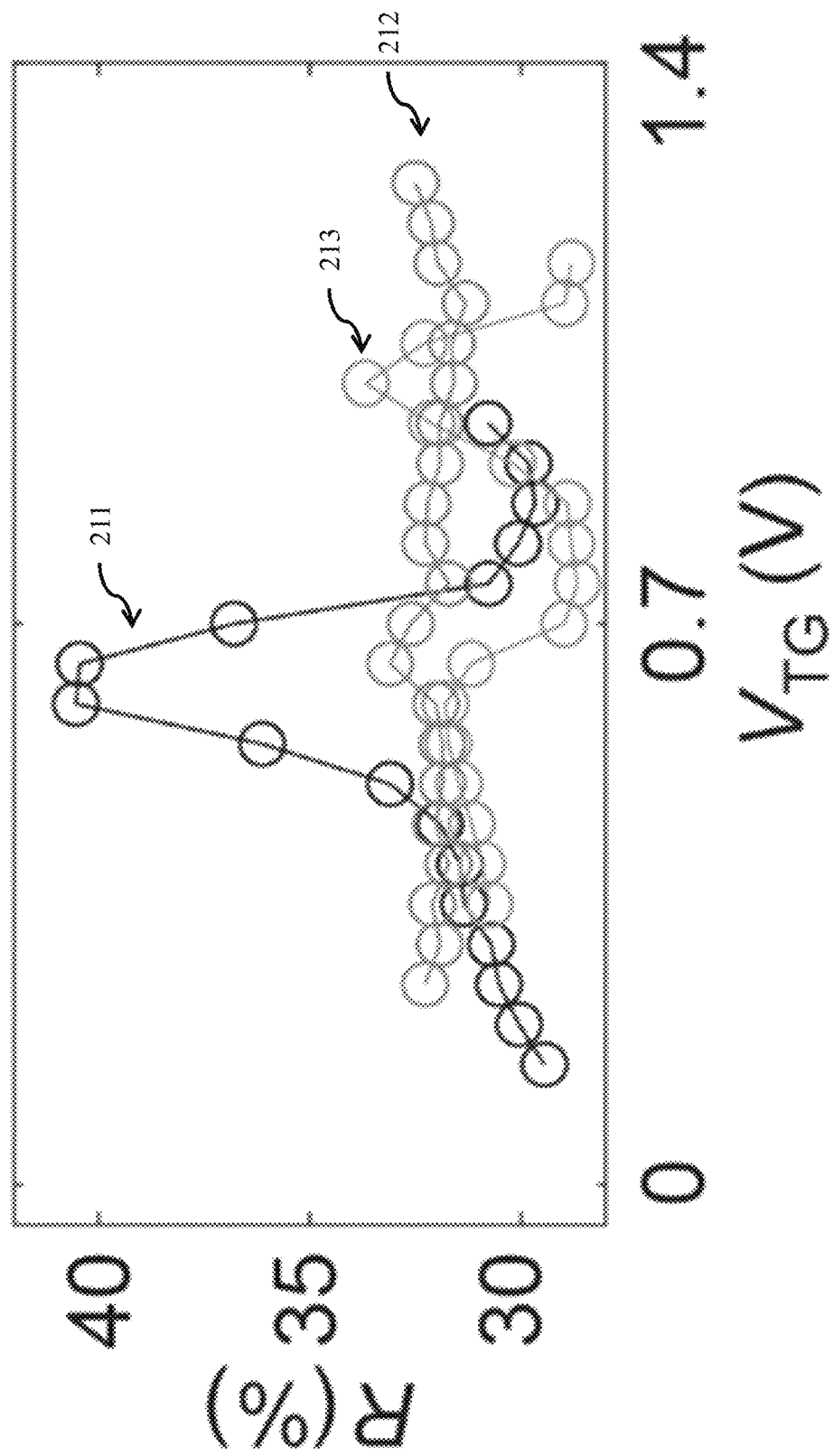
FIG. 2F is a graph of reflection amplitude according to voltage in an exemplary embodiment of the present disclosure.

FIGS. 2E-F show linecuts indicated by dashed lines 211, 212, 213 in FIGS. C-D, respectively, highlighting the continuous steering capability and that the reflection can be kept relatively constant while deflecting the beam. Connecting lines in FIG. 2E-F are guides to the eye.

FIG. 2A shows representative Fourier images in the four regimes identified in FIGS. 1F-G, after subtracting the reflected intensity without exciton effects ($I_0$), obtained by heavily doping the device ($V_{BG}$=10 V, $V_{TG}$=1.4 V). Defining the "center of mass" deflection of the full (not background-subtracted) reflection as $$\bar{\theta}_i = \frac{\Sigma I \theta_i}{\Sigma I},$$

we present scatter plots of $\bar{\theta}_x$ and $\bar{\theta}_y$ for the full range of gate voltages, highlighting the deflection in the four regimes (FIG. 2B).

We find that the reflection is deflected in the expected direction, perpendicular to the gate edge. The tunable deflection range is 9.8° (34° for the background-subtracted signal), in very good agreement with theoretical predictions based on the phase difference range observed in FIG. 1G. Specifically, for a diffraction limited beam spot, the deflection is predicted to be $$\bar{\theta}_\perp = \frac{NA}{0.42\sqrt{2\pi^3}} \cdot \Delta\phi = 0.23 \cdot \Delta\phi,$$

which gives a range of 9.7°. Moreover, the gate dependence of the deflection (FIG. 2C) closely resembles that of the extracted phase difference (FIG. 1G), consistent with the deflection arising due to the sharp phase discontinuity imparted on the wavefront. In particular, we identify distinct steering behavior in the four regimes: when only one side of the device is kept red-shifted relative to $\lambda_0$ (boxes 201 and 202 in FIG. 2A), the beam is deflected towards that side. Intuitively, the light from the two sides interferes constructively when the path length is shorter for the side with the greater phase. In the two other regimes, on the other hand, where the two sides are either both blue-shifted past $\lambda_0$ (204) or both kept red-shifted (203), we observe near-zero deflection, consistent with a much smaller phase difference. We note that very similar behavior, although with a smaller deflection range, was observed for $\lambda_0$ down to 752 nm.

FIG. 2D shows the gate dependence of the integrated reflection. The different regimes are separated by regions of strong reflection, since these indicate that one of the resonances crosses through $\lambda_0$. While the four different regimes are easily identified, we emphasize that the phase difference, and thus the beam deflection, is tuned continuously, as shown in FIG. 2B. The continuous tunability is highlighted in FIG. 2E, showing linecuts from FIG. 2C. Although the reflection amplitude is gate dependent (FIG. 2D,F), the reflection variations can be reduced substantially while still keeping a similar deflection range by avoiding the combined resonance (linecut 213), or even designing a near-iso-reflection path in voltage space (212).

FIG. 3 illustrates two-dimensional beam steering according to embodiments of the present disclosure. FIG. 3A is a zoomed-in optical image of an exemplary device, indicating regions of monolayer and bilayer $MoSe_2$, as well as gate coverage. By tuning the relative phase and amplitude of the reflection from the three regions, more intricate wavefront phase profiles can be achieved.

Figure 3A:
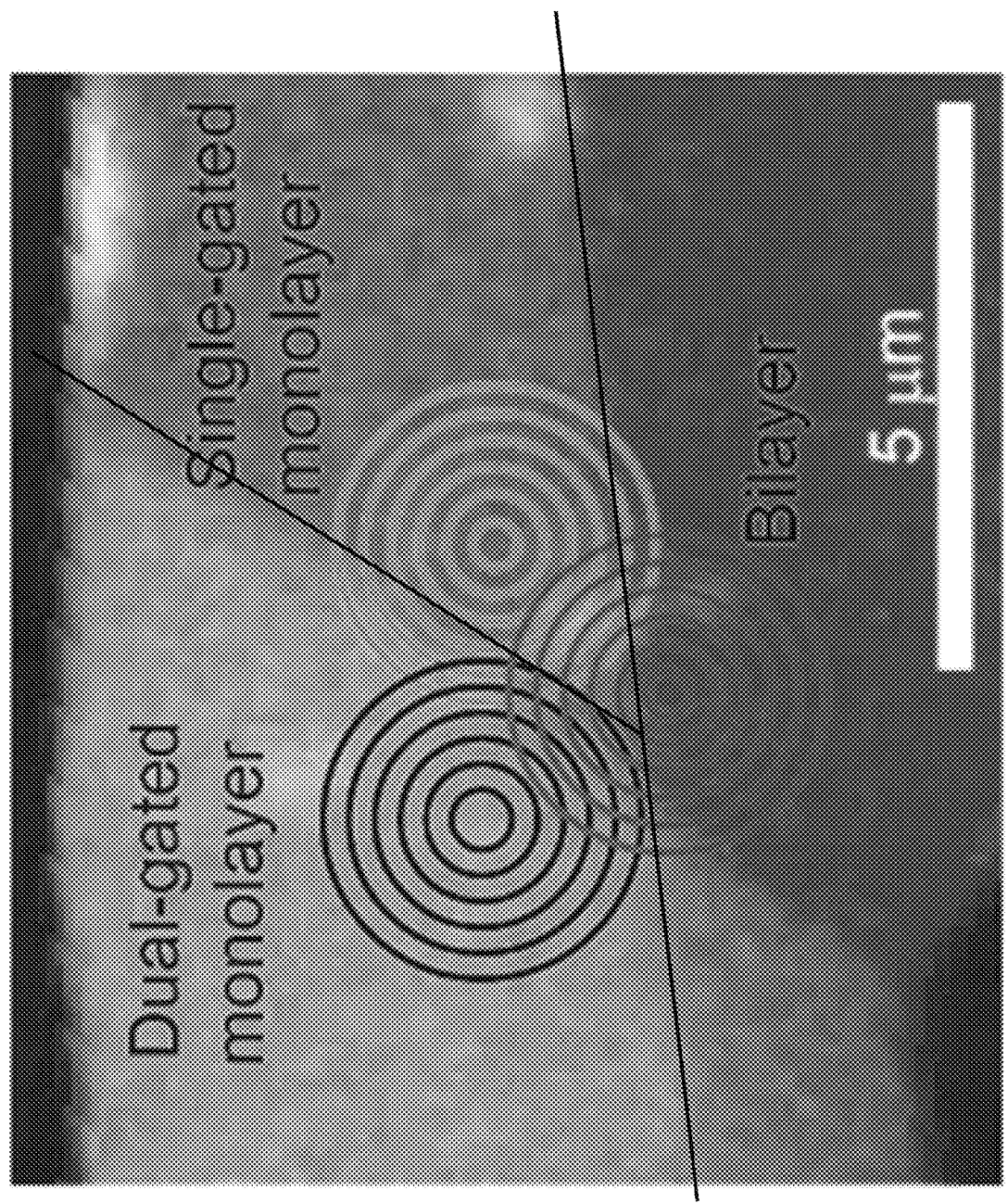
FIG. 3A is an optical image of an exemplary device according to the present disclosure.
Figure 3B:
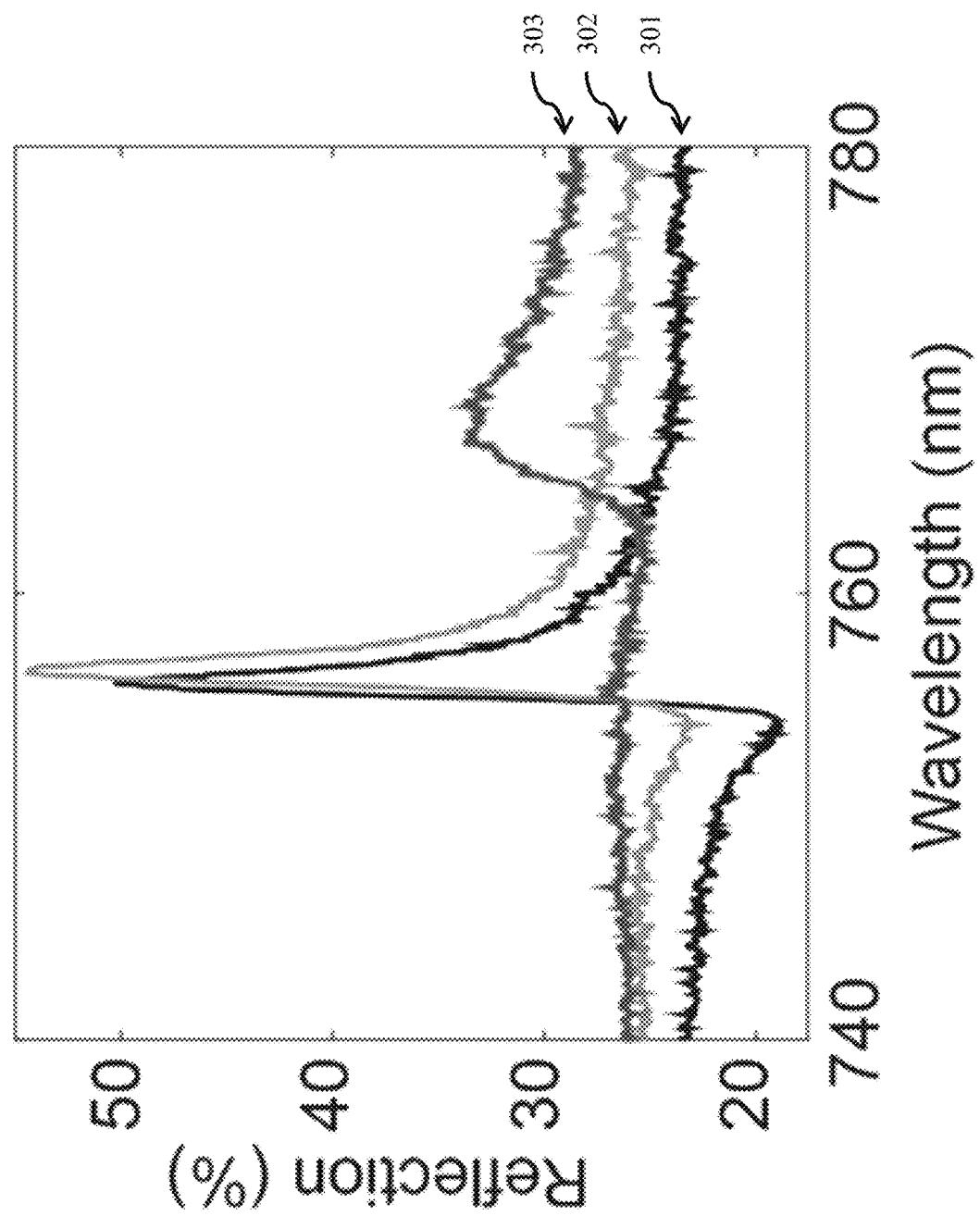
FIG. 3B is a graph of reflection according to wavelength in an exemplary embodiment of the present disclosure.

FIG. 3B shows reflection spectra from the dual-gated monolayer (301), single-gated monolayer (302) and the bilayer (303) in the intrinsic regime ($V_{BG}$=0 V and $V_{TG}$=0.5 V). Since interlayer hybridization effects cause the exciton resonance to be significantly red-shifted in the bilayer, it acts as a dielectric (non-resonant) reflector at the wavelengths used here.

Figure 3C:
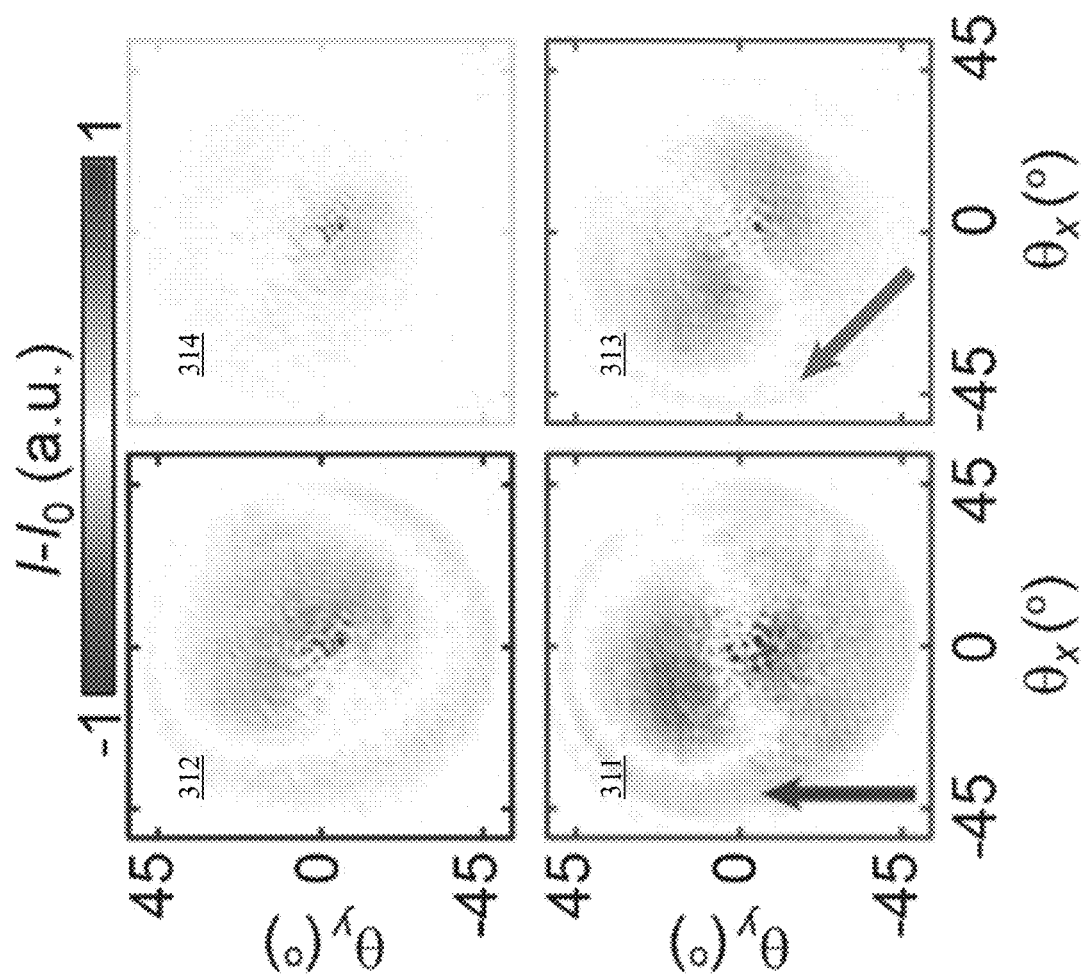
FIG. 3C is a set of Fourier images of reflected beams in an exemplary embodiment of the present disclosure.

FIG. 3C shows Fourier images of reflected beam ($\lambda_0$=754.1 nm) in the four regimes after subtracting reflection in the highly doped regime ($V_{BG}$=10 V and $V_{TG}$=1.4 V). The beam is now steered in two dimensions. When both monolayer resonances are red-shifted relative to $\lambda_0$ (311), their phase is higher than in the bilayer region, causing the beam to deflect upwards. When one of the monolayer resonances is kept red-shifted relative to $\lambda_0$ (312, 313), the beam is deflected towards that monolayer region.

Figure 3D:
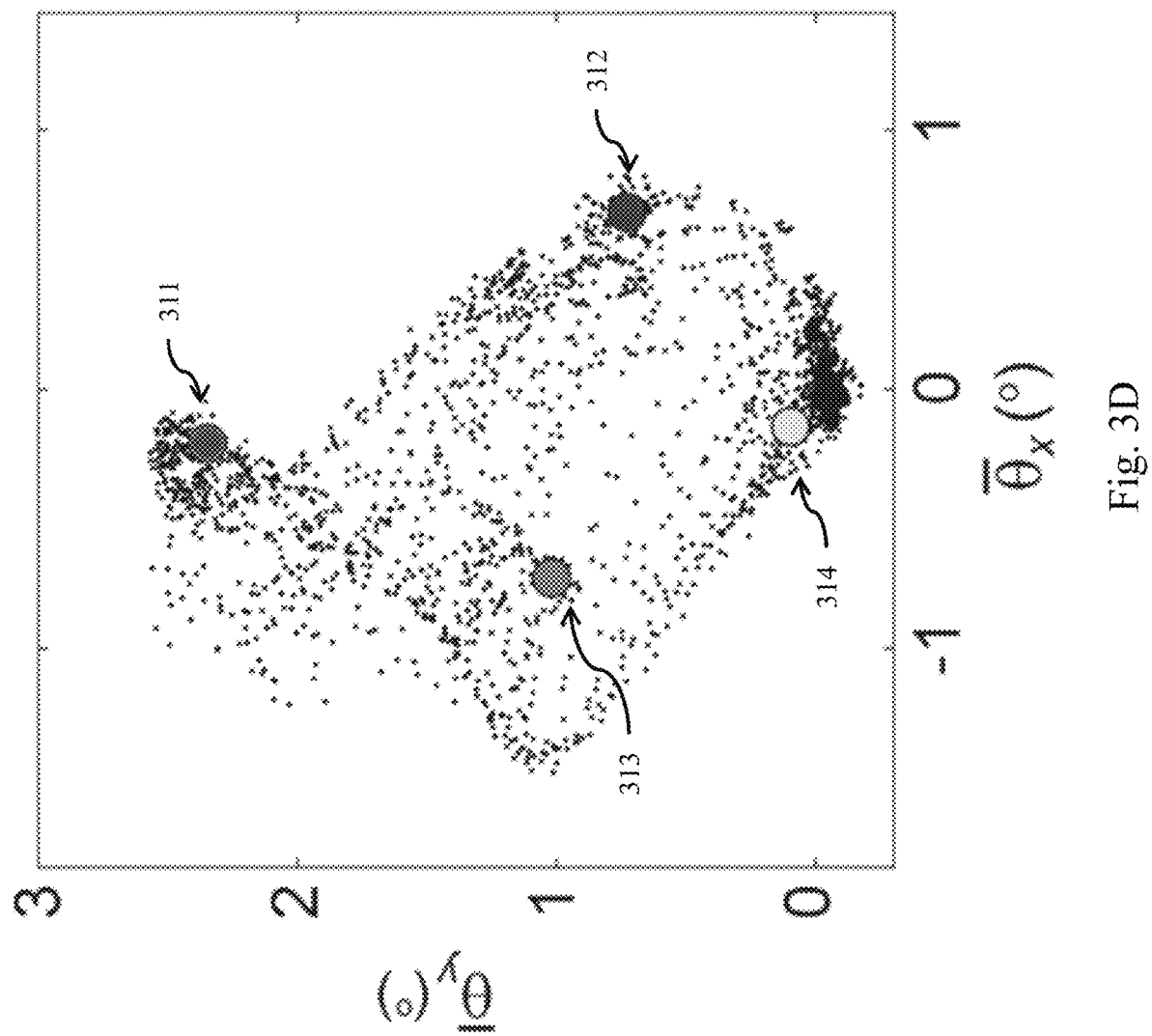
FIG. 3D is a scatter plot of the center-of-mass deflection in an exemplary embodiment of the present disclosure.

FIG. 3D is a scatter plot of the center-of-mass deflection ($\bar{\theta}_x$, $\bar{\theta}_y$), with the points from FIG. 3C highlighted. The set of beam deflections now span a two-dimensional area.

Figure 3E:
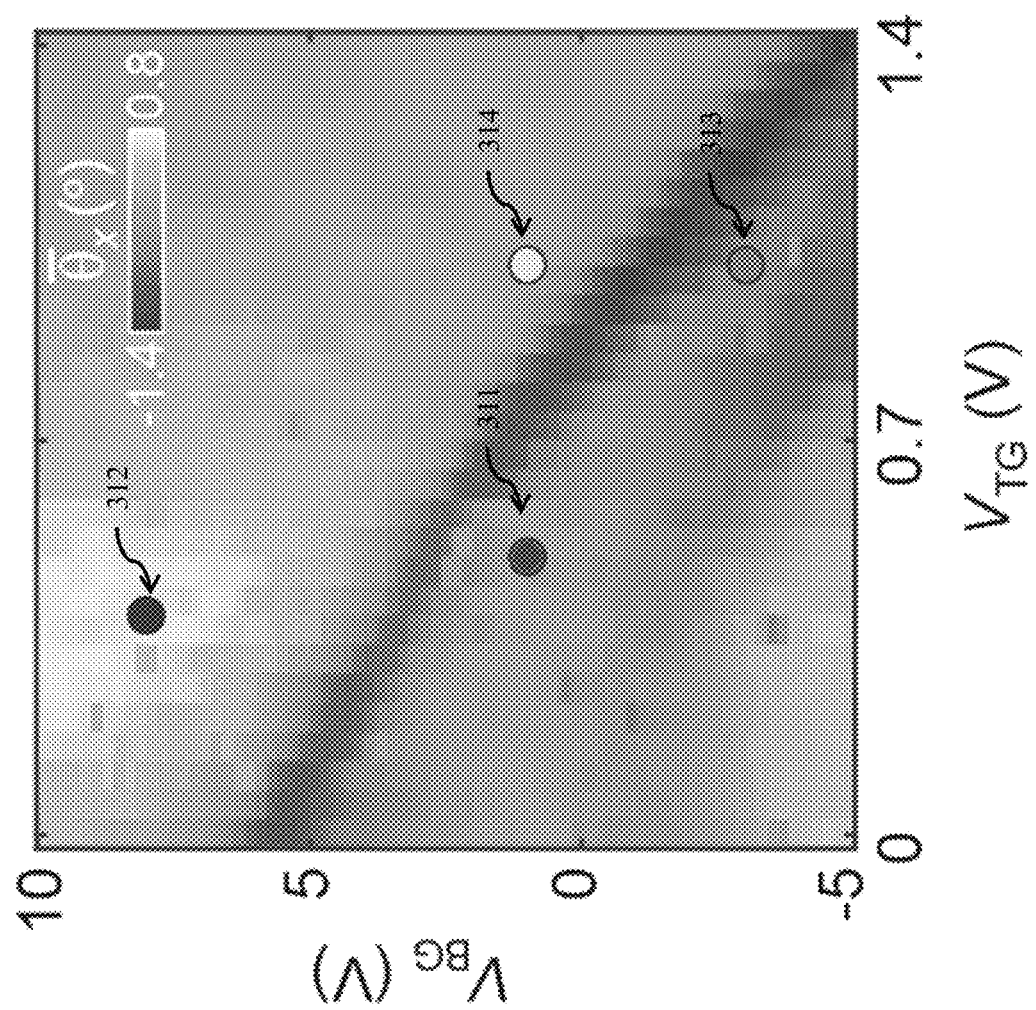
FIGS. 3E-F are heatmaps showing center-of-mass deflection according to voltage in an exemplary embodiment of the present disclosure.
Figure 3F:
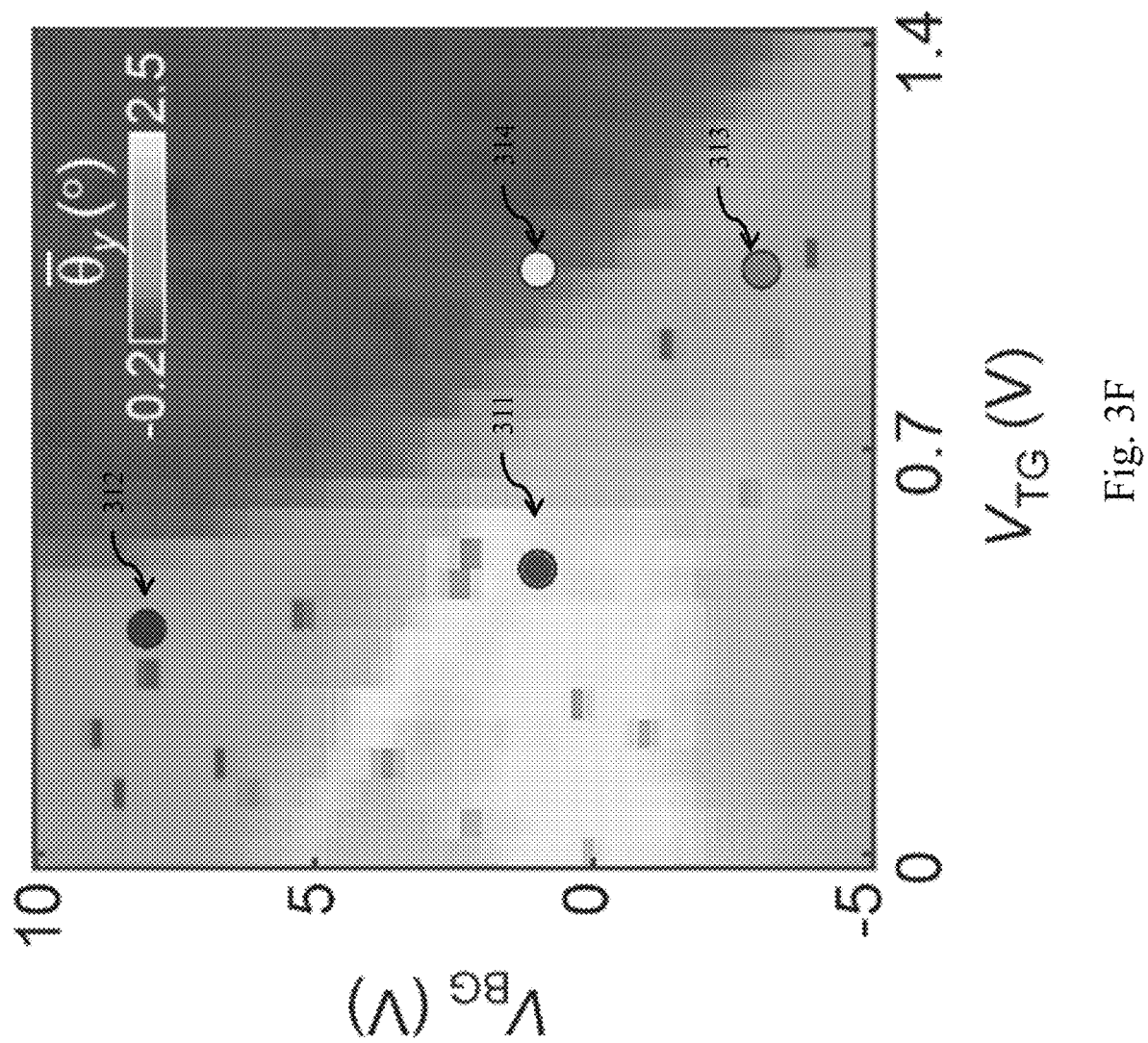

FIGS. 3E-F show gate dependence of the center-of-mass deflection, $\bar{\theta}_x$ (FIG. 3E) and $\bar{\theta}_y$ (FIG. 3F). While the gate dependence resembles that of the phase in FIG. 1G, $\bar{\theta}_x$ and $\bar{\theta}_y$ are now less coupled.

Figure 3G:
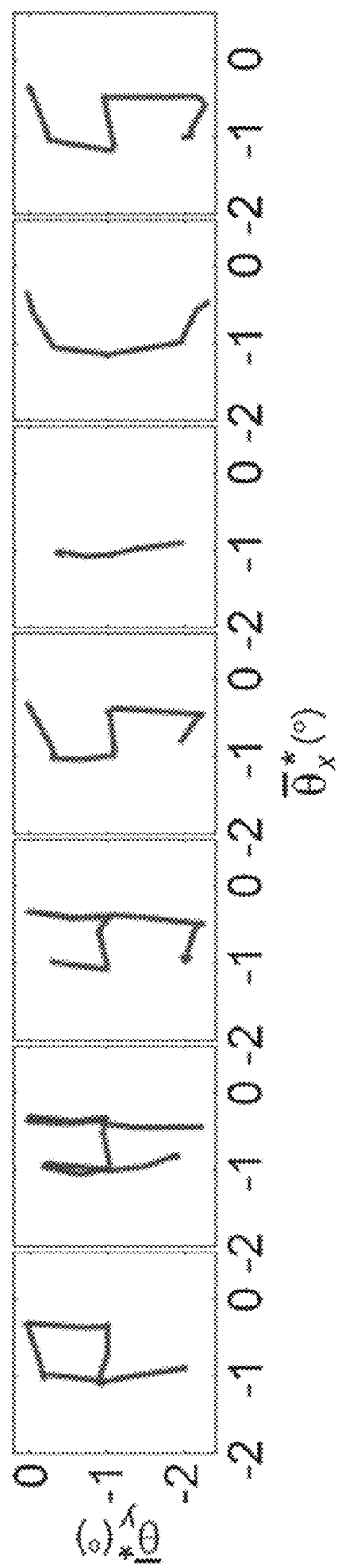
FIG. 3G is a group of images showing beam steering by applying a sequence of gate voltage combinations according to the present disclosure.

FIG. 3G shows beam deflection tracing out "PHYSICS" (rotated 148° counter-clockwise) by applying a sequence of gate voltage combinations.

In order to achieve more advanced control of the wavefront profile, we utilize the device region where the edge of the bottom gate intersects a border between monolayer and bilayer MoSe$_2$ (FIG. 3A). Since the exciton resonance in bilayers is red-shifted to ~767 nm due to interlayer hybridization effects (FIG. 3B), the bilayer acts as a non-resonant dielectric reflector, thus enabling control of the relative phase between the three regions.

FIG. 3C shows representative Fourier images of the reflected light in the four different regimes at $\lambda_0$=754.1 nm. When both of the monolayer resonances are red-shifted relative to $\lambda_0$, the beam is deflected upwards (311), as opposed to the near-zero deflection observed in FIG. 2. Keeping only one of the resonances red-shifted causes the beam to deflect upwards at an angle towards the red-shifted side (312, 313). This is further shown by plotting the full set of center-of-mass deflections, $\bar{\theta}_x$ and $\bar{\theta}_y$ (FIG. 3D); while these were clustered around a line perpendicular to the gate edge in FIG. 2B, we now observe that they span a broader, two-dimensional area. Consequently, the gate dependence of $\bar{\theta}_x$ and $\bar{\theta}_y$ (FIGS. 3E and F)—while still resembling that of the phase in FIG. 1G—is now more intricate. Instead of simply being (negatively) proportional to each other, $\bar{\theta}_x$ takes on both positive and negative values when $\bar{\theta}_y$ is intermediate, and $\bar{\theta}_y$ can be either large or near-zero when $\bar{\theta}_x$ is near zero. To demonstrate the two-dimensional steering capability, we "write" a desired two-dimensional pattern with the center-of-mass of the reflected beam (FIG. 3G), by successively applying gate voltage combinations corresponding to the appropriate beam deflections.

The two-dimensional deflection behavior is well understood by considering the third reflection source from the bilayer region. When both the monolayer resonances are kept red-detuned relative to $\lambda_0$, the phase is higher than in the bilayer region, thus imparting an upwards phase gradient on the reflected wavefront. Similarly, if only one of the monolayer regions is kept red-shifted, the phase gradient points towards that region. Hence, the three reflection sources enable two-dimensional beam control.

FIG. 4 illustrates high-frequency beam steering according to embodiments of the present disclosure. FIG. 4A shows oscillations of center-of-mass deflection ($\lambda_0$=754.5 nm) induced by oscillating back gate voltage (offset, V$_0$=0.7 V; amplitude, $\Delta$V=0.45V; period, $\tau$=2 s) and V$_{TG}$=0.64 V. FIG. 4B-C are Fourier plane images collected at V$_{BG}$=V$_0$+$\Delta$V (FIG. 4B) and V$_{BG}$=V$_0$−$\Delta$V (FIG. 4C), as indicated by circles in FIG. 4A, after subtracting reflection at V$_{BG}$=V$_0$. An inverted telescope was used to shrink the beam to simplify the subsequent APD measurements. FIG. 4D shows photon count oscillations measured with APD at $\tau$=10 µs, 100 ns, 5.6 ns and 3.2 ns (top to bottom). Darker (lighter) shade curves show photon counts from left (right) side of Fourier plane, as indicated by the inset in the top panel. All curves are normalized to the corresponding contrast at $\tau$=10 µs.

Figure 4A:
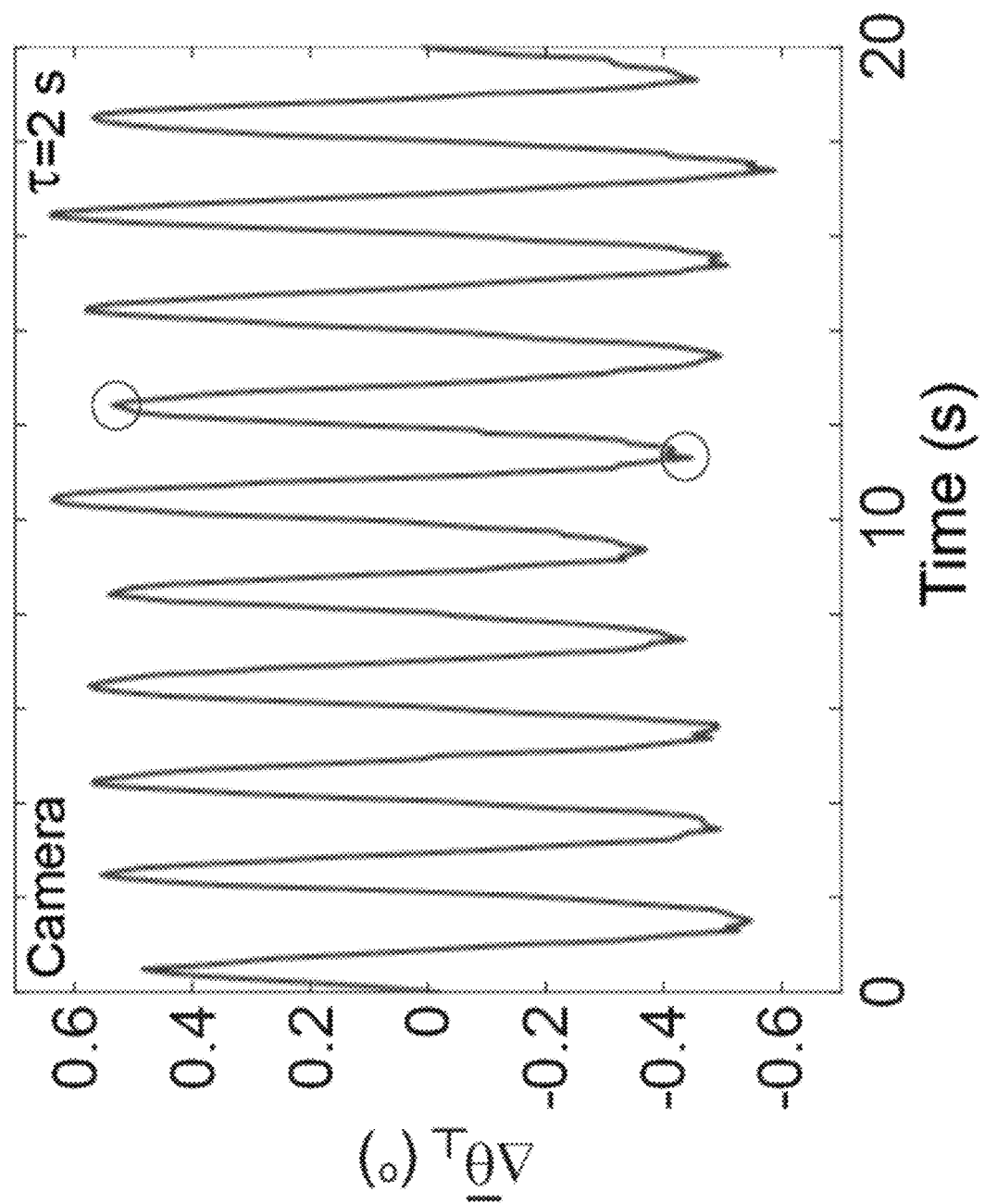
FIG. 4A is a graph of center-of-mass deflection over time in an exemplary embodiment of the present disclosure.
Figure 4B:
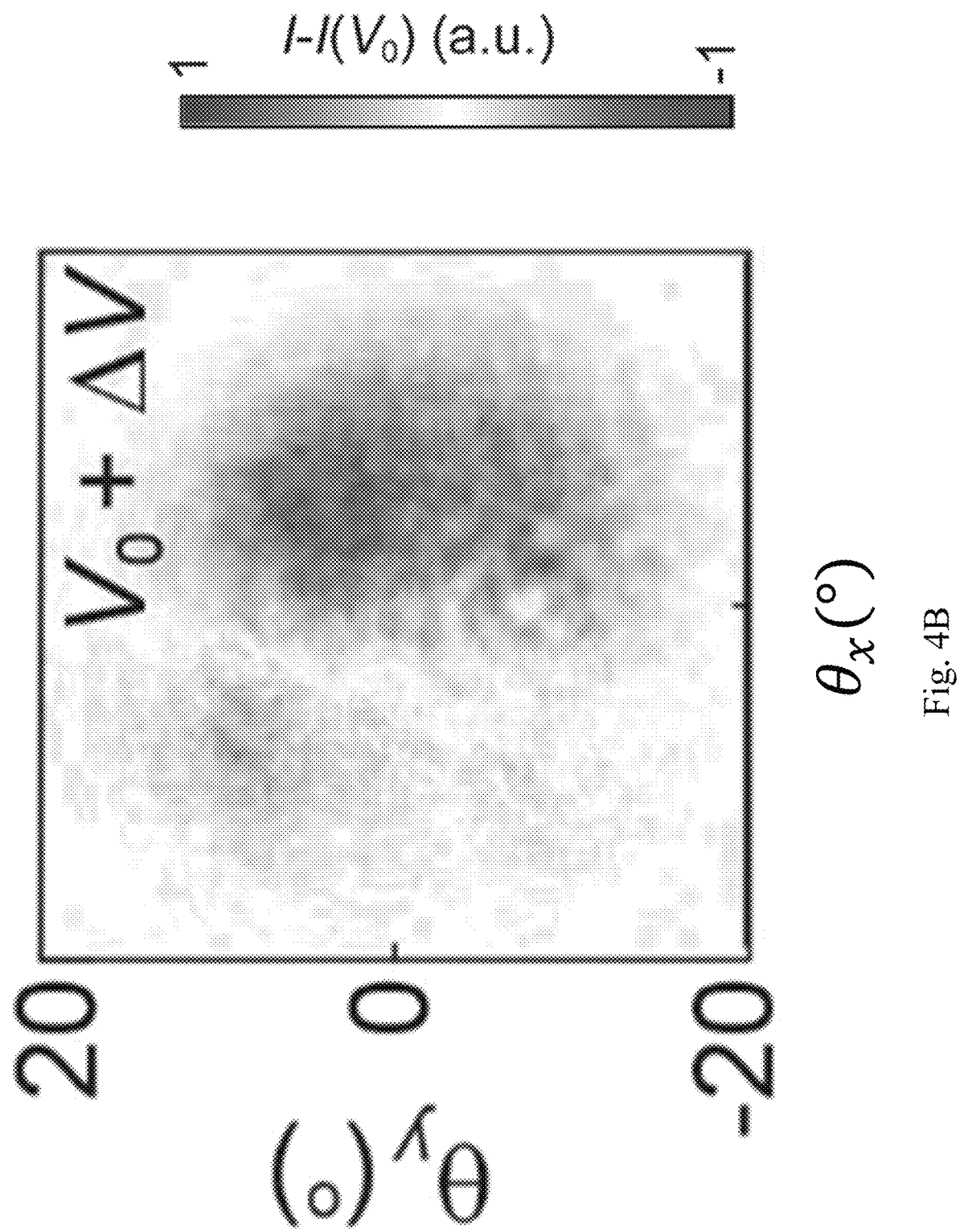
FIGS. 4B-C are Fourier plane images in an exemplary embodiment of the present disclosure.
Figure 4C:
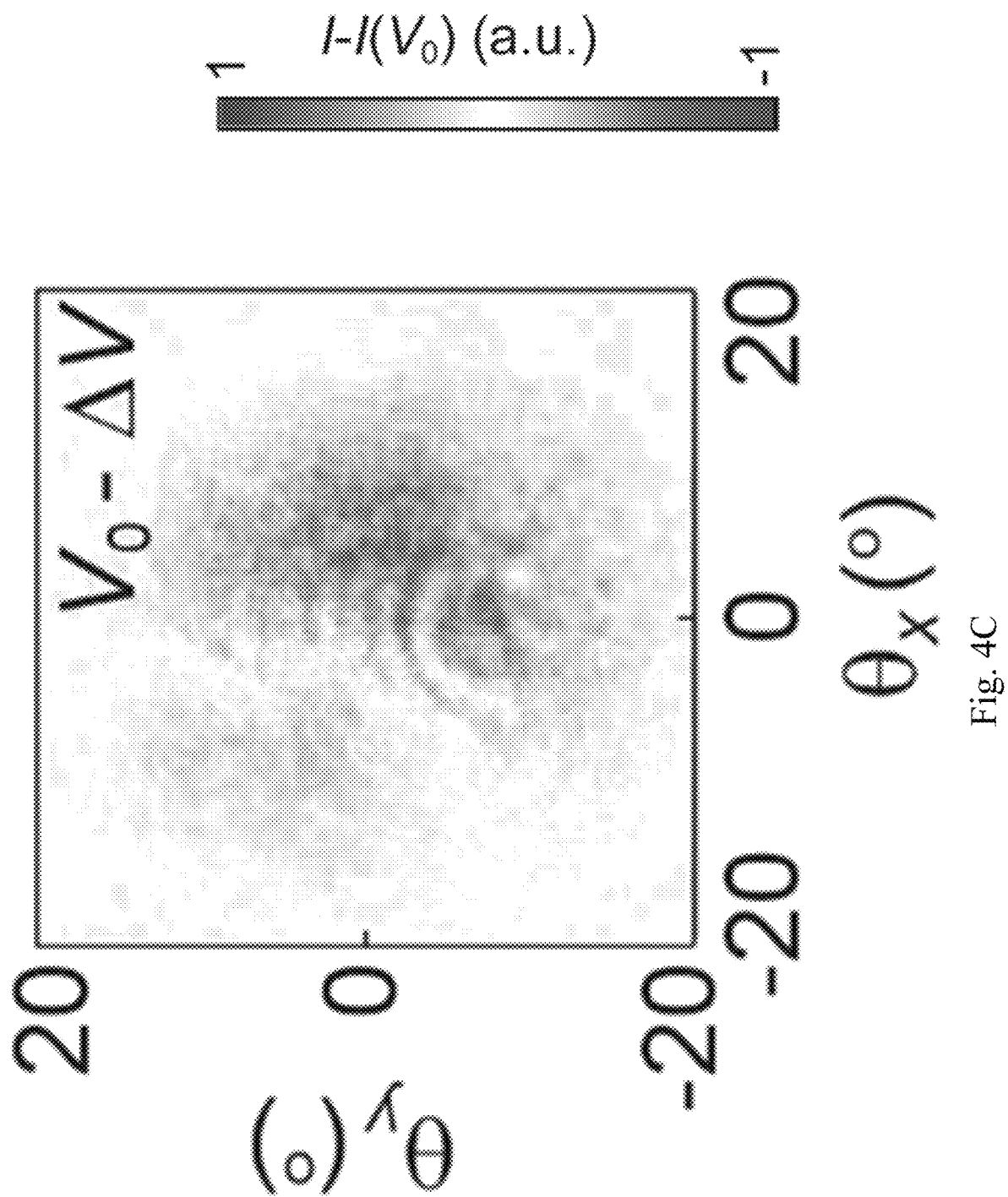
Figure 4D:
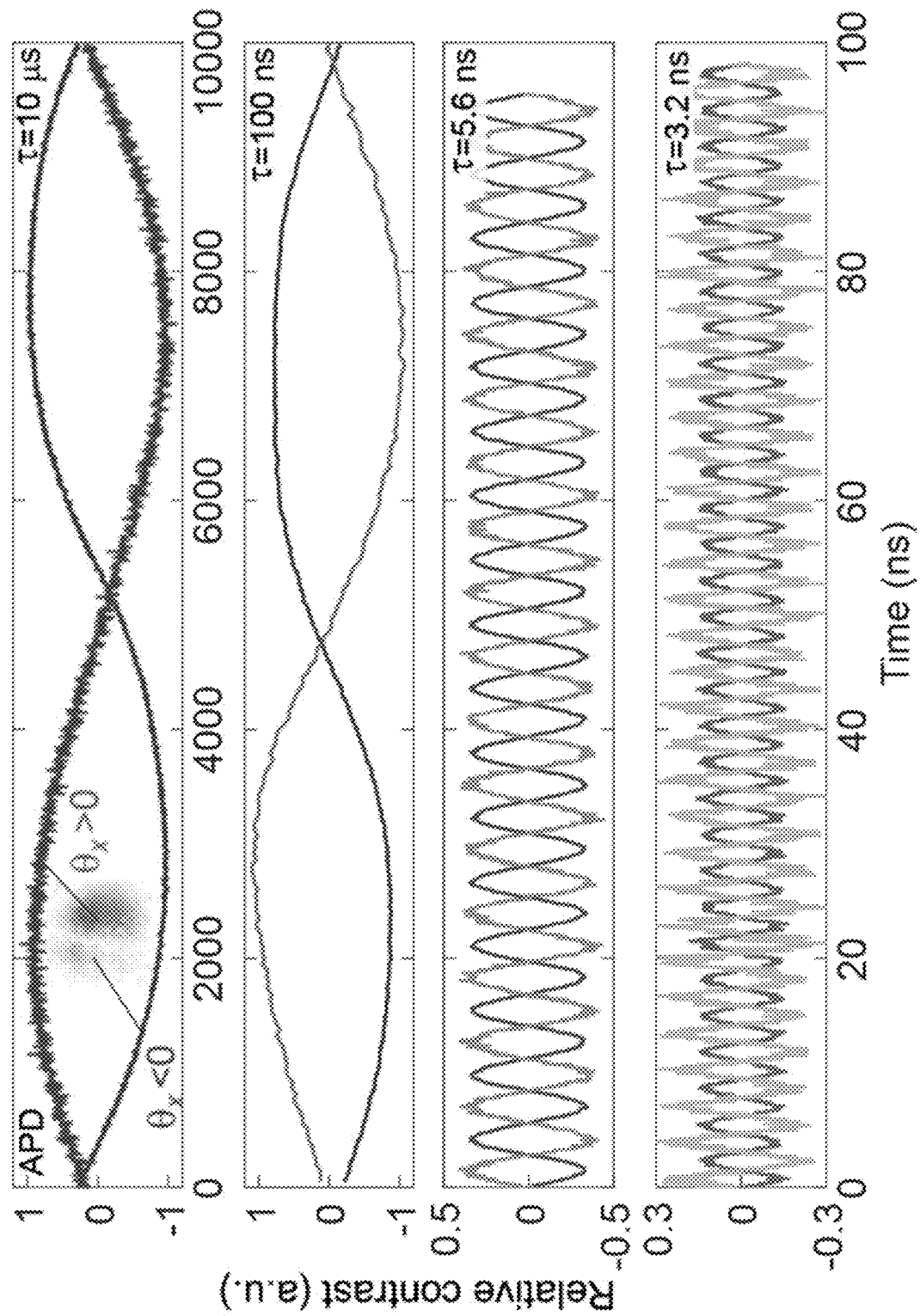
FIG. 4D is a collection of graphs demonstrating changes in the relative contrast over time as a result of the application of oscillating voltage in an exemplary embodiment of the present disclosure.
Figure 7:
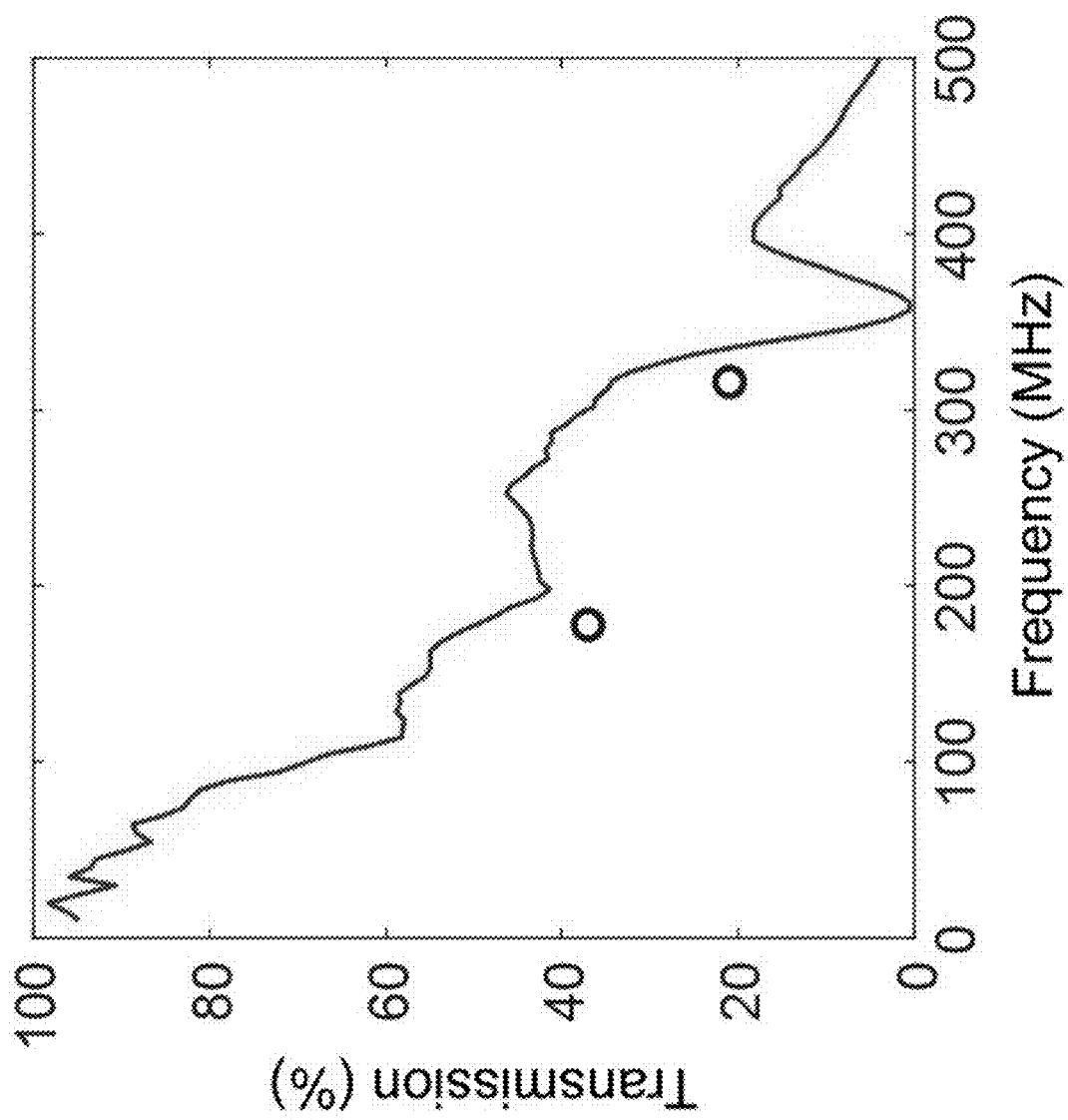
FIG. 7 is a graph of transmission by frequency in an exemplary embodiment of the present disclosure.

We investigate the temporal response of our system by applying a small oscillating bottom gate voltage, $$V_{BG}(t) = V_0 + \Delta V \cdot \sin\left(\frac{2\pi t}{\tau}\right) = 0.7 \text{ V} + 0.45 \text{ V} \cdot \sin\left(\frac{2\pi t}{\tau}\right)$$

and a constant top gate voltage V$_{TG}$=0.64 V, where r is the period (corresponding to twice the switching time). Focusing the beam at the gate edge, as in FIG. 2, we first measure the beam deflection using a long period ($\tau$=2 s) compatible with our camera (FIG. 4A). FIGS. 4B-C show the change in reflection from V$_{BG}$=V$_0$ to V$_{BG}$=V$_0$+$\Delta$V and V$_{BG}$=V$_0$−$\Delta$V, respectively. Next, we measure the optical response at much higher frequencies by collecting the reflected light in the Fourier plane with an avalanche photon detector (APD; FIG. 4D). In order to ensure that we probe beam steering, as opposed to simply changes in reflection amplitude, we separately collect photons from the left ($\theta_x$<0) and right parts ($\theta_x$>0) of the Fourier plane (inset in top panel of FIG. 4D). These signals are found to oscillate with a near-180° phase difference, unambiguously indicating high-frequency beam deflection. Notably, we observe clear oscillations all the way down to a period of $\tau$=3.2 ns ($\omega$=2$\pi$·0.32 GHz). Normalizing the oscillations in APD counts to those at $\tau$=10 µs, we find that the amplitude is approximately unaffected at $\tau$=100 ns, and reduced by ~60% (~80%) at $\tau$=5.6 ns (3.2 ns). Measurements of the high-frequency transmission of electrical connectors leading up to the device indicate that more than half of this reduction is in fact not due to the device itself, but rather external losses and reflections (FIG. 7). Reduction of pixel size and further improvement of contact quality can likely enable switching times down to a few tens of picoseconds, ultimately limited by the MoSe$_2$ mobility.

Finally, we examine several practical aspects relevant to real-world applications. While the above results were obtained at a device temperature of T=6 K, almost identical data were obtained at liquid nitrogen temperatures (80 K; FIG. 8). Moreover, deflection was still clearly observed, although with a smaller amplitude, at a temperature easily attainable with a Peltier cooler (T=230 K), and some deflection effects were even observed at room temperature. The deflection range could be further increased at all temperatures by reducing the background reflections, thus increasing the phase range of the combined reflection. Additionally, the beam steering capability is highly robust to polarization variations (FIG. 9), in contrast to many beam deflection devices.

These observations demonstrate that system according to the present disclosure constitute a highly attractive platform for a wide range of potential applications involving high-speed active optics, with on-chip integrability and potential use in flexible transparent optics as very appealing features. In addition to the two-dimensional beam steering demonstrated here, these approaches can also enable a broad variety of other atomically thin optical elements, including atomically flat holograms with many controllable outputs and flat lenses with tunable focal length, by utilizing other gate geometries or upscaling such systems into more advanced pixel arrays. Since the graphene gates can easily be etch patterned with feature sizes well below 100 nm, realization of active metasurfaces with thousands of control channels is an option. This can enable novel approaches to LIDAR, optical information processing and optical controls for quantum computation, wearable optics, and augmented reality devices.

A number of variations will be appreciated, including leveraging the chiral selection rules of these K/K'-valley excitons to achieve polarization patterning, with both electrostatic, magnetic and optical tunability. This method does not require magnetic patterning, since in combination with a global DC magnetic field, the patterned gate approach demonstrated here would allow for spatially tuning the relative phase and reflection amplitude of K- and K'-valley excitons. Moreover, these methods, involving strong light-matter interactions in an atomically thin system, are ideally suited for investigation of nonlinear and quantum optical effects. In particular, strong photon-photon interactions can be mediated by exciton-exciton interactions engineered via the background reflective substrate or by using Rydberg exciton states, potentially paving the way for the realization of quantum optical metasurfaces. Due to the excellent quantum valley coherence properties of the excitons, valley superpositions could be explored to create tunable patterns of entangled reflection states, that can be exploited for parallel generation of multi-photon entangled states.

Materials and Methods

Device Fabrication

In order to minimize contact resistance, crucial to high-frequency operation, we fabricated bottom contacts to the TMD. This was done by first assembling mechanically exfoliated flakes of graphene and hBN with the dry-transfer method, and placing them on a quartz substrate. After thermal annealing of the two-flake stack, platinum contacts were defined with e-beam lithography and deposited on top of the hBN flake through thermal evaporation (1 nm Cr+19 nm Pt). The partially complete device was then thermally annealed again, before assembling mechanically exfoliated $MoSe_2$, hBN and graphene flakes and placing them on top of the contacts. Finally, extended electrical contacts to the Pt contacts and the graphite gates were deposited through thermal evaporation (10 nm Cr+90 nm Au).

Experimental Method

All measurements were conducted in a Montana Instruments cryostat, using a custom-built 4f confocal setup with a Zeiss (100×, NA=0.75, WD=4 mm) objective. Reflection spectra were measured using a halogen source and a spectrometer, and all spectra were normalized to that collected from a gold contact. Electrostatic gating was performed with Keithley 2400 multimeters for DC measurements and with an arbitrary waveform generator (Tektronix AWG710) for AC measurements. We used a Ti:Sapphire laser (M Squared) with a power of 5 µW at the sample for Fourier imaging, and imaged the reflected beam with a CMOS camera in the Fourier plane. At high frequencies, an avalanche photodetector (APD) was used to collect photons from two different parts of the Fourier plane. The time dependence was measured using a Time Correlated Single-Photon Counting system (PicoHarp 300).

Theory: Phase Extraction Through Spectrum Fitting

The interference between the reflection from the excitons and from other interfaces within our system causes an asymmetric line shape. The resultant reflection arises from the infinite sum of optical paths created by different combinations of reflection and transmission at the various interfaces. By assuming that the background reflection in the absence of excitonic response is constant ($|r_0|e^{i\phi_0}$) in the small spectral range considered in our fits, the reflection can be written on the form:

$$r(\omega) = \frac{\gamma_0 \left(\frac{2\omega_0 G}{C}\right)^2}{\omega - \omega_0 + \frac{i\Gamma}{2}} + r_0 = \frac{C}{\omega - \omega_0 + \frac{i\Gamma}{2}} + r_0, \quad (1)$$

where $\gamma_0$ is the free-space radiative rate of the excitons, $\Gamma$ is the total linewidth, and $\omega_0$ is the exciton resonance frequency. G is the Green's function that propagates fields from the TMD to the far-field, and incorporates the effects of the background reflectors. We therefore stress that the first term is not equivalent to the reflection of a freestanding TMD. The latter can only be determined if G is known, which would require full knowledge of the reflection from all interfaces within the heterostructure.

Introducing $A+iB=Ce^{-i\phi_0}$ and $\delta=\omega-\omega_0$, we find expressions for the amplitude and phase of the reflection:

$$R(\omega) = |r(\omega)|^2 = |r_0|^2 + \frac{A^2 + B^2 + B\Gamma|r_0| + 2A|r_0|\delta}{\delta^2 + \frac{\Gamma^2}{4}} \quad (2)$$

$$\phi(\omega) - \phi_0 = \tan^{-1}\left(\frac{B\delta - \frac{A\Gamma}{2}}{A\delta + \frac{B\Gamma}{2} + |r_0|\left(\delta^2 + \frac{\Gamma^2}{4}\right)}\right) \quad (3)$$

By fitting the obtained reflection spectra, we extract the parameters $|r_0|$, A, B, $\delta$ and $\Gamma$, and can thus compute the phase. Since we are only concerned with relative phases in our work, we set $\phi_0=0$.

Theory: Beam Deflection

We here present a theoretical model of the beam deflection, the predictions of which are in very good agreement with the experimental observations presented in the main text. Defining the gate edge to lie along x=0, we model the reflection profile of our system as:

$$r(\omega, r) = \begin{cases} r_{tot,L}(\omega)\delta(z), & x < 0 \\ r_{tot,R}(\omega)\delta(z), & x > 0, \end{cases} \quad (4)$$

where $r_{tot,L(R)}(\omega)$ is the (gate-dependent) combined spectrum of the exciton and background reflections on the left (right) side of the gate edge. The combined spectrum has a smaller available phase range than that of the exciton resonance itself (0-180°) due to the interference with the background reflections. While the background reflections come from multiple interfaces both above and below the TMD, the combined system can be modeled as an equivalent reflector in the plane of the TMD (z=0) by including the additional phases due to the z-displacements in r(ω).

The incoming field is given by the two-dimensional Gaussian distribution $E(\rho)=E_0 \exp(-\rho^2/4\sigma^2)$, where $\rho$ is the radial coordinate in the plane of the TMD and $\sigma$ is the standard deviation of the incoming intensity distribution, $I_{in}(\rho)=c\varepsilon|E(\rho)|^2$. For a diffraction limited spot, one finds $\sigma=0.42\lambda/(2NA)$, where NA is the numerical aperture of the objective. The reflected intensity at a position r is then given by:

$$I(r, \omega) = c\varepsilon \left| \int r(\omega, r') E(r') \frac{\exp(ik|r - r'|)}{\lambda |r - r'|} dr' \right|^2, \quad (5)$$

Computing the integral for the far-field (r→∞) at a polar angle θ, and azimuthal angle u (u=0 is perpendicular to the gate edge), one finds:

$$I(\theta,u,\omega) \propto \exp(-2F^2(\theta)) |r_{tot,R}(\omega)[1-\text{ierfi}(F(\theta)\cdot\cos u)] + r_{tot,L}(\omega)[1+\text{ierfi}(F(\theta)\cdot\cos u)]|^2, \quad (6)$$

where $F(\theta) = k\sigma \cdot \sin\theta$, and erfi(x) is the imaginary error function. Thus, we find that the reflections from the two sides interfere constructively for θ, u that satisfy:

$$\theta = \sin^{-1}\left(\frac{\text{erfi}^{-1}(\tan\Delta\phi/2)}{k\sigma\cos u}\right), \quad (7)$$

where Δϕ is the phase difference between the reflections from the two sides. In the small phase difference limit, this simplifies to $\theta = \Delta\phi \cdot \sqrt{\pi}(4k\sigma \cos u)$, equivalent to two localized sources at $x = \pm 2\sigma/\sqrt{\pi}$. Due to the factor $\exp(-2F^2(\theta))$, the intensity maximum appears at a somewhat different angle. In cases where the amplitudes of the two reflections can be approximated to be the same, the integral simplifies to (in the small Δϕ limit):

$$I(\theta,u,\omega) \propto 4e^{-2F^2(\theta)} |r_{tot}(\omega)|^2 (1+\text{erfi}(F(\theta)\cdot\cos u)\cdot\Delta\phi), \quad (8)$$

Since the maximum intensity appears at small θ in the small Δϕ limit, and erfi(x)~$2x/\sqrt{\pi}$ for small x, we find:

$$(u, \theta)_{max} = \left(0, \frac{\Delta\phi}{2\sqrt{\pi}k\sigma}\right), \quad (9)$$

Finally, the center-of-mass deflection perpendicular to the gate edge is found by using the Taylor expansion of erfi(x), since the integral requires evaluating erfi(x) up to x=kσ sin(θ_c) where θ_c is the collection angle:

$$\boxed{\bar{\theta}_\perp = \bar{\theta}_x = \frac{\int I\theta\cos(u)d\Omega}{\int I d\Omega} = \frac{\Delta\phi}{\sqrt{2\pi}k\sigma} = \frac{\Delta\phi \cdot NA}{0.42 \cdot \sqrt{2\pi^3}}} \quad (10)$$

In solving the integrals, we have made the approximation sin θ~θ, which is an acceptable approximation when kσ>1, since the exponential factor then suppresses terms at large θ. For a diffraction-limited spot, one finds kσ sin $\theta_c$=kσ·NA=1.3, or $e^{-2(k\sigma \sin \theta_c)^2}$=0.03.

We compare eqn. (10) with the exact (numerically solved) deflection in FIG. 5 for NA=0.75 (kσ~1.8), and find that they are very similar. Moreover, the theoretically predicted deflection range of ~10° (±5°) for a phase difference range of 42° is in excellent agreement with our experimental observations.

Theory: Background Subtraction

In the main text, we present center-of-mass deflections without background-subtraction in all figures except the inset of FIG. 2B. Here we discuss the physical interpretation of the difference between raw and background-subtracted results, as well as their meaning for future generation devices with lower background levels. In particular, we show that while the effects of the background cannot be fully removed due to the coherent combination of the fields, the background-subtracted results still provide a useful metric for predicting the performance at lower background levels. Our discussion also serves to motivate the expression used in the inset of FIG. 2B for calculating the center-of-mass deflection of the background-subtracted signal, $\bar{\theta}_i^{diff} = \Sigma(I-I_0)\theta_i/\Sigma|I-I_0|$.

It is useful to divide our system into four parts, representing the background (B) and exciton (X) reflection from the left (L) and right (R) side of the gate edge. We label the four parts with the indices ij, where i∈{B, X} and j∈{L, R}. We will define the background reflection spectrum $r_{Bj}(\omega)$ as that in the absence of the exciton response, and the exciton reflection spectrum as the difference $r_{Xj}(\omega) = r_{tot,j}(\omega) - r_{Bj}(\theta)$, where $r_{tot}(\omega)$ is the spectrum of the combined reflection. We note that $r_{Xj}(\omega)$ is not identical to the reflection of a free-standing TMD, as discussed above. We represent the background sources as an equivalent reflector in the plane of the TMD (z=0) by including the additional phase due to the z-displacements in $r_{Bj}(\omega)$. The reflection profile can thus be written as:

$$r(\omega, r) = \begin{cases} (r_{B,L}(\omega) + r_{X,L}(\omega))\delta(z), & x < 0 \\ (r_{B,R}(\omega) + r_{X,R}(\omega))\delta(z), & x > 0. \end{cases} \quad (11)$$

While we added the exciton and background contributions to get $r_{tot,j}$ above, we will now first sum the background terms on the two sides in order to interpret the physics behind the background-subtracted signal. Since the presence of the graphene gate is expected to have a relatively small effect on $r_{Bj}$, we will set $r_{B,L} = r_{B,R} \equiv r_B$, and thus find:

$$I(\theta,u) \propto e^{-2F^2(\theta)} |2r_B + r_{X,L}\beta + r_{X,R}\beta^*|^2, \quad (12)$$

where $\beta = 1 + \text{ierfi}(F(\theta)\cdot\cos u)$. The background-subtracted intensity is then given by:

$$I^{diff}(\theta,u) \equiv I(\theta,u) - I_0(\theta,u) \propto e^{-2F^2(\theta)} (4r_B \cdot \text{Re}(r_{X,L}\beta + r_{X,R}\beta^*) + |r_{X,L}\beta + r_{X,R}\beta^*|^2), \quad (13)$$

where we have shifted the phases of all reflections to make $r_B$ real, without loss of generality.

In order to define a useful analogy of the center-of-mass deflection for the background-subtracted signal, one cannot simply replace I(θ, u) with $I^{diff}$(θ, u) in eqn. (10), because the background and exciton reflection combine coherently. Instead, we find that the following metric is useful for estimating the deflection that could be achieved if the background were reduced:

$$\bar{\theta}_\perp^{diff} = \frac{\int I^{diff} \theta \cos(u) d\Omega}{\int |I^{diff}| d\Omega}.$$

To evaluate this expression analytically, we first consider the case of small $\phi_{X,j}$ and set $|r_{X,R}| = |r_{X,L}| \equiv r_X$. Following similar calculations as above, we find:

$$\bar{\theta}_\perp^{diff} = \begin{cases} (\alpha/2) \cdot \Delta\phi_X, & r_X \ll r_B \\ \alpha \cdot \Delta\phi_X, & r_X \gg r_B \end{cases}, \quad (14)$$

where $$\alpha = \frac{NA}{0.42\sqrt{2\pi^3}}.$$

We remind that the deflection of the raw (not background-subtracted) signal was analytically predicted to be $\bar{\theta}_\perp = \alpha \Delta \phi_{tot}$ above. Hence, while the deflection of the raw signal $\bar{\theta}_\perp$ predominantly depends on the phase difference of the combined reflection ($\Delta\phi_{tot}$), the background-subtracted deflection $\bar{\theta}_\perp^{diff}$ mainly depends on the pure exciton phase difference ($\Delta\phi_X$). (The subscript "tot" is used here to differentiate $\Delta\phi_{tot}$ from $\Delta\phi_X$, and is dropped in cases where the meaning is clear, such as in the main text).

Figure 6A:
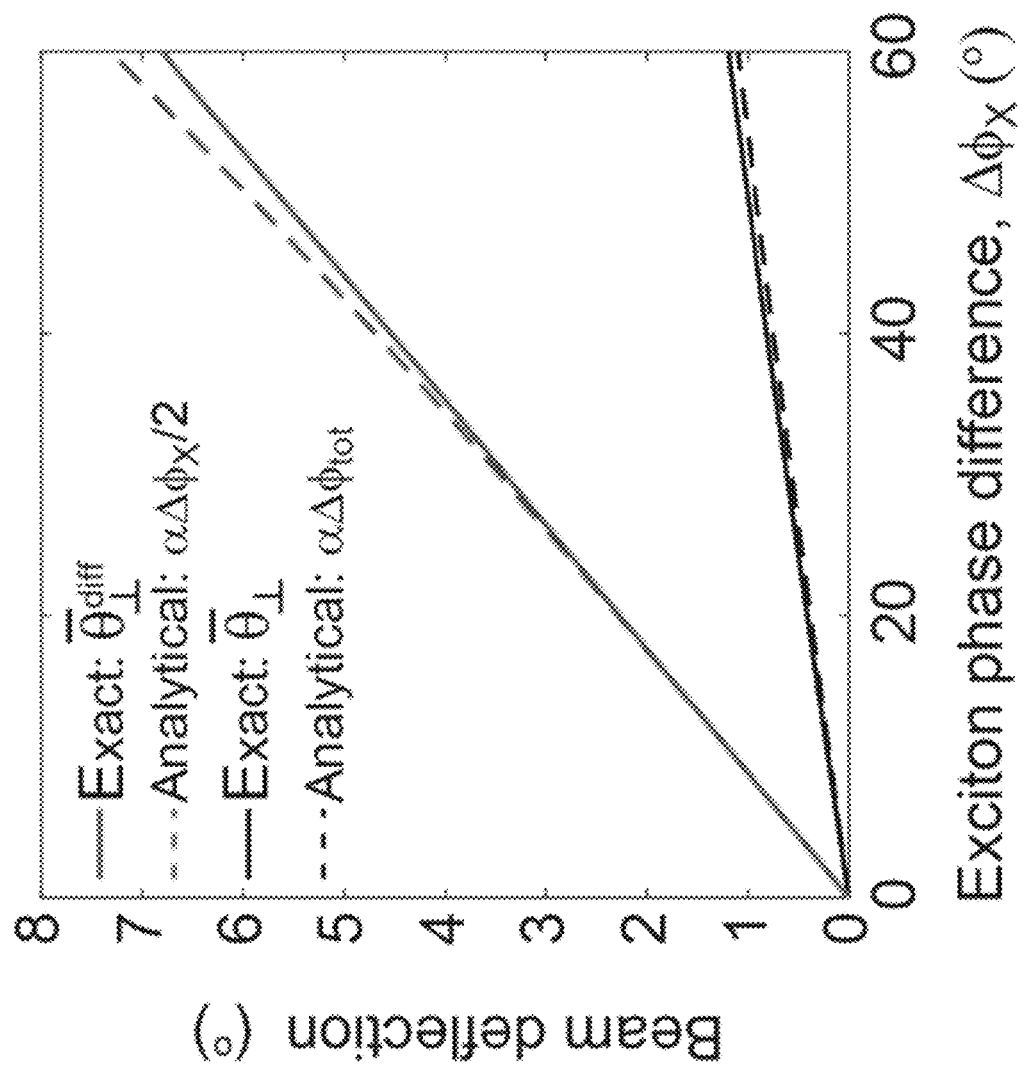
FIGS. 6A-B are graphs of simulated beam deflection by phase difference in an exemplary embodiment of the present disclosure.
Figure 6B:
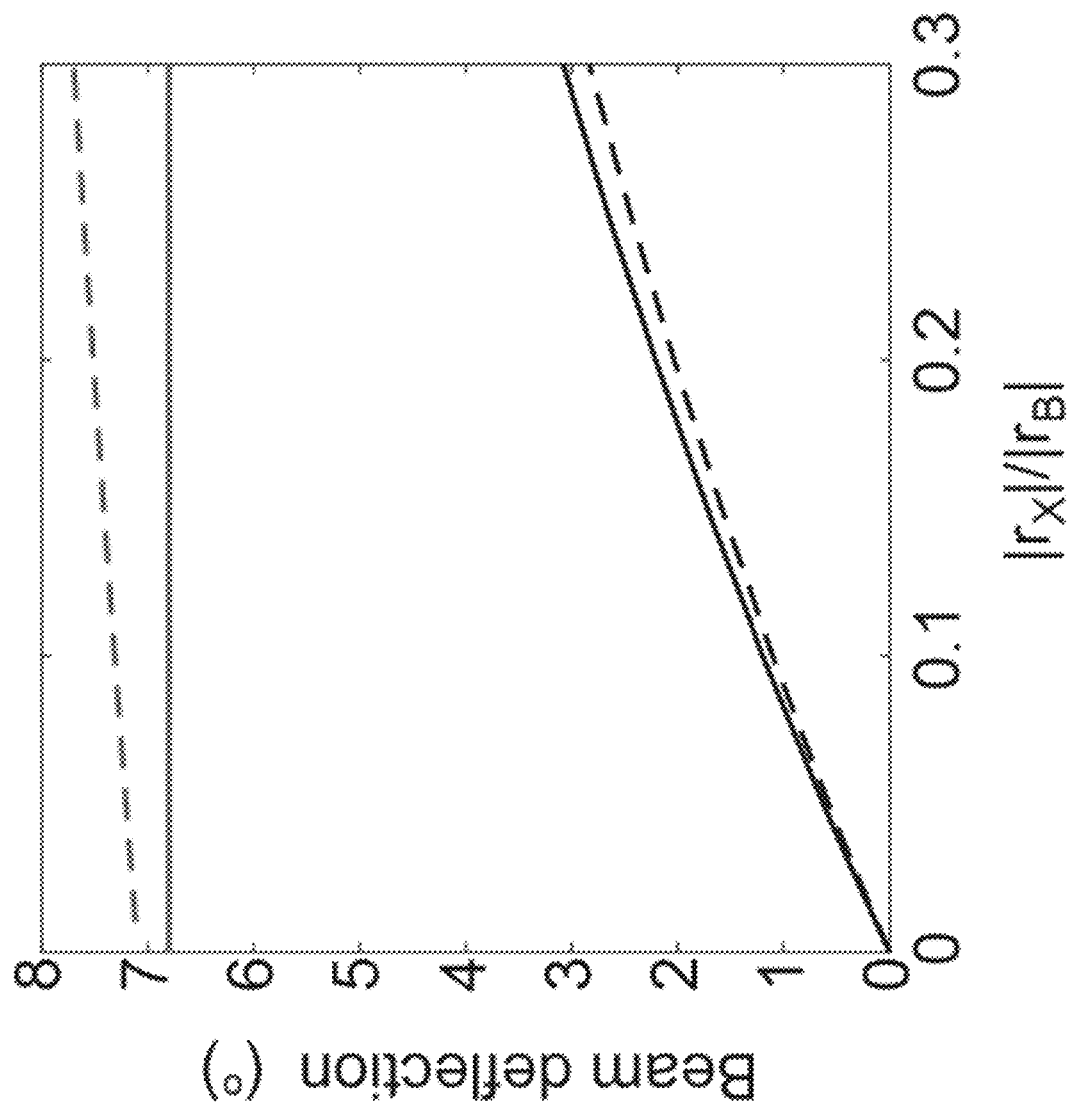

FIGS. 6A-B display the numerically calculated center-of-mass deflections of the raw and background-subtracted signals ($\bar{\theta}_\perp$ and $\bar{\theta}_\perp^{diff}$) for a larger range of $\Delta\phi_X$ and $|r_X|/|r_B|$, respectively. Both plots consider the relatively strong background regime ($0 < |r_X|/|r_B| < 0.3$), where there is a substantial difference between $\Delta\phi_{tot}$ and $\Delta\phi_X$. For comparison, we also plot the analytically predicted expressions for $\bar{\theta}_\perp$ and $\bar{\theta}_\perp^{diff}$, proportional to $\Delta\phi_{tot}$ and $\Delta\phi_X$, respectively. Indeed, we find that the analytical expressions agree well with the exact center-of-mass deflections. Since the deflection of the raw signal $\bar{\theta}_\perp$ predominantly depends on $\Delta\phi_{tot}$, it depends strongly on the amount of background. In contrast, the background-subtracted deflection $\bar{\theta}_\perp^{diff}$ mainly depends on the pure exciton phase difference $\Delta\phi_X$, and is thus much less sensitive to the relative magnitudes of $r_X$ and $r_B$.

Figure 6C:
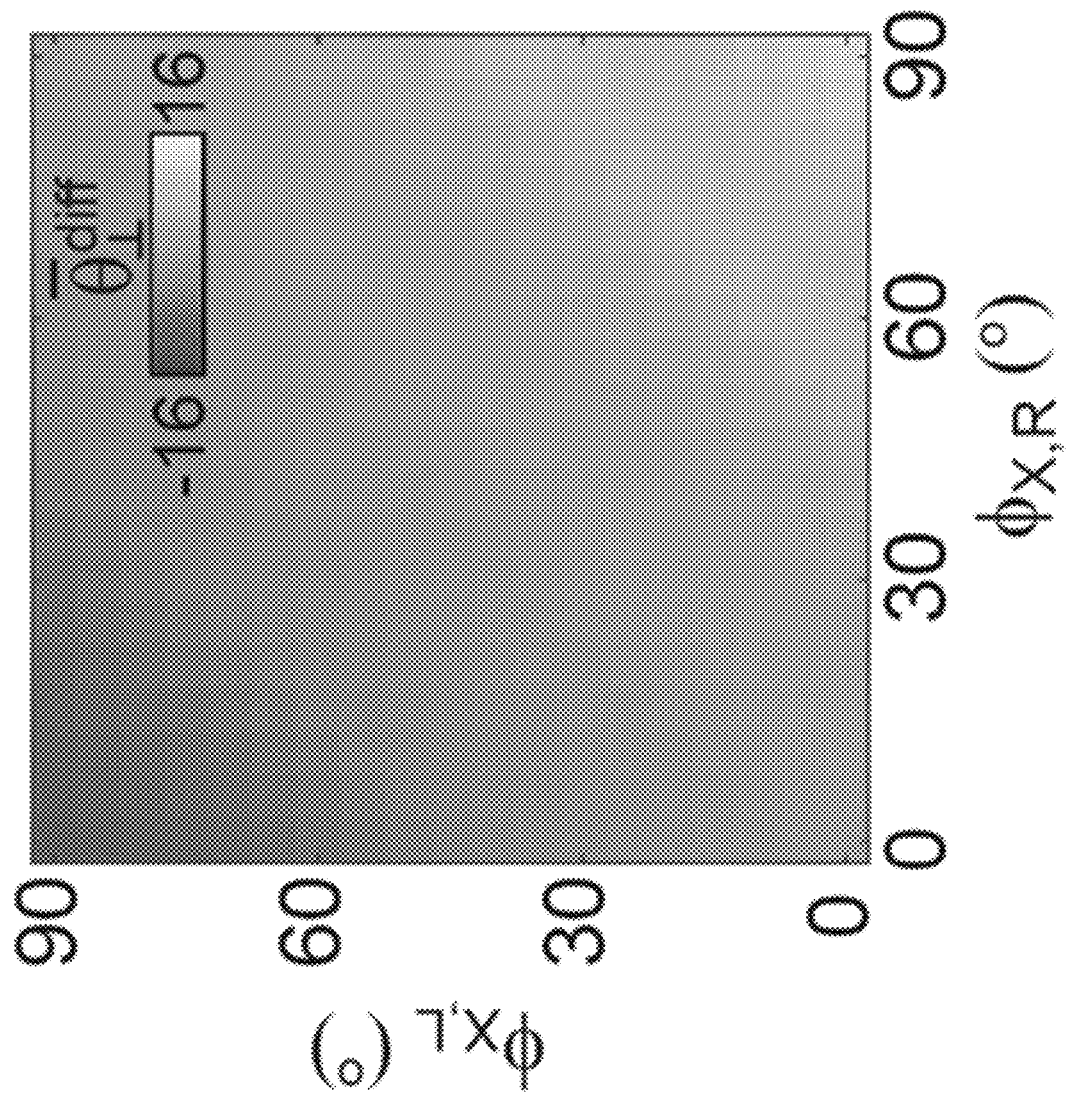
FIGS. 6C-G are heatmaps of simulated beam deflection in an exemplary embodiment of the present disclosure.
Figure 6D:
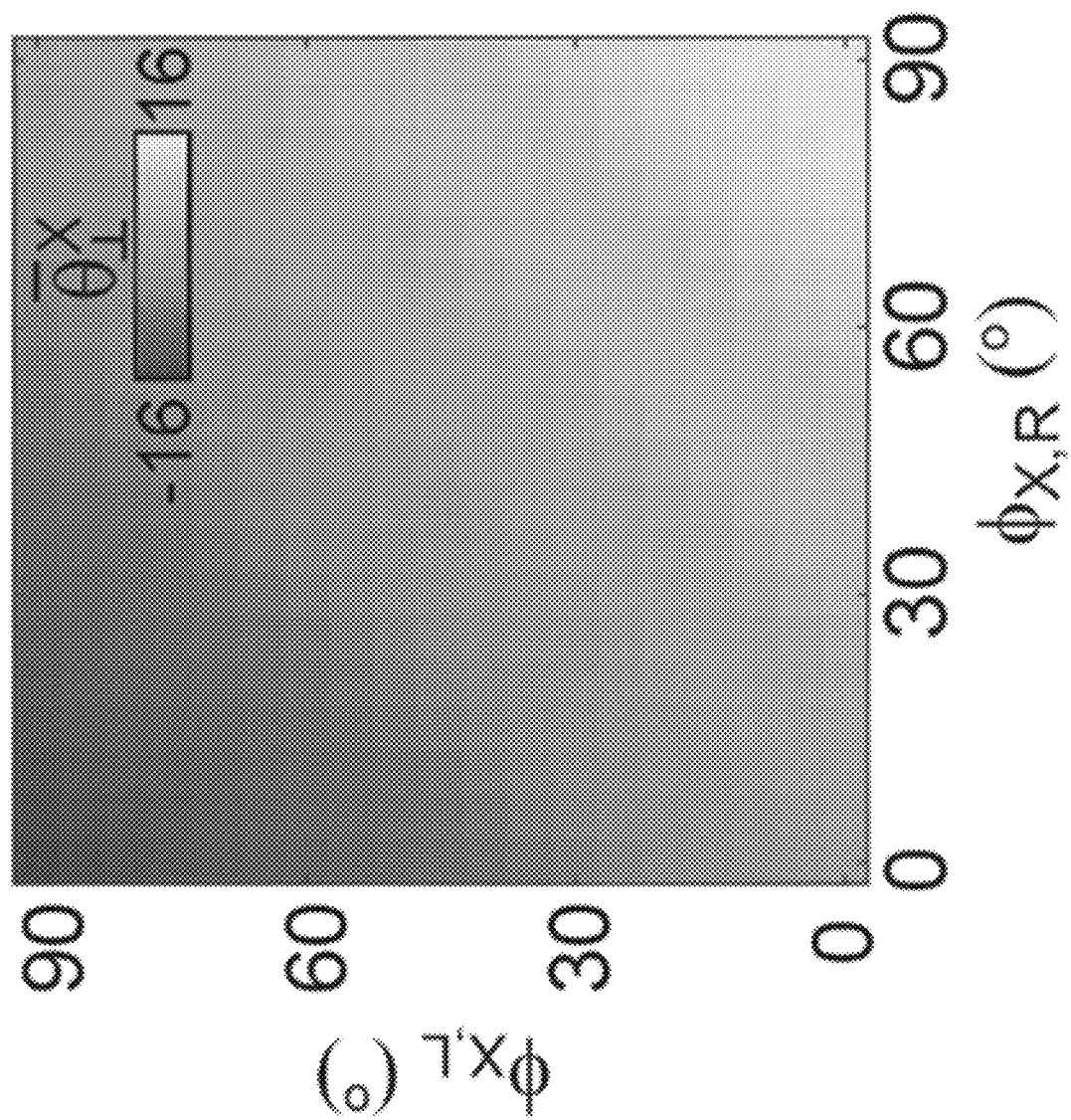
Figure 6E:
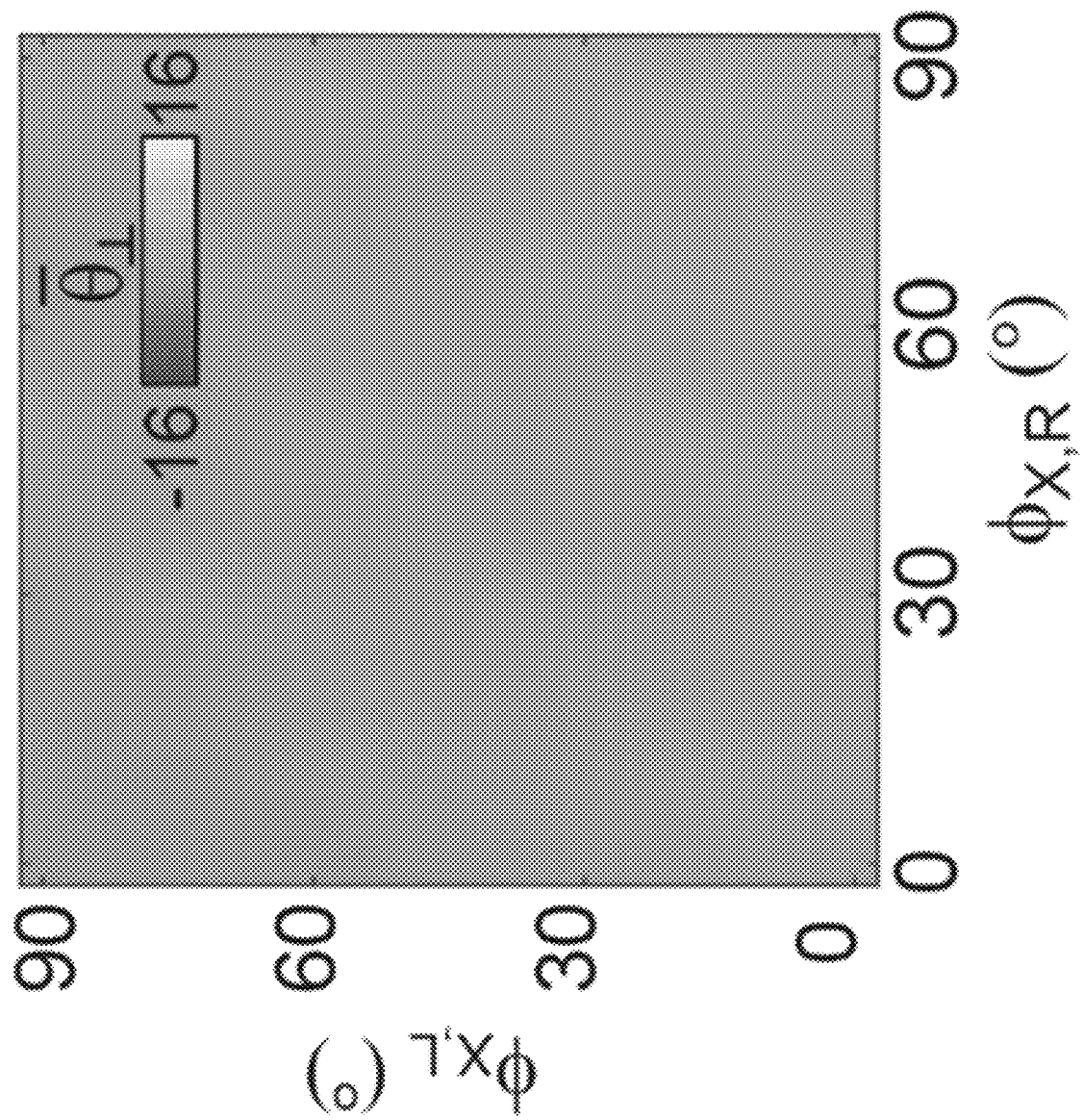
Figure 6F:
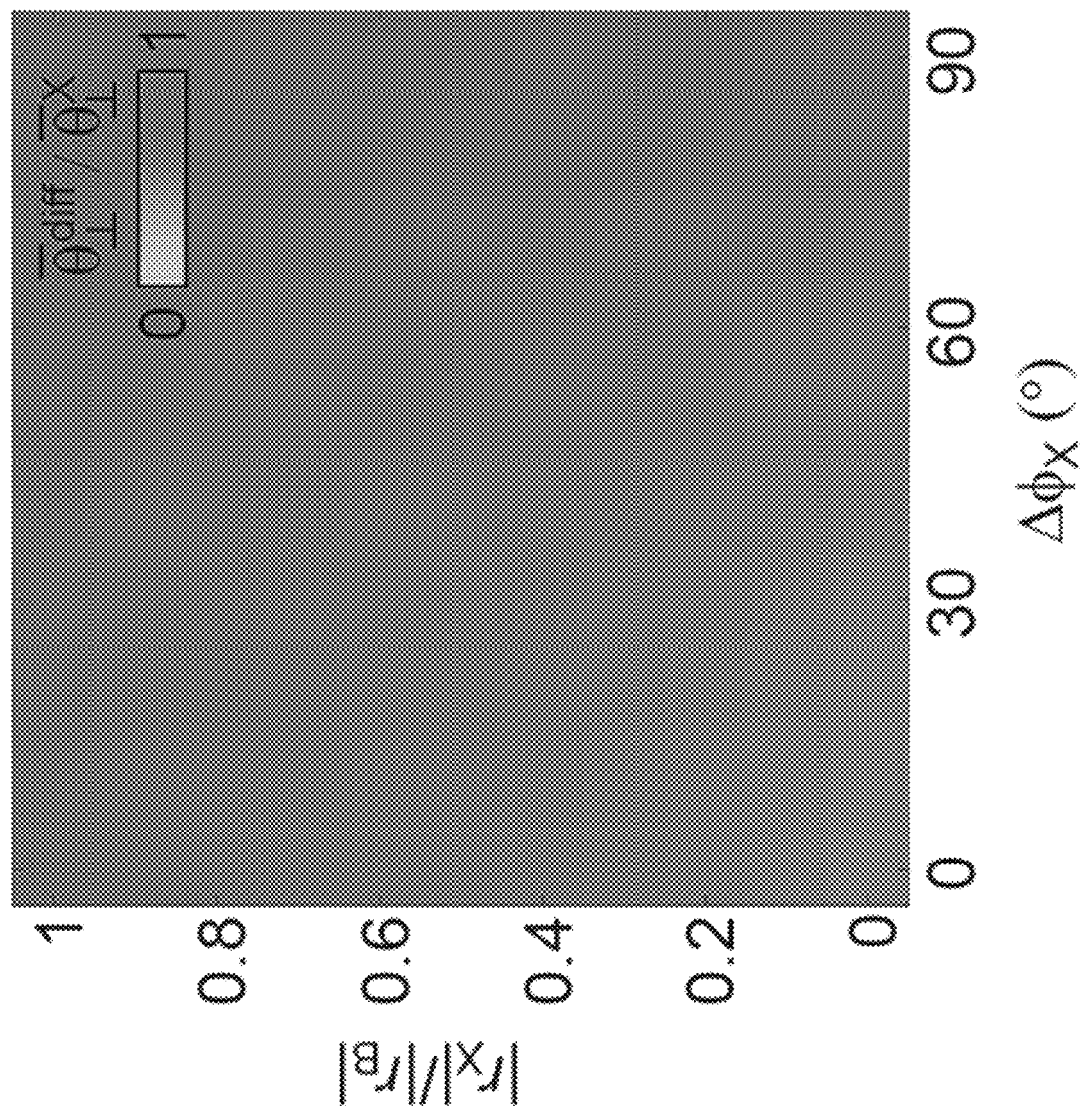
Figure 6G:
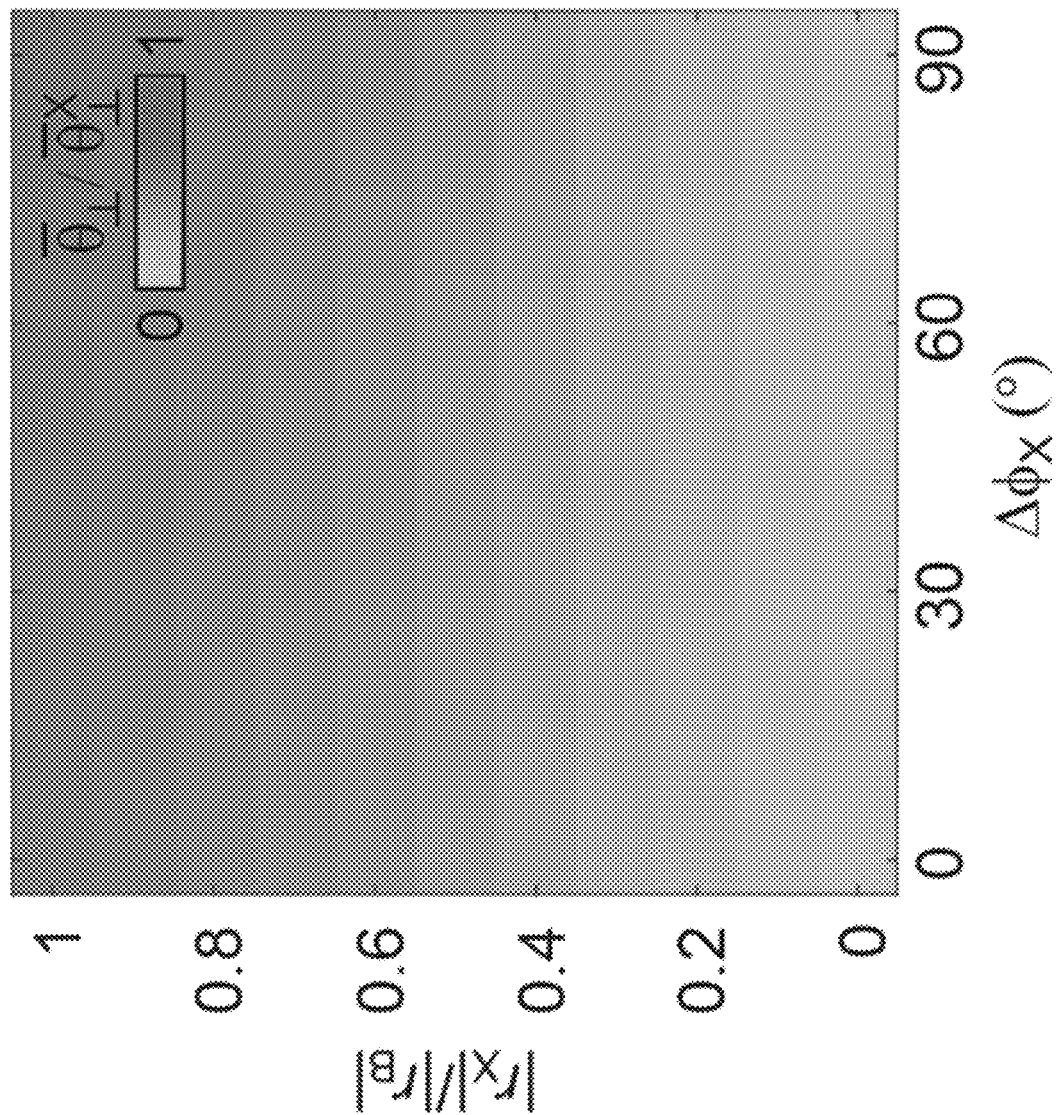

We further show the value of the background-subtracted deflection $\bar{\theta}_\perp^{diff}$ by comparing it to the raw deflection that would have been achieved in the limit of no background reflection, $\bar{\theta}_\perp^X \equiv \bar{\theta}_\perp(r_B \to 0)$. FIGS. 6C-D show the numerically computed $\bar{\theta}_\perp^{diff}$ and $\bar{\theta}_\perp^X$ as a function of the pure exciton phases $\phi_{X,L}$ and $\phi_{X,R}$, where $\bar{\theta}_\perp^{diff}$ is evaluated in the strong background regime ($|r_{X,j}|=0.1 r_B$). For reference, we also plot the raw deflection ($\bar{\theta}_\perp$) at $|r_{X,j}|=0.1 r_B$ (FIG. 6E). As expected, we find that the raw deflection ($\bar{\theta}_\perp$) is much smaller than what would be achieved without background ($\bar{\theta}_\perp^X$), because the interference with the background causes the phase range of the combined reflection to be smaller than that of the pure exciton resonance. In contrast, the background-subtracted deflection $\bar{\theta}_\perp^{diff}$ provides a very good estimate of $\bar{\theta}_\perp^X$. This is further shown by plotting the ratios $\bar{\theta}_\perp^{diff}/\bar{\theta}_\perp^X$ and $\bar{\theta}_\perp/\bar{\theta}_\perp^X$ as functions of $\Delta\phi_X$ and $|r_{X,j}|/|r_B|$ (FIGS. 6F-G). While the raw deflection $\bar{\theta}_\perp$ only becomes a good approximation of $\bar{\theta}_\perp^X$ for higher $|r_{X,j}|/|r_B|$, the background-subtracted deflection $\bar{\theta}_\perp^{diff}$ remains within the range $[\bar{\theta}_\perp^X/2, \bar{\theta}_\perp^X]$ for the whole parameter space considered here.

The background-subtracted deflection $\bar{\theta}_\perp^{diff}$ is therefore a better metric for evaluating the potential operation with lower background levels. Nevertheless, we emphasize that the removal of all background sources would make the operation more sensitive to differences in the magnitudes of $|r_{X,R}|$ and $|r_{X,L}|$, thus requiring more careful control.

Finally, we would also like to clarify a possible misconception about the background-subtracted signal: in the background dominated regime, it is tempting to consider a situation where the effect of the excitonic system is simply to slightly shift the reflected beam without any change in amplitude. In this case, one would find that that the center-of-mass deflection of the background-subtracted signal ($\bar{\theta}_\perp^{diff}$) is trivially equal to the value of $\theta$ that maximizes $dI_0/d\theta$. Since this $\theta$ is only set by the beam waist, this would mean that $\bar{\theta}_\perp^{diff}$ is independent of $\Delta\phi_X$, thus rendering the background-subtracted signal somewhat meaningless. The logical breach in this argument arises from the assumption that the amplitude of the reflection is unchanged, which indirectly means that the exciton phases are $$\pm \frac{\pi}{2}$$

relative to the background. Hence, the deflection is not actually independent of $\Delta\phi_X$. By including the change in reflection amplitude, one indeed finds that $\bar{\theta}_\perp^{diff}$ depends (approximately linearly) on $\Delta\phi_X$ and thus goes to zero for small $\Delta\phi_X$.

High-Frequency Transmission Characterization

The high-frequency measurements presented in FIG. 4D show clear beam steering down to switching times of 1.6 ns ($\omega=2\pi\cdot 316$ MHz). However, the amplitude is found to decrease at the highest frequencies, which could be due to either the RC-time of the device itself or the external cabling leading up to the device. In order to determine the impact of the latter, we use a Vector Network Analyzer (VNA) to characterize the high-frequency performance of parts of the external cabling that was used in the measurement (FIG. 7). While we cannot recreate the full circuit in the absence of the device without introducing additional components, this measurement places an upper bound on the transmission of the full cabling. We find a substantial reduction in the transmission at the higher frequencies used in our work, with S12 parameters of 50% and 34% at $\omega=2\pi\cdot 178$ MHz and $\omega=2\pi\cdot 316$ MHz, respectively. This gives a lower bound on the decay factor due to the device itself of 75% and 61% at the two frequencies, respectively.

Temperature Dependence

Figure 8A:
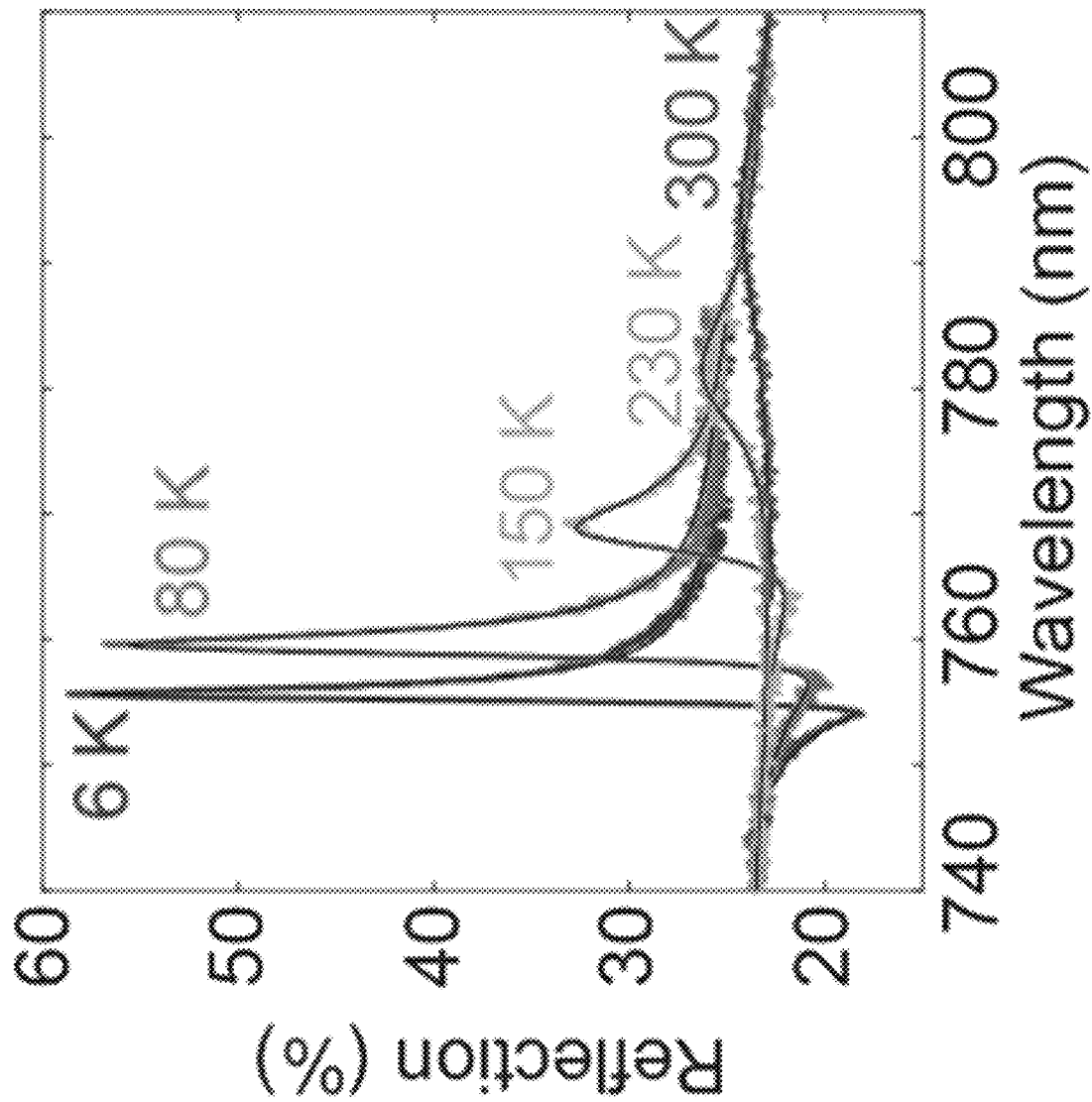
FIG. 8A is a graph of reflection by wavelength in an exemplary embodiment of the present disclosure.
Figure 8B:
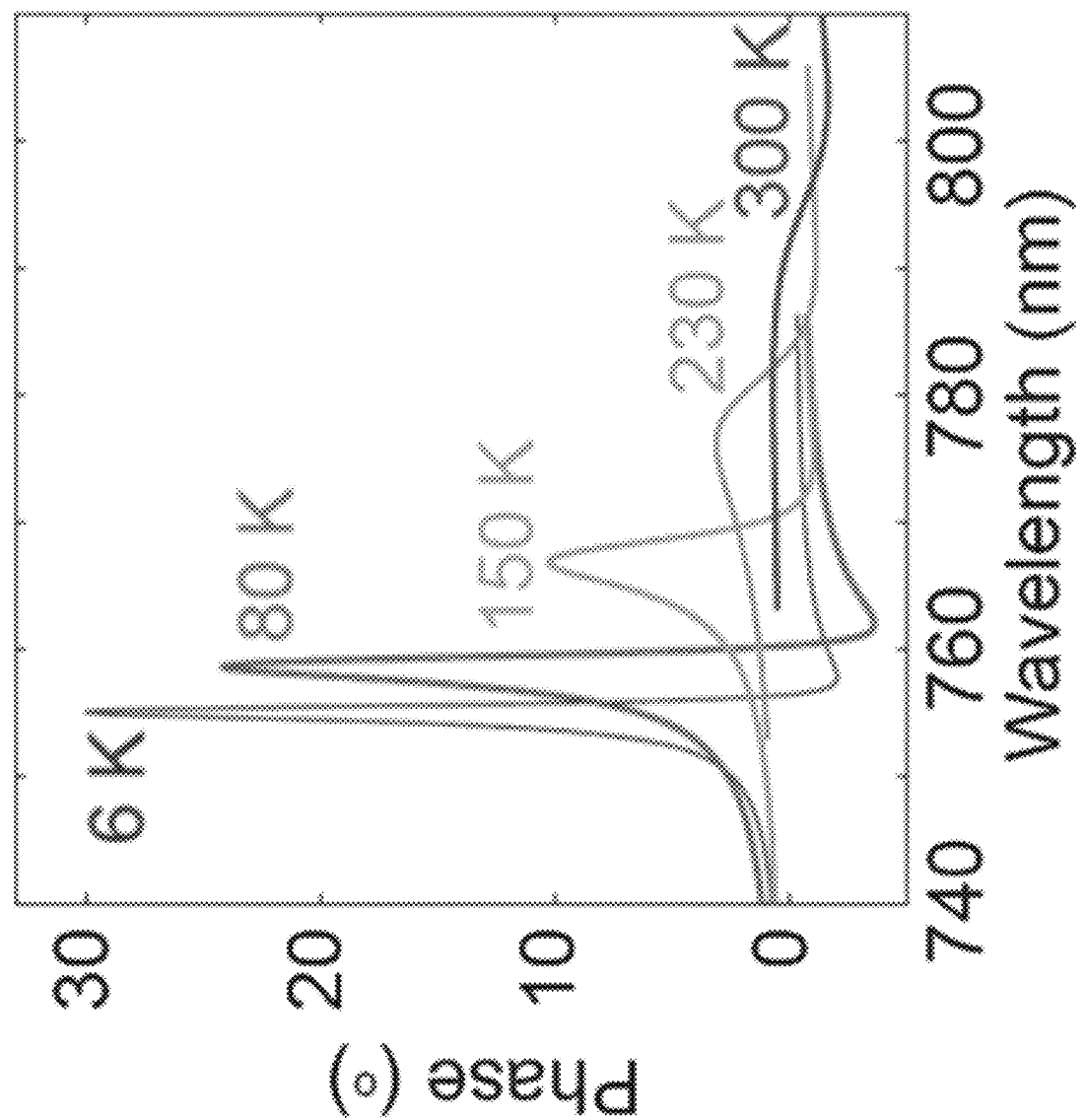
FIG. 8B is a graph of phase by wavelength in an exemplary embodiment of the present disclosure.

FIG. 8A shows reflection spectra obtained in the right side of the device in the intrinsic regime at five different temperatures ranging from 6 K to 300 K. Consistent with previous studies, we find that the exciton resonance broadens, decreases in amplitude, and red-shifts with increasing temperature. While the phase of the exciton resonance still changes from 0° to 180° across the resonance, the decrease in amplitude causes a reduction in the available phase range of the combined background and exciton signal (FIG. 8B). However, we find that the reflection amplitude and phase range remain almost the same at liquid nitrogen temperatures (80 K) as at 6 K, and the exciton resonance is still clearly visible at higher temperatures.

Figure 8C:
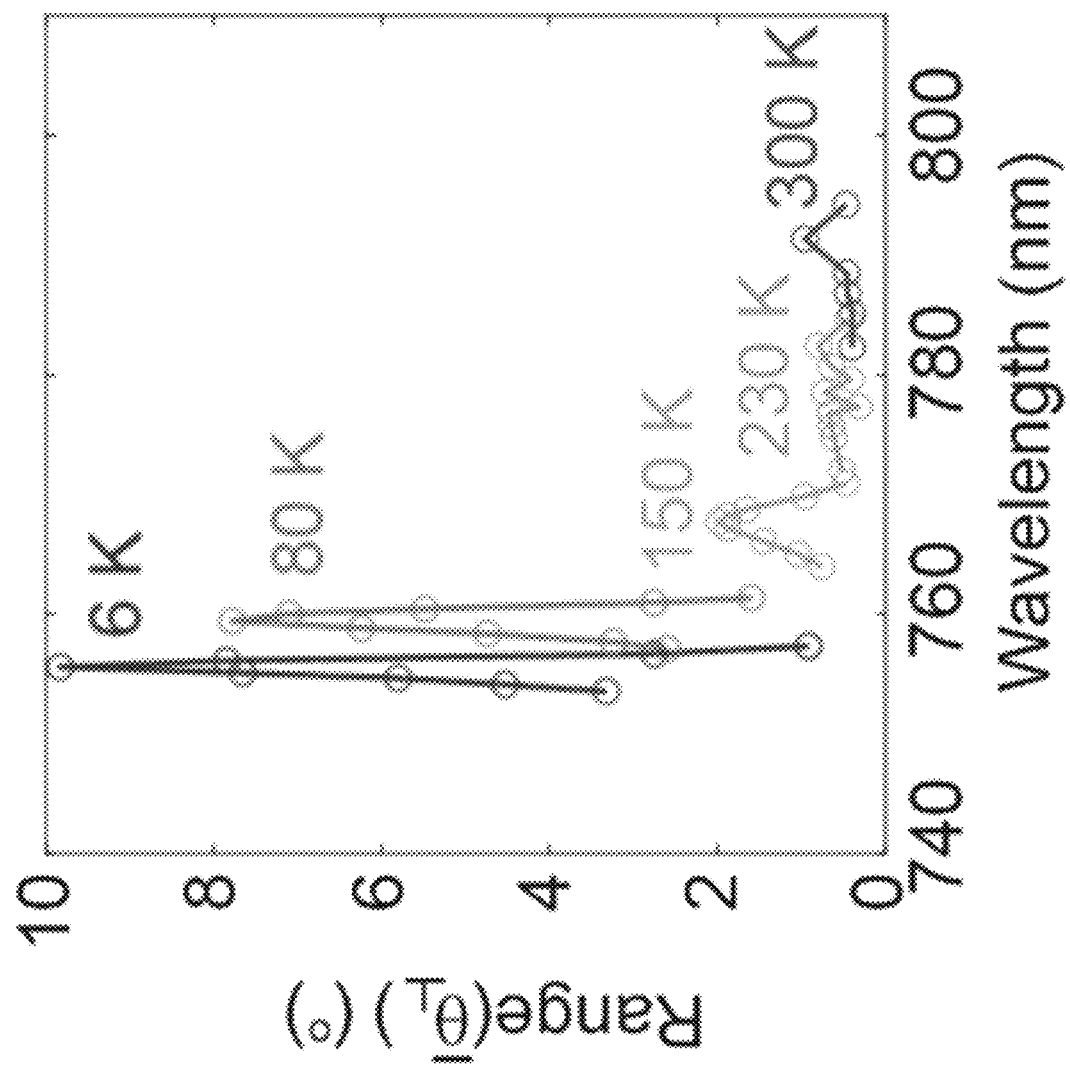
FIG. 8C is a graph of beam deflection by wavelength in an exemplary embodiment of the present disclosure.
Figure 8D:
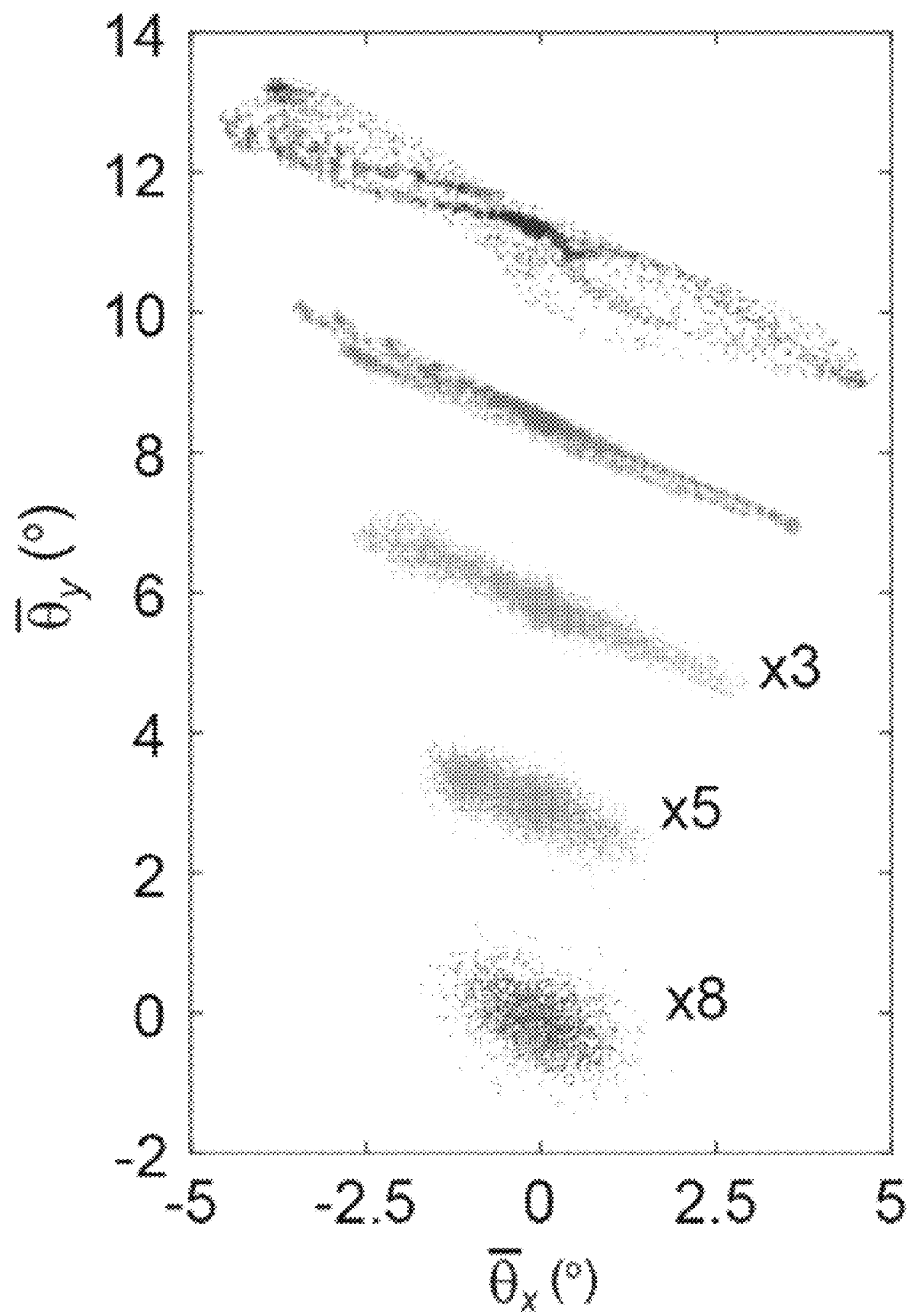
FIG. 8D is a scatter plot of beam deflection in an exemplary embodiment of the present disclosure.
Figure 8E:
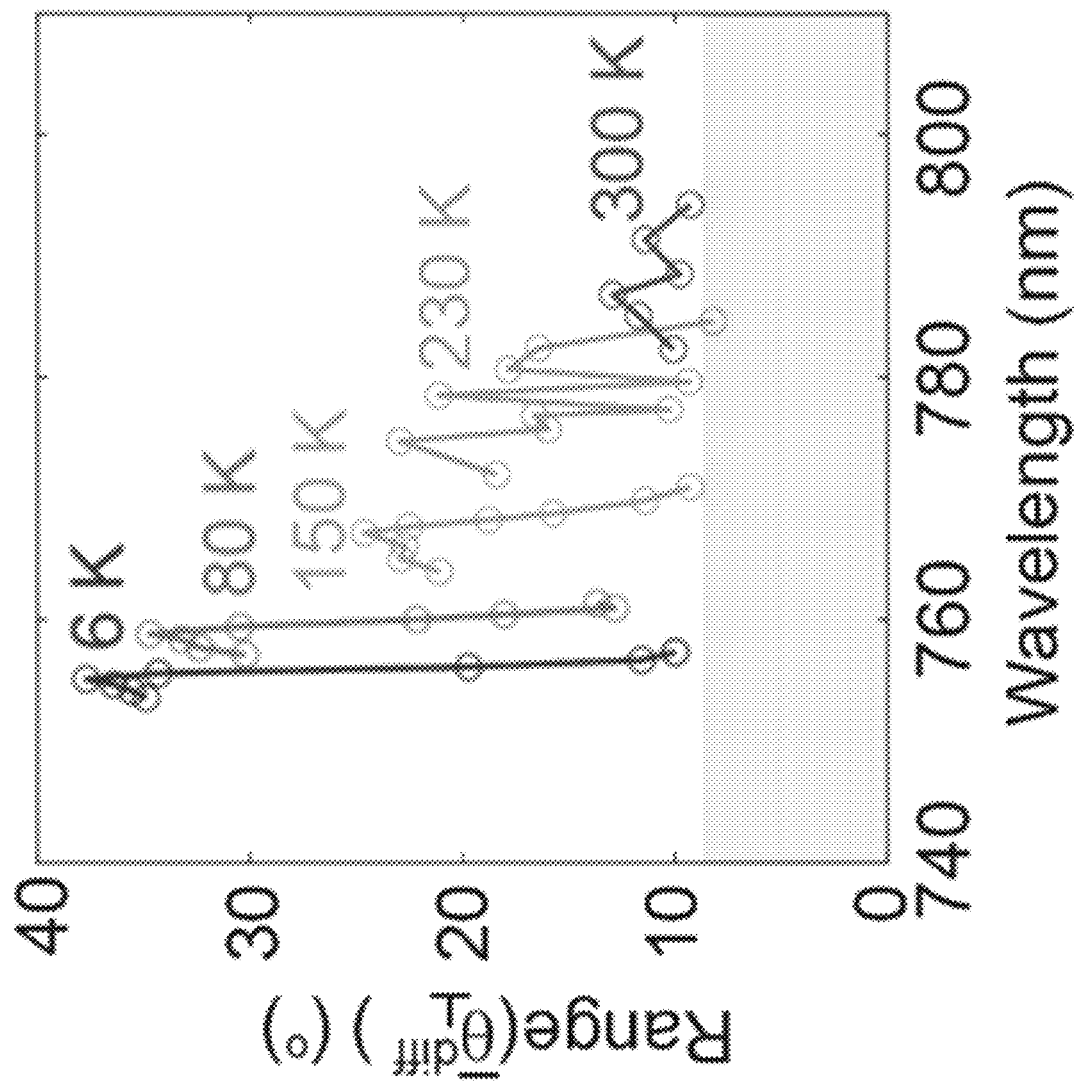
FIG. 8E is a graph of beam deflection by wavelength in an exemplary embodiment of the present disclosure.
Figure 8F:
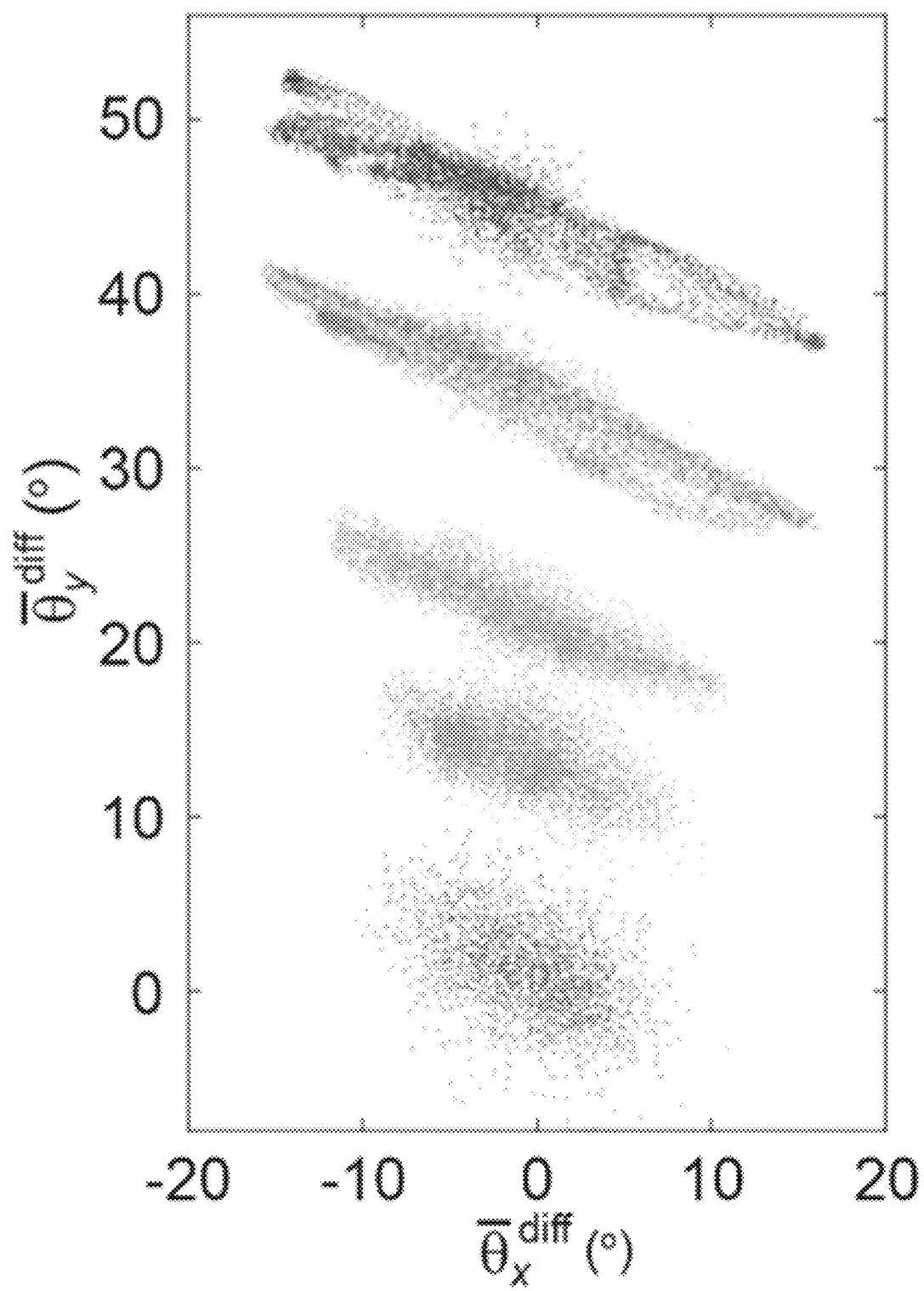
FIG. 8F is a scatter plot of beam deflection in an exemplary embodiment of the present disclosure.

Since the resonance wavelength changes with temperature, we conduct gate-dependent beam steering measurements for a range of laser wavelengths at each temperature to ensure proper comparison across temperatures (FIG. 8C), and present scatter plots from the optimal wavelengths in FIG. 8D. The deflection ranges shown in FIG. 8C are based on the set of gate voltage combinations used in the main text. Consistent with the reduction in phase range, the beam deflection range of the full reflection (including background) decreases with temperature (FIG. 8C-D). Nevertheless, the deflection range remains almost 8° at 80 K and 2° at 150 K. Some deflection of the full reflection can also be observed at 230 K (−43° C.) and even at room temperature (FIG. 8D).

The operation at higher temperatures could be improved by reducing the background level, thus allowing for a larger phase range of the combined reflection. This way, the deflection range at higher temperatures will be larger, although with a lower reflection amplitude. In order to explore the potential operation with lower background, we also show the deflection range of the background-subtracted signal (0E-F). We emphasize that this does not fully represent what would have been observed for a free-standing TMD flake, since the effects of interference between the background and the exciton reflection are not removed. Nevertheless, as above, the background-subtracted deflection ($\bar{\theta}_\perp^{diff}$) still provides a useful metric for evaluating operation at lower background levels. After subtracting the background signal, we find that the deflection range decreases less rapidly with increasing temperature. In particular, the deflection range remains above 50% of that at 6 K all the way up to 230 K. Due to the low reflection amplitude at higher temperatures, and at wavelengths that are far red-detuned from the intrinsic exciton resonance (and thus not reachable with electrostatic gating), the background-subtracted deflection becomes more sensitive to noise, causing a noise floor around 9° (gray shaded area in FIG. 8E). We note that this is not the case for measurements with higher reflection amplitude, so the noise floor does not cause a general offset.

Polarization Dependence

In order to test how the performance of our beam steering device depends on the polarization of the incoming light, we measure the amplitude and deflection of the reflection using four different (linear) polarization angles (FIG. 9). To remove any effects of polarization-dependent optical components in the beam path (e.g. beam splitters), we normalize the amplitude of the reflection to that without excitonic effects, obtained by heavily doping the device. Since the latter is not affected by gradients in exciton properties, we assume it to be an isotropic reference. FIGS. 9A-D shows the gate dependence of the integrated reflection, indicating no systematic variations with polarization angle. Plotting the gate dependence of the deflection angle (FIGS. 9E-H) and a scatter plot of all deflections (FIGS. 9I-L), we also observe no systematic polarization dependence of the deflection range or the deflection direction. The small (non-systematic) variations observed in FIG. 9 are expected to be due to small changes in spot location as the polarization very weakly affects the beam path. The robustness to polarization variations stands in contrast to many other types of beam steering devices, and is a very useful feature for many applications.

Gate Edge Localization

In order to position the laser beam at the gate edge, we first locate the edge by sweeping the galvanometric mirrors while measuring the reflection using a broadband halogen lamp. To further optimize the alignment of the laser spot with the gate edge, we measure beam steering in a few locations near the gate edge (example shown in FIG. 13). The relative contributions from the two sides vary as the spot is moved across the edge, and we balance the contributions by finding the location with the largest and most symmetric deflection range. Far away from the gate edge, only small deflections (in arbitrary directions) are observed (FIGS. 14A-B), likely due to local inhomogeneity, causing small phase gradients that change slightly with doping. The non-zero width of the deflection path at the gate edge is likely caused by such inhomogeneity. Independent control of different parts of the wavefront, essential to amplitude stabilization (FIG. 2F), two-dimensional steering and further upscaling possibilities, is of course only possible at the split-gate edge.

Figure 5:
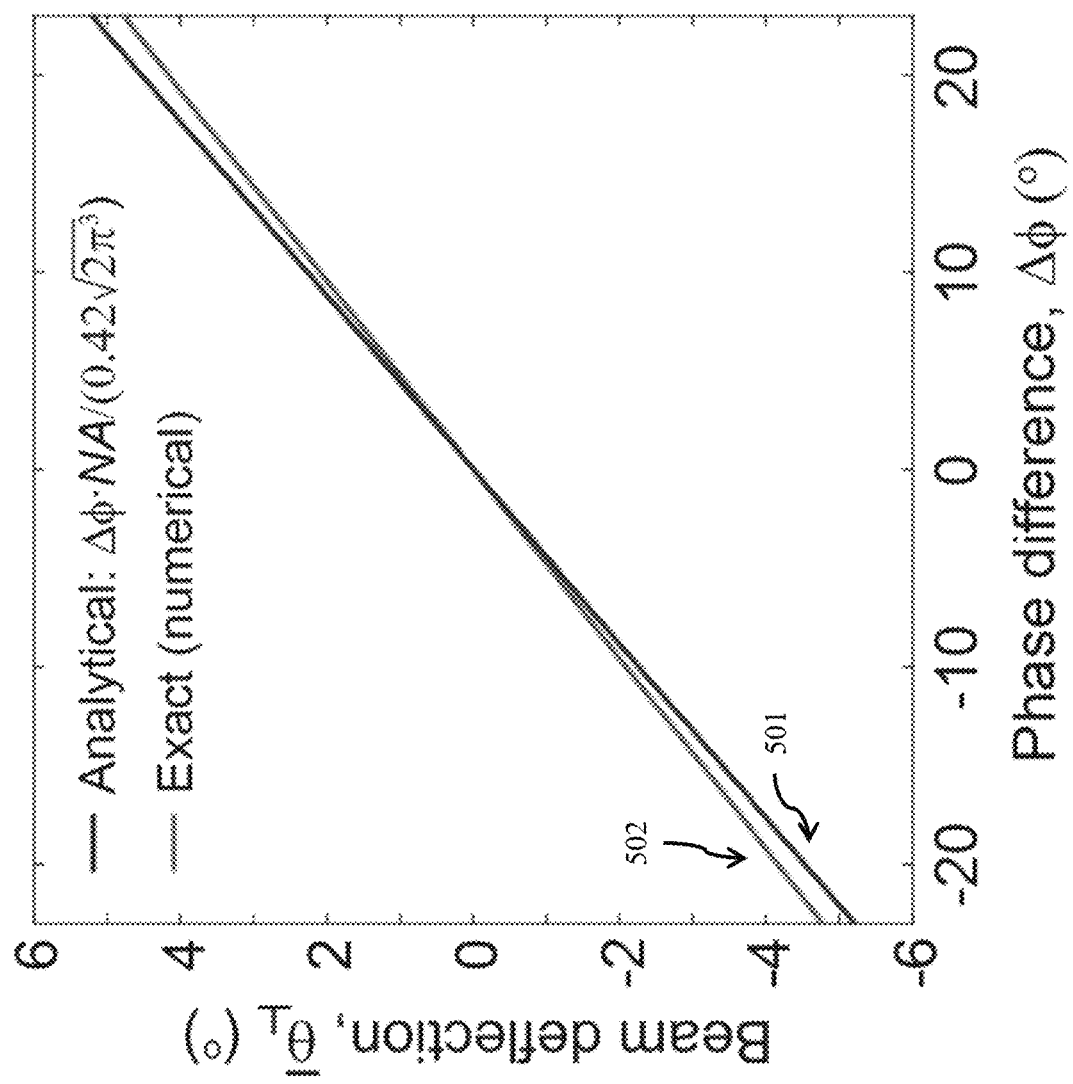
FIG. 5 is a graph of simulated beam deflection by phase difference in an exemplary embodiment of the present disclosure.

Referring to FIG. 5, theoretically predicted beam deflection is shown. Analytically (501) and numerically (502) predicted beam deflection as a function of phase difference between the two sides of the gate edge. The predicted beam deflection range of approximately 10° (±5°) for a phase range of 42° is in excellent agreement with the experimental results above.

Referring to FIG. 6, interpretation of a background-subtracted signal is provided. In FIG. 6A Numerically calculated (solid) and analytically approximated (dashed) center-of-mass deflection of raw ($\bar{\theta}_\perp$; black) and background-subtracted ($\bar{\theta}_\perp^{diff}$; red) signal, are plotted against phase difference between exciton reflections from the two sides ($\Delta\phi_X = \phi_{X,R} - \phi_{X,L}$). In the calculation, we have set $\phi_{X,R} = -\phi_{X,L}$ and $|r_{X,R}| = |r_{X,L}| = 0.1|r_B|$. FIG. 6B is the same as FIG. 6A, but plotted against the ratio $|r_X|/|r_B|$ for $\phi_{X,R} = -\phi_{X,L} = 30°$. While the deflection of the raw signal ($\bar{\theta}_\perp$) depends on the phase difference of the full reflection ($\Delta\phi_{tot}$), the deflection of the background-subtracted signal ($\bar{\theta}_\perp^{diff}$) depends mainly on the phase difference of the exciton reflection ($\Delta\phi_X$). Thus, $\bar{\theta}_\perp^{diff}$ is less sensitive to changes in $|r_X|/|r_B|$.

FIGS. 6C-D provide a comparison of background-subtracted deflection ($\bar{\theta}_\perp^{diff}$; FIG. 6C) and raw deflection that would be achieved in the absence of background reflectors ($\bar{\theta}_\perp^X$; FIG. 6D), plotted against pure exciton resonance phases $\phi_{X,R}$ and $\phi_{X,L}$. ($|r_{X,R}| = |r_{X,L}| = 0.1|r_B|$). FIG. 6E is the same as FIG. 6C, but without background-subtraction. FIGS. 6F-G show ratios of the background-subtracted ($\bar{\theta}_\perp^{diff}$; FIG. 6F) and raw ($\bar{\theta}_\perp$; FIG. 6G) deflection to $\bar{\theta}_\perp^X$, as a function of $\Delta\phi_X$ and $|r_X|/|r_B|$. While the raw deflection is much smaller than what could be achieved at lower background levels, the background-subtracted deflection provides a good estimate of $\bar{\theta}_\perp^X$.

Referring to FIG. 7, high-frequency transmission is illustrated. The curve shows VNA measurement of transmission (S12 parameter) through parts of the cabling (excluding the device) used to measure the high-frequency data in FIG. 4D. The Black circles show normalized oscillation amplitude from FIG. 4D, averaged for $\theta_x > 0$ and $\theta_x < 0$.

Referring to FIG. 8, temperature dependence is illustrated. In FIG. 8A, reflection spectra at temperatures 6 K (maroon), 80 K (orange), 150 K (yellow), 230 K (teal) and 300 K (blue), show line broadening, amplitude reduction and red-shift of the exciton resonance with increasing temperature. Black line: fits. FIG. 8B shows phase calculated from the fits in FIG. 8A. The decrease in exciton reflection amplitude at higher temperatures reduces the available phase range of the combined exciton and background reflection. FIG. 8C shows beam deflection range perpendicular to the gate edge at the same temperatures as in FIG. 8A and FIG. 8B for a range of wavelengths near the exciton resonance. The deflection range is obtained for the same gate voltage ranges as used above. The reduced phase range at higher temperatures causes a decrease in deflection range. However, the deflection range is almost unchanged from 6 K to liquid nitrogen temperature (80 K), and is still approximately 2° at 150 K.

FIG. 8D is a scatter plot of beam deflection for the optimal wavelength at each temperature, displaced in the vertical direction for enhanced visibility. Plots at 150 K, 230 K and 300 K are scaled by 3, 5 and 8, respectively. Beam deflection is still observable at 230 K, and some deflection is even observed at room temperature (300 K). FIGS. 8 E-F are the same as FIGS. 8C-D, but after subtracting the background. The beam deflection range decreases more slowly with increasing temperature after background subtraction, indicating that operation at higher temperatures could be improved by reducing the background reflections.

Referring to FIG. 9, the polarization dependence of beam steering performance is illustrated. In FIGS. 9A-D, the gate dependence of total integrated reflection ($\lambda_0 = 755$ nm) is shown, normalized to that obtained in the highly doped regime ($V_{TG} = 1.4$ V, $V_{BG} = 10$ V), for polarization angles 0°

Figure 9A:
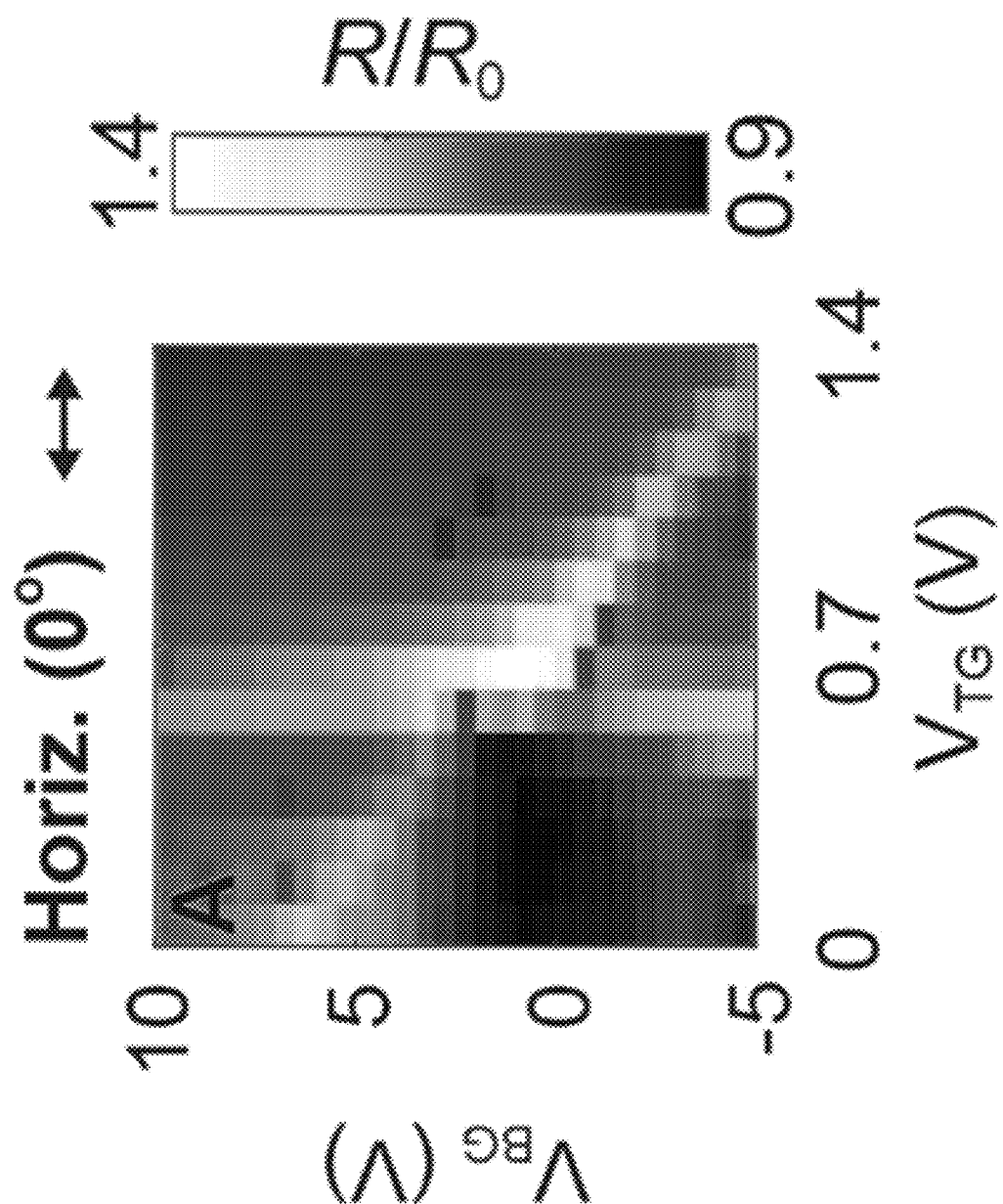
FIGS. 9A-D are heatmaps of total integrated reflection according to voltage in an exemplary embodiment of the present disclosure.
Figure 9B:
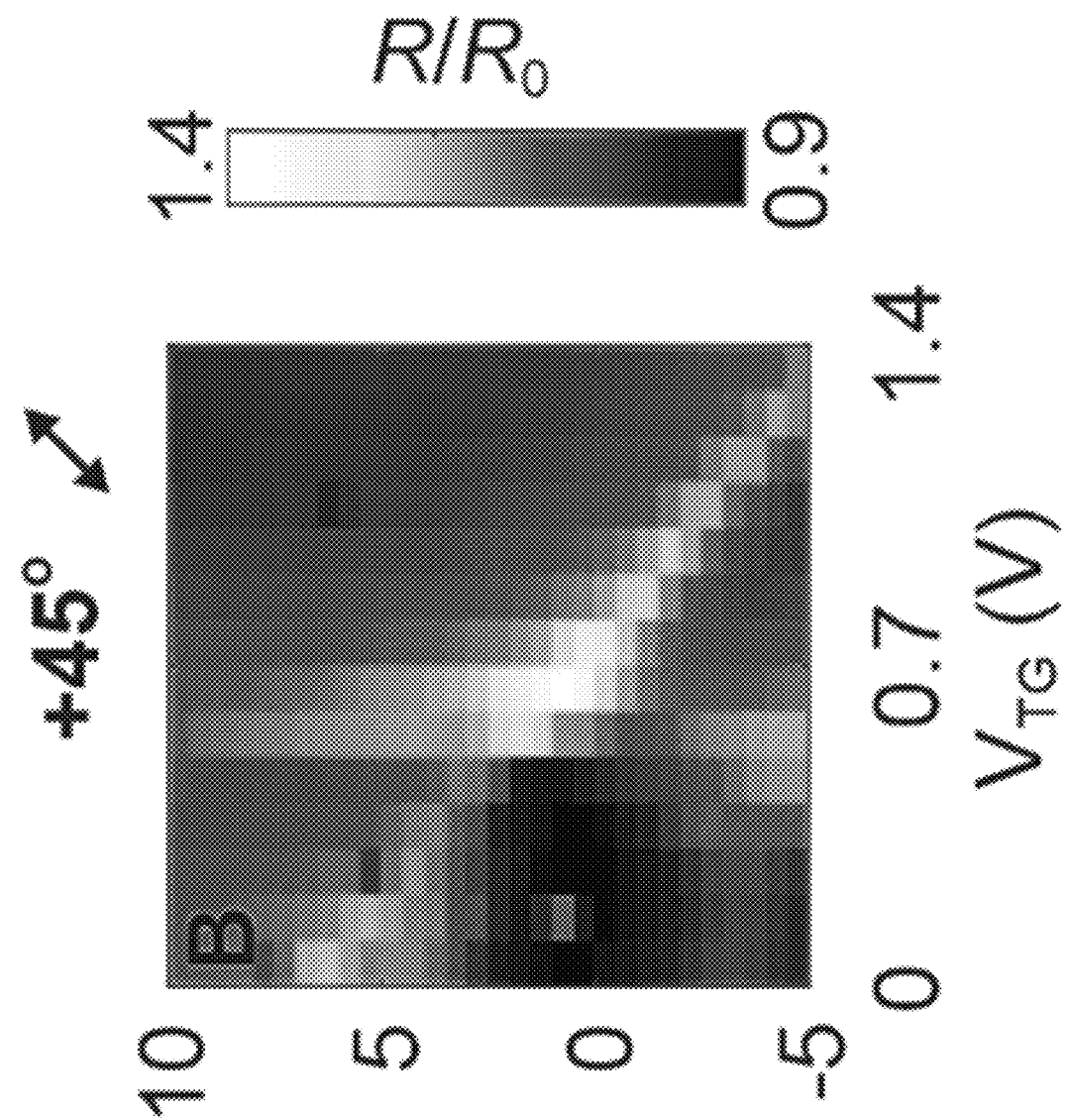
Figure 9C:
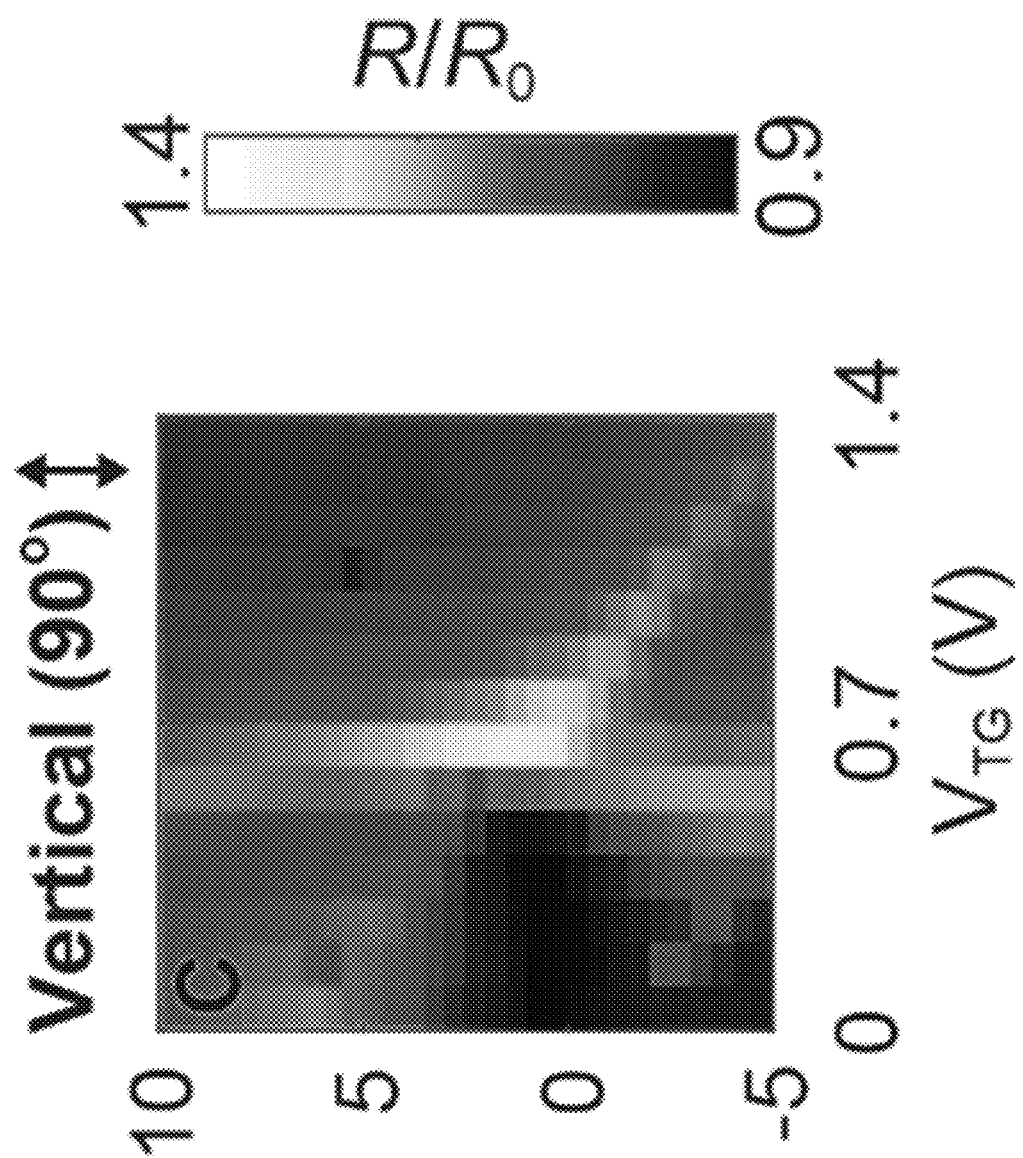
Figure 9D:
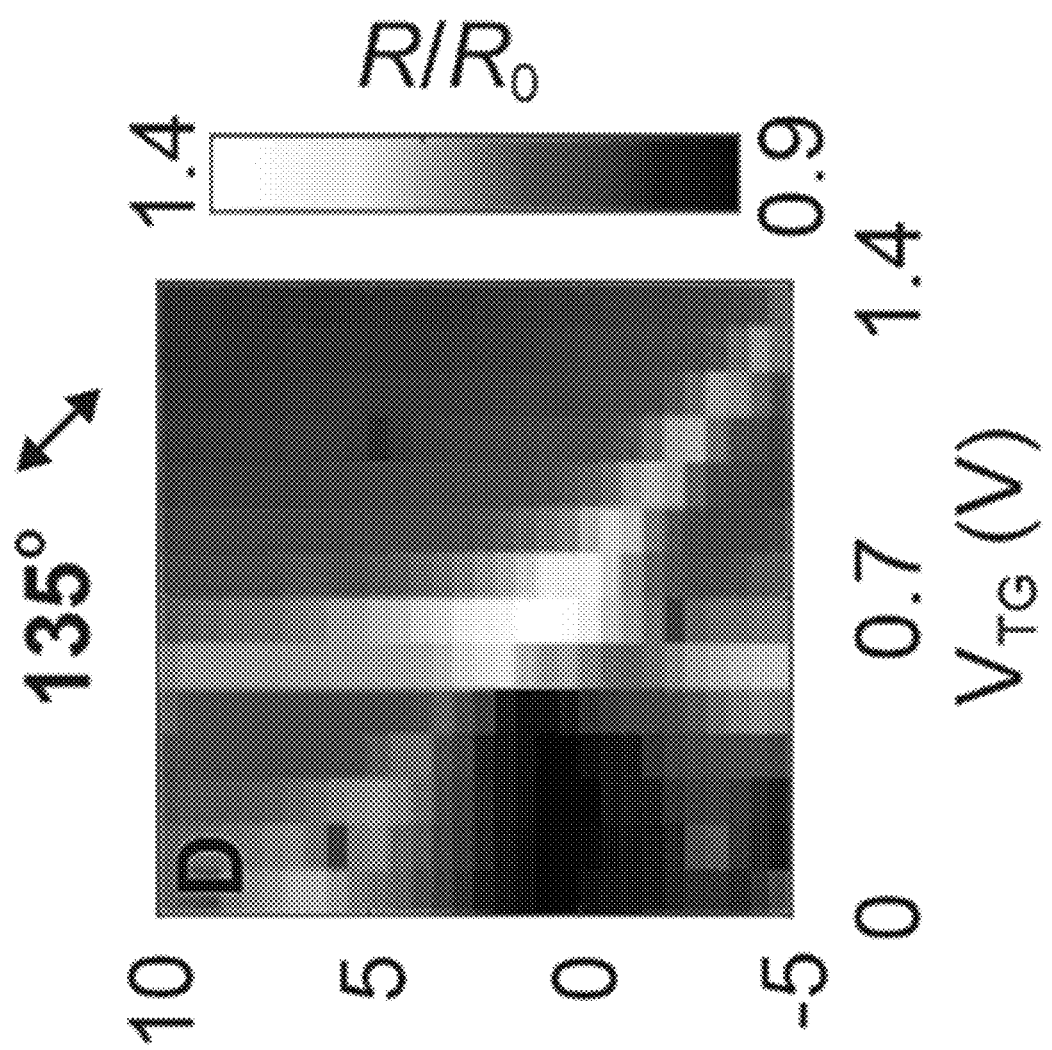
Figure 9E:
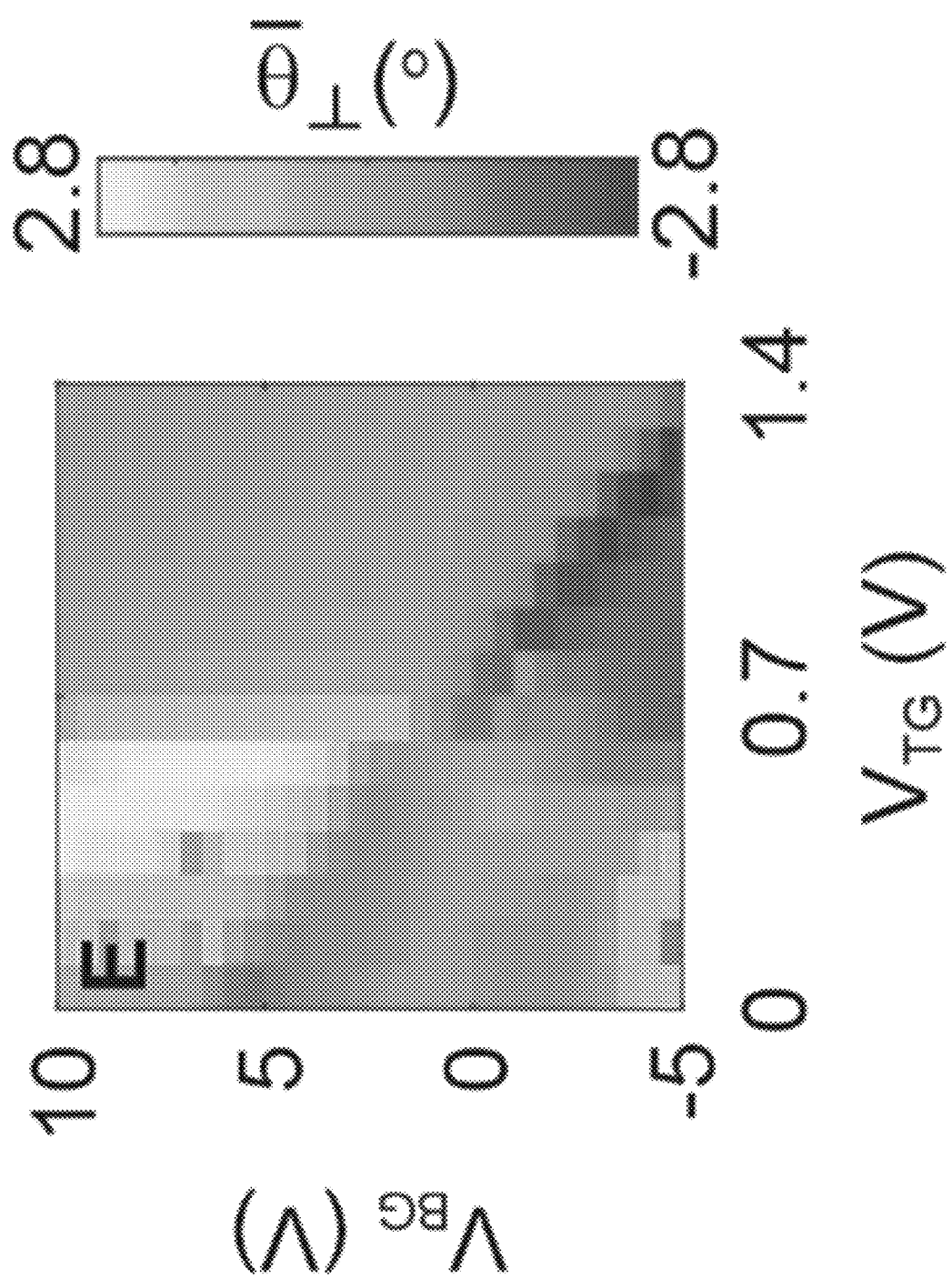
FIGS. 9E-H are heatmaps of beam deflection according to voltage in an exemplary embodiment of the present disclosure.
Figure 9F:
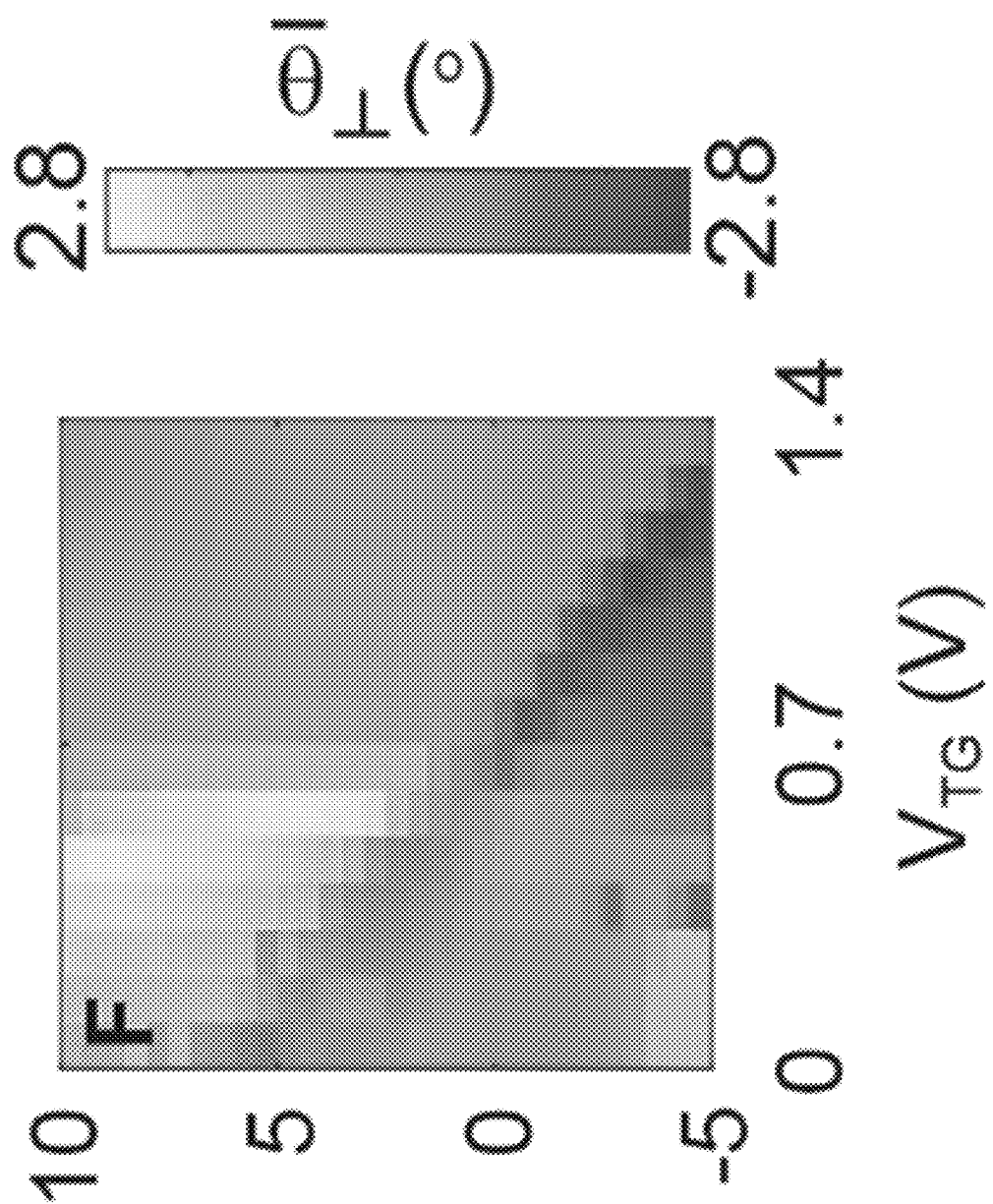
Figure 9G:
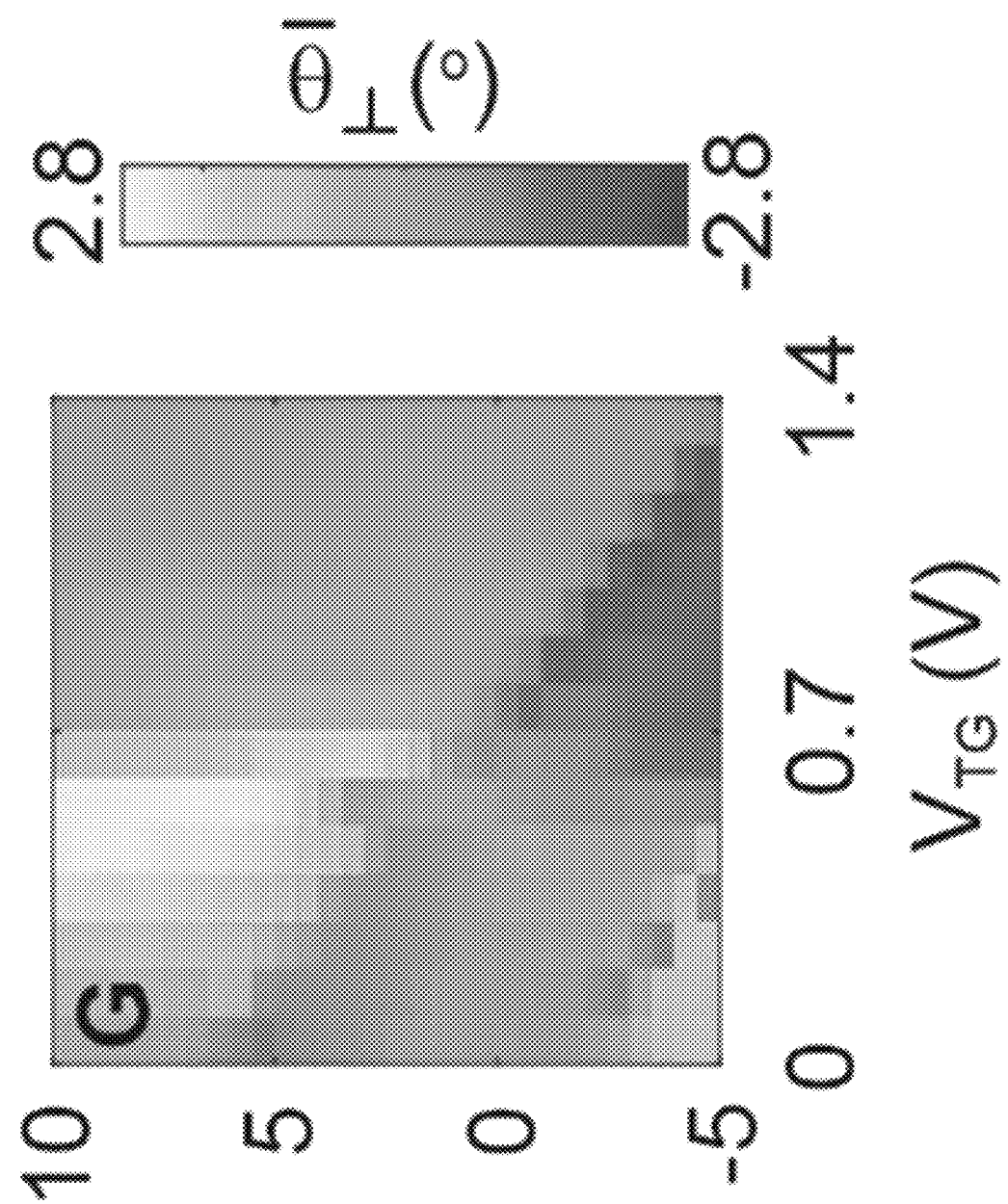
Figure 9H:
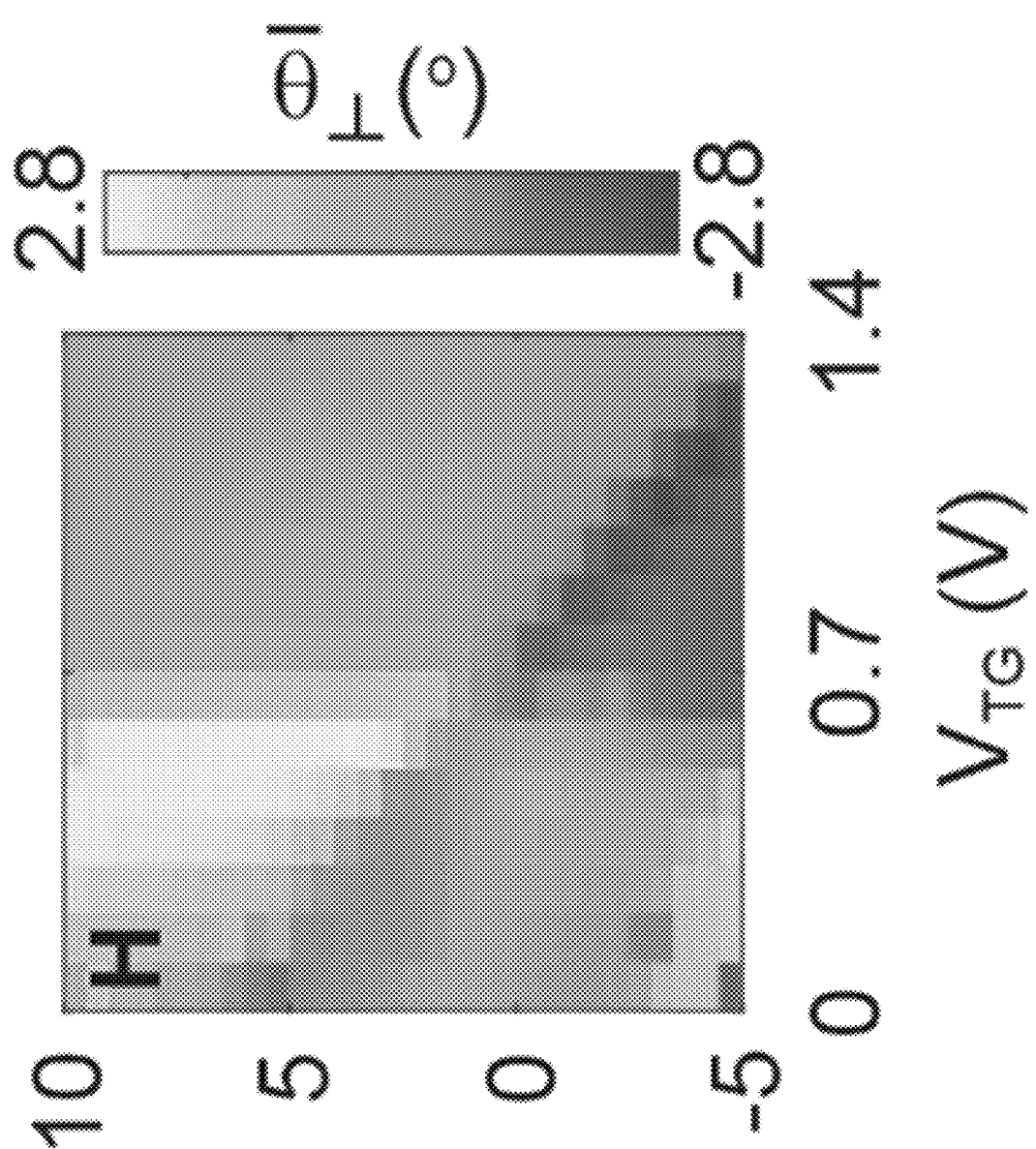
Figure 9I:
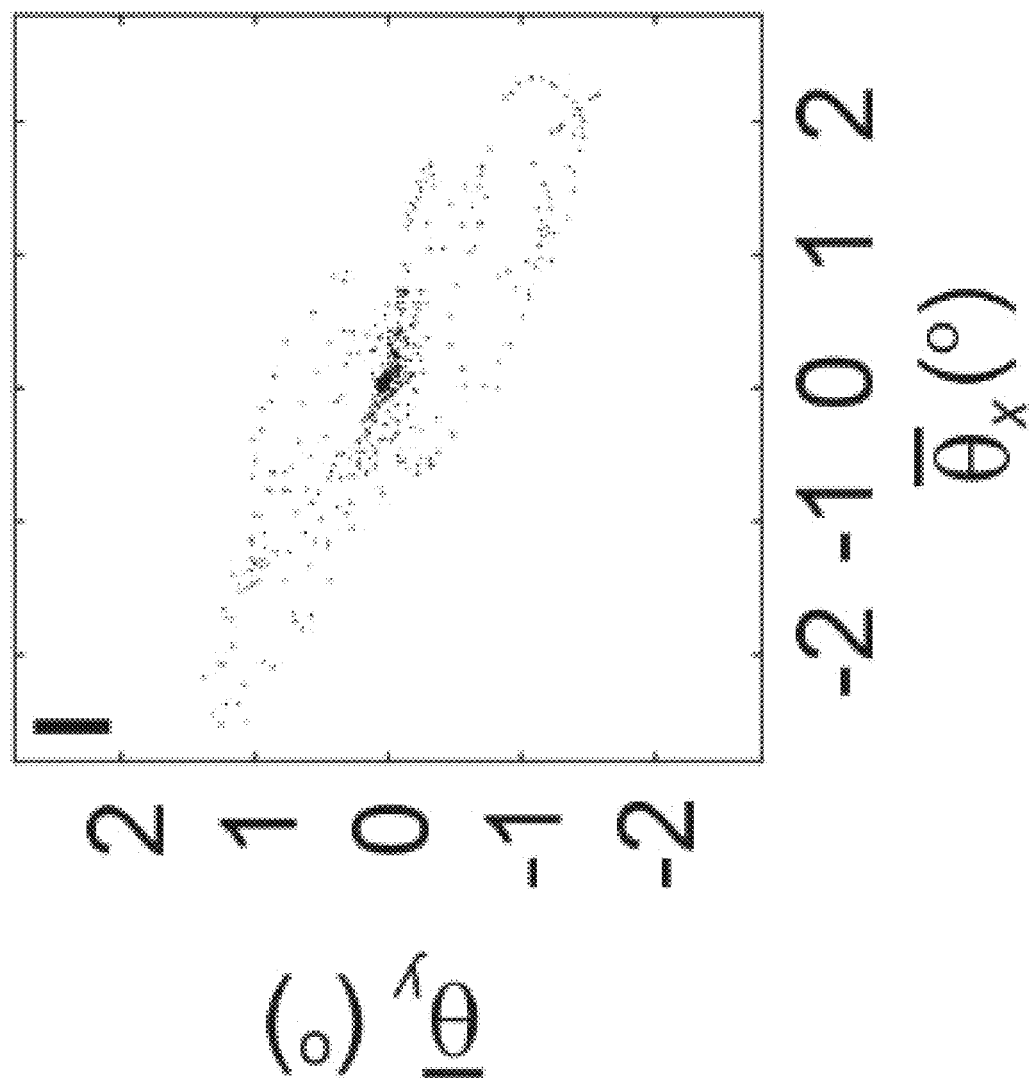
FIGS. 9I-L are scatterplots of beam deflection according to voltage in an exemplary embodiment of the present disclosure.
Figure 9J:
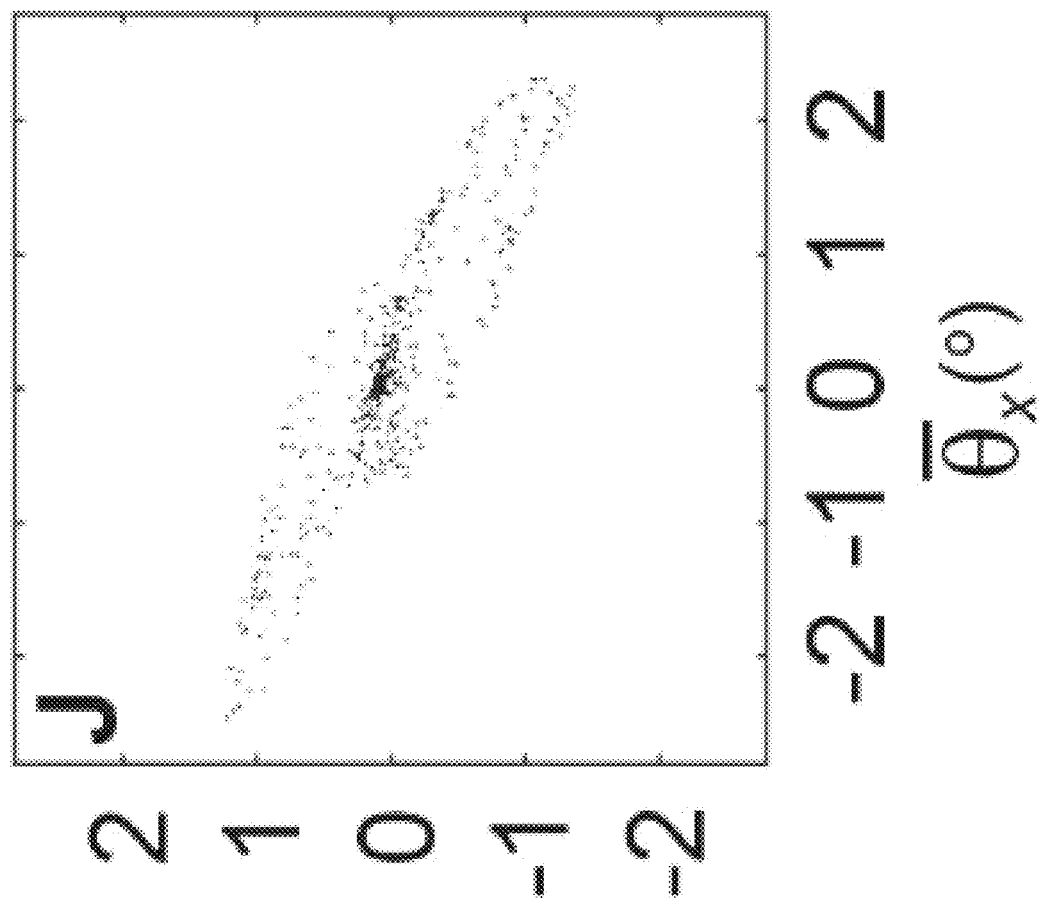
Figure 9K:
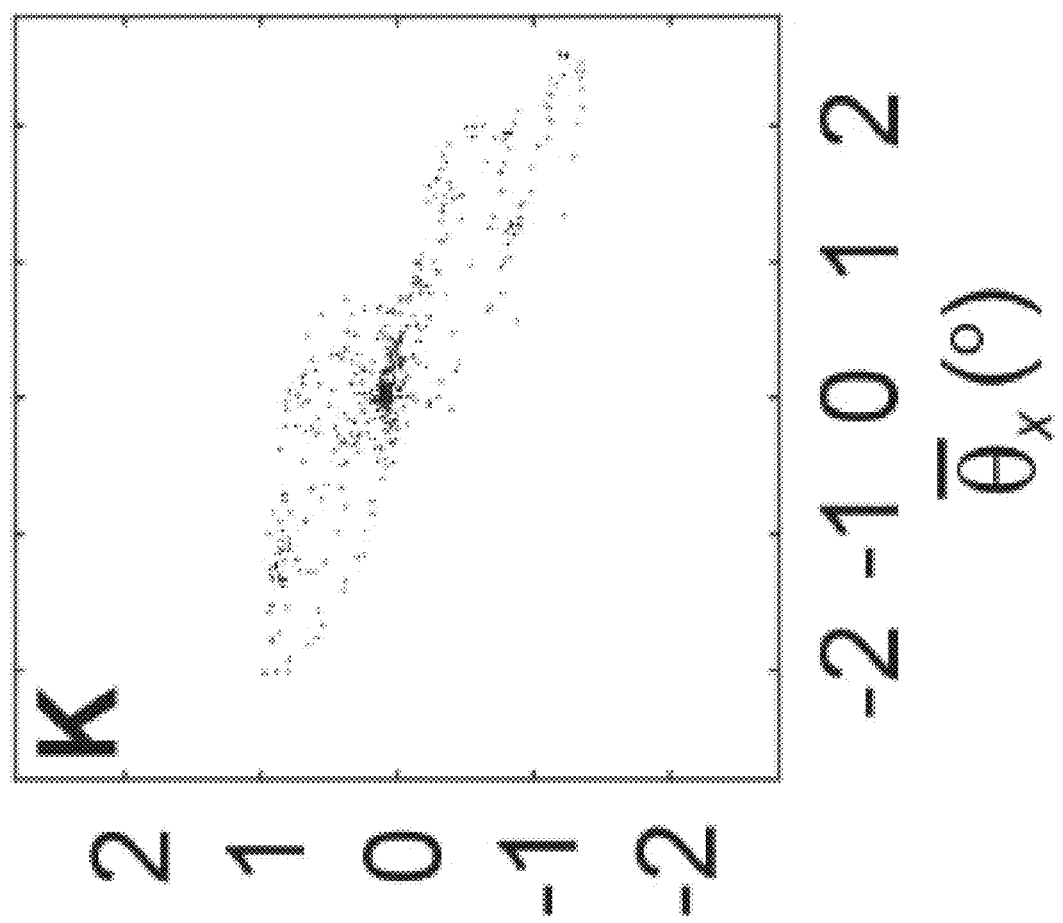
Figure 9L:
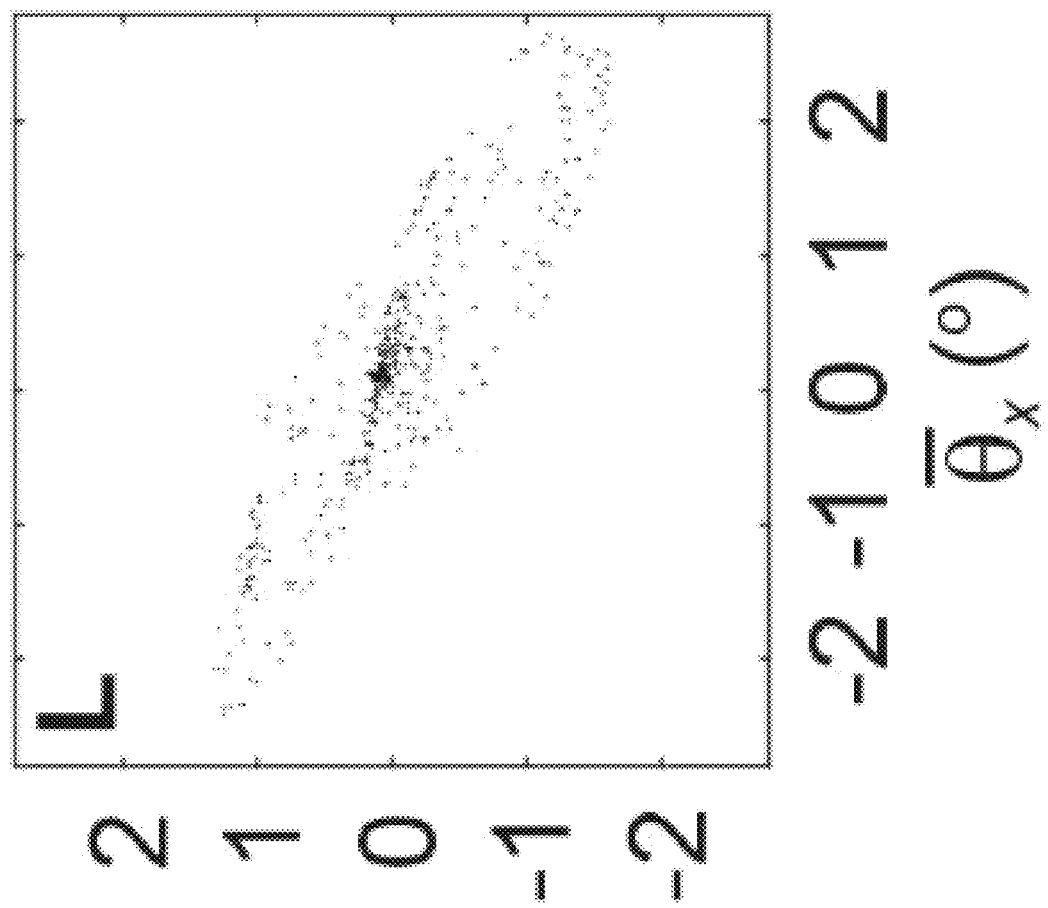

(FIG. 9A), 45° (FIG. 9B), 90° (FIG. 9C) and 135° (FIG. 9D). FIGS. 9E-H show the gate dependence of beam deflection perpendicular to gate edge, and FIGS. 9I-L show scatter plots of deflections for all gate combinations, for the same linear polarization angles as in FIGS. 9A-D. No systematic polarization dependence of the reflection amplitude, deflection range or deflection direction is observed.

Figure 10A:
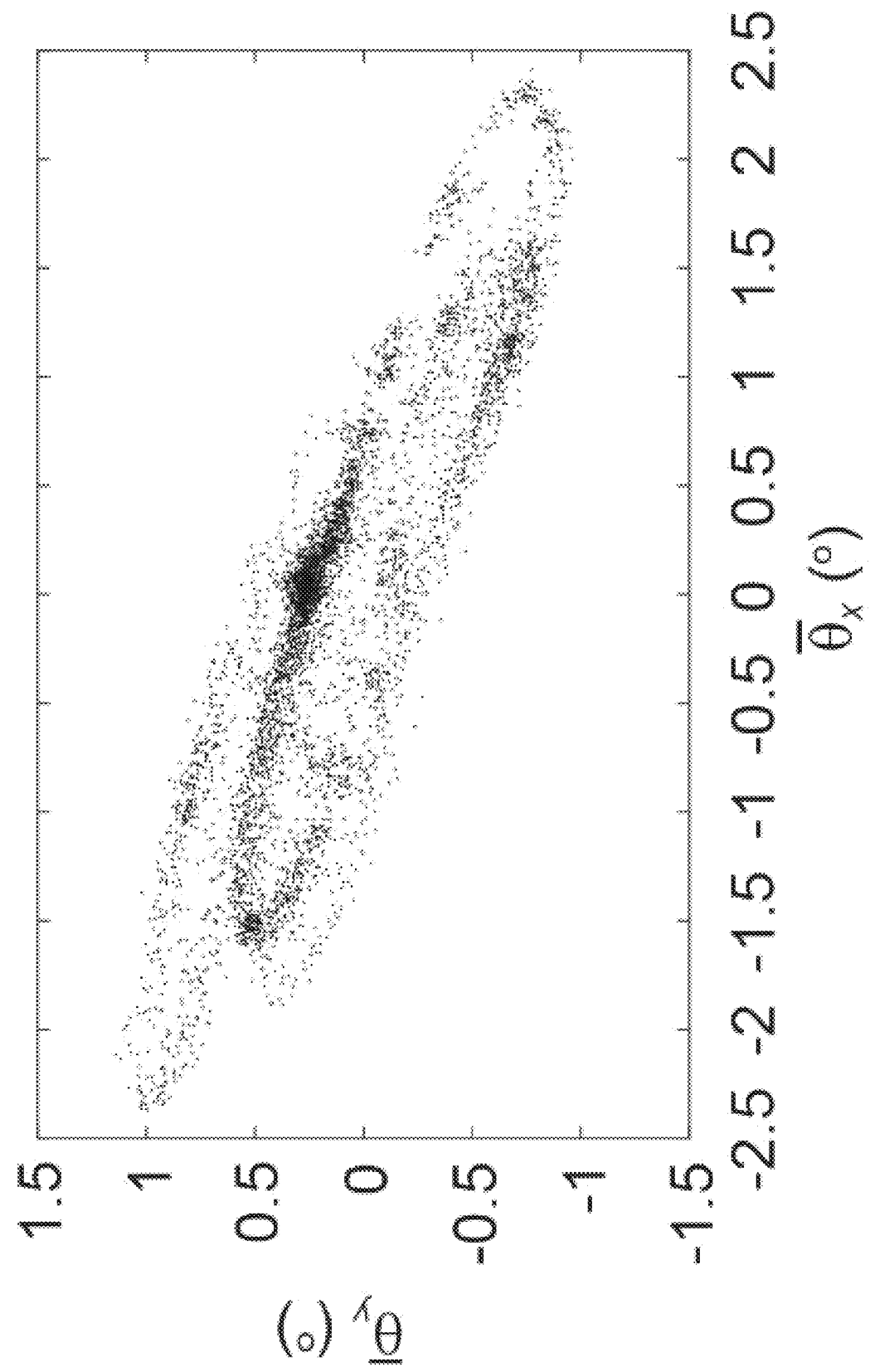
FIGS. 10A-B are scatter plot of center-of-mass deflection in an exemplary embodiment of the present disclosure.
Figure 10B:
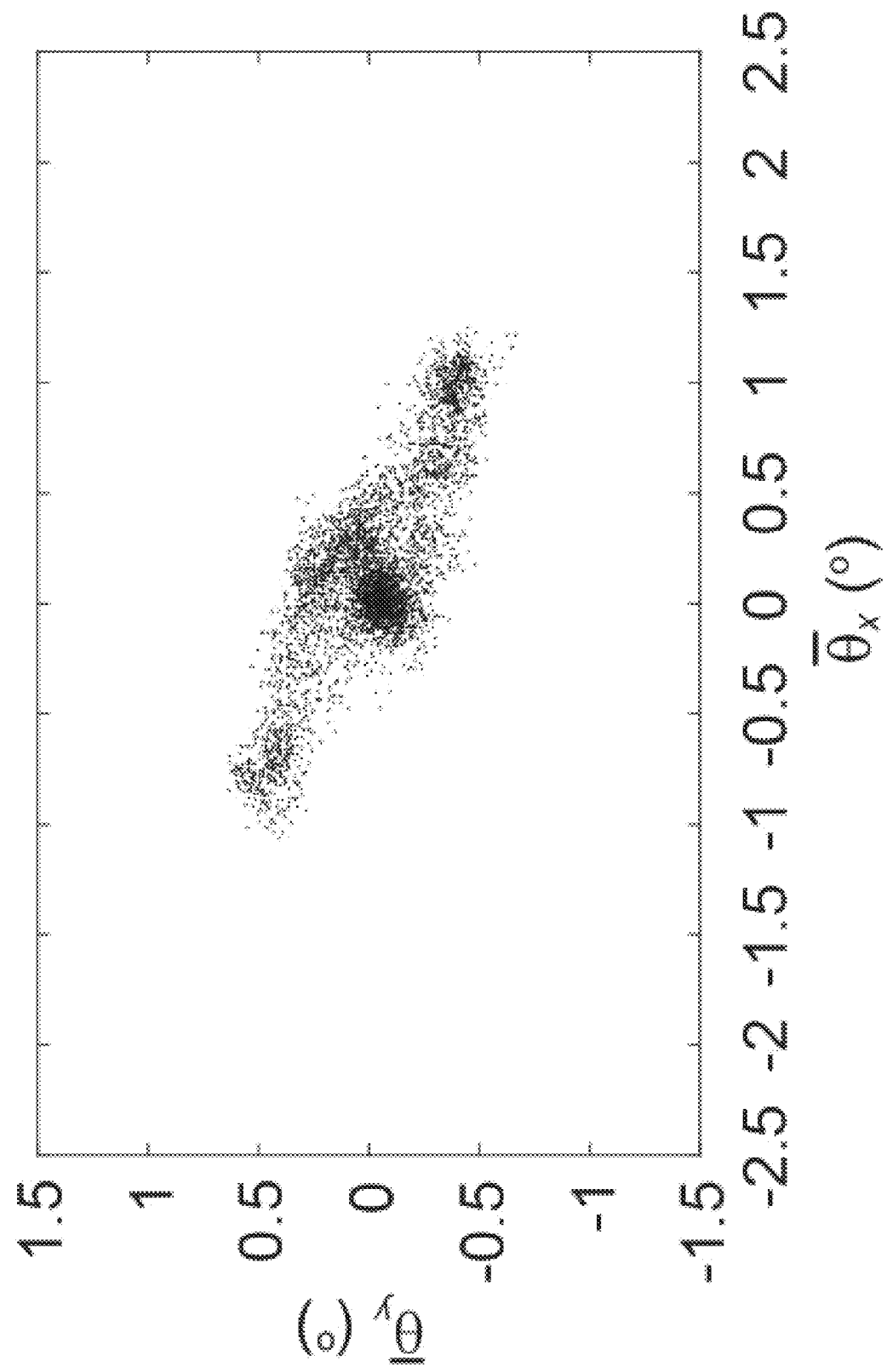
Figure 11A:
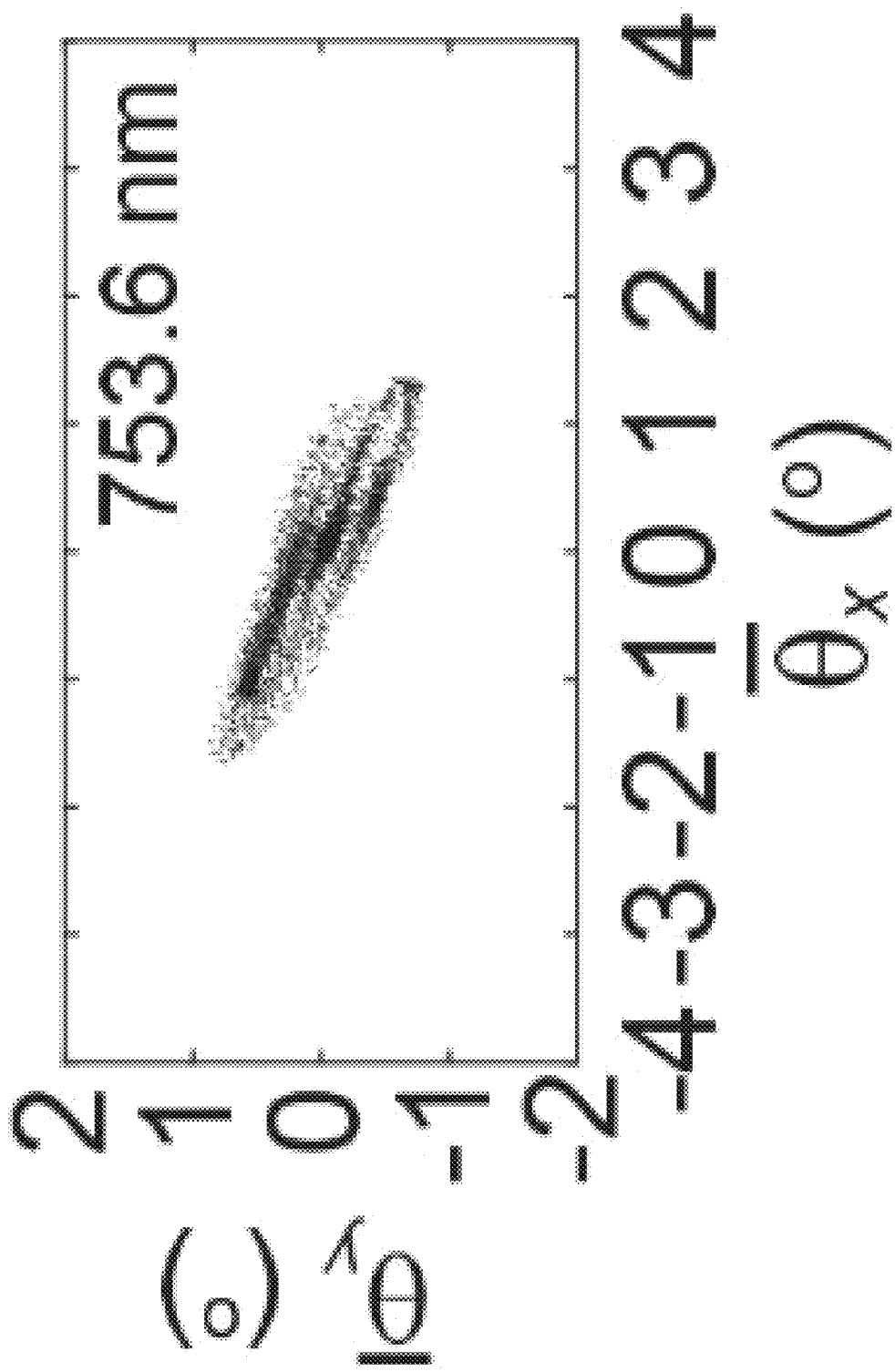
FIGS. 11A-D are scatter plots of center-of-mass deflection in an exemplary embodiment of the present disclosure.
Figure 11B:
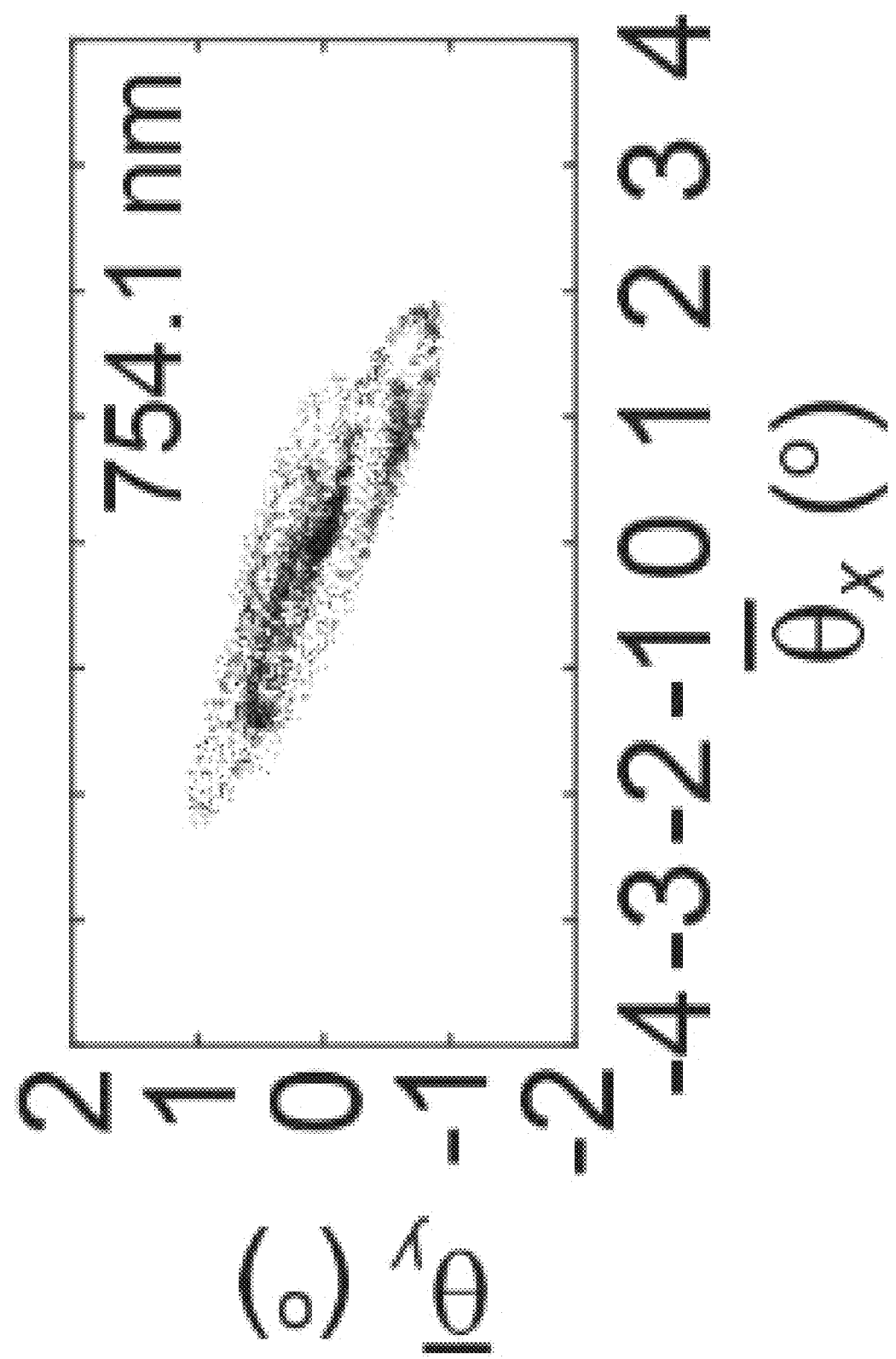
Figure 11C:
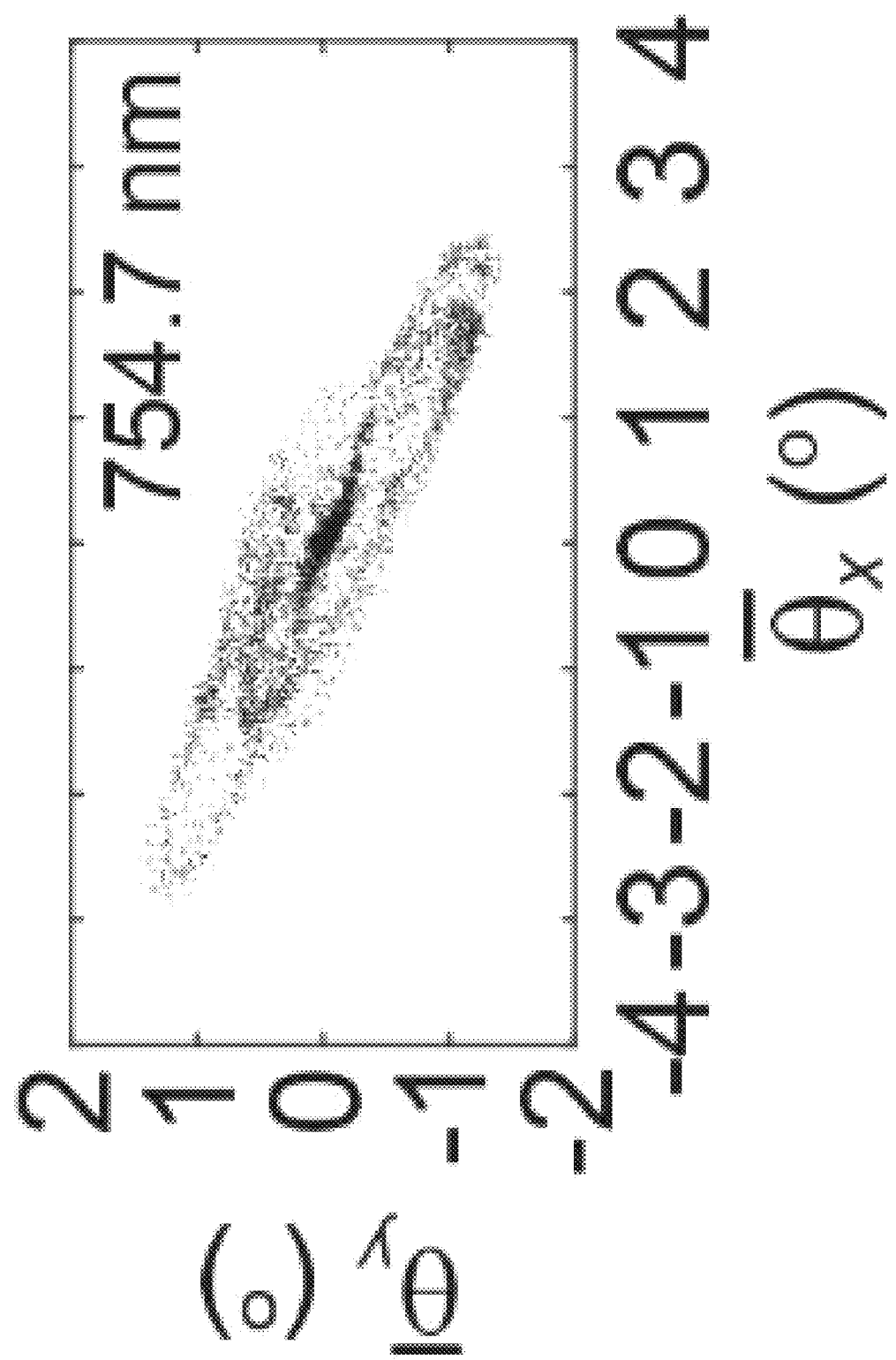
Figure 11D:
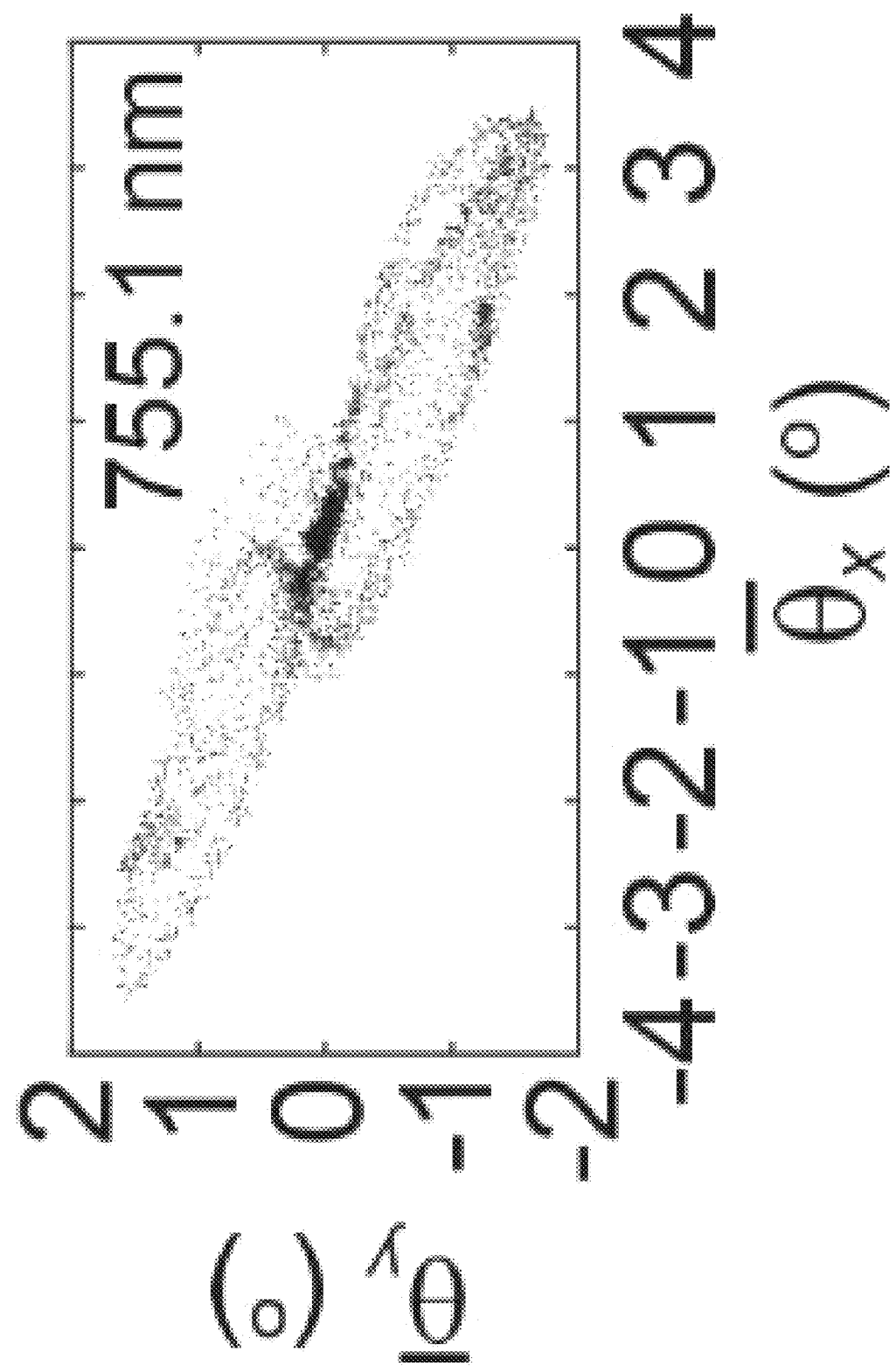

Referring to FIG. 10, spot size dependence is illustrated. FIGS. 10A-B are scatter plot of center-of-mass deflection ($\lambda_0$=754.5 nm) for the near-diffraction limited spot size used above (FIG. 10A), and a ~2.5 times larger spot size (FIG. 10B). The deflection range is found to be approximately a factor of 2 smaller for the larger beam spot (FIG. 10B), in good agreement with the predictions provided above.

Referring to FIG. 11, beam steering at other wavelengths is illustrated. FIGS. 11A-D are scatter plots of center-of-mass deflection ($\bar{\theta}_x$, $\bar{\theta}_y$) for the same set of gate voltages as above at $\lambda_0$=753.6 nm (FIG. 11A), $\lambda_0$=754.1 nm (FIG. 11B), $\lambda_0$=754.7 nm (FIG. 11C) and $\lambda_0$=755.1 nm (FIG. 11D). The deflection range is smaller at longer wavelengths, because the required large blue-shift is accompanied by a reduction in exciton reflection amplitude.

Figure 12A:
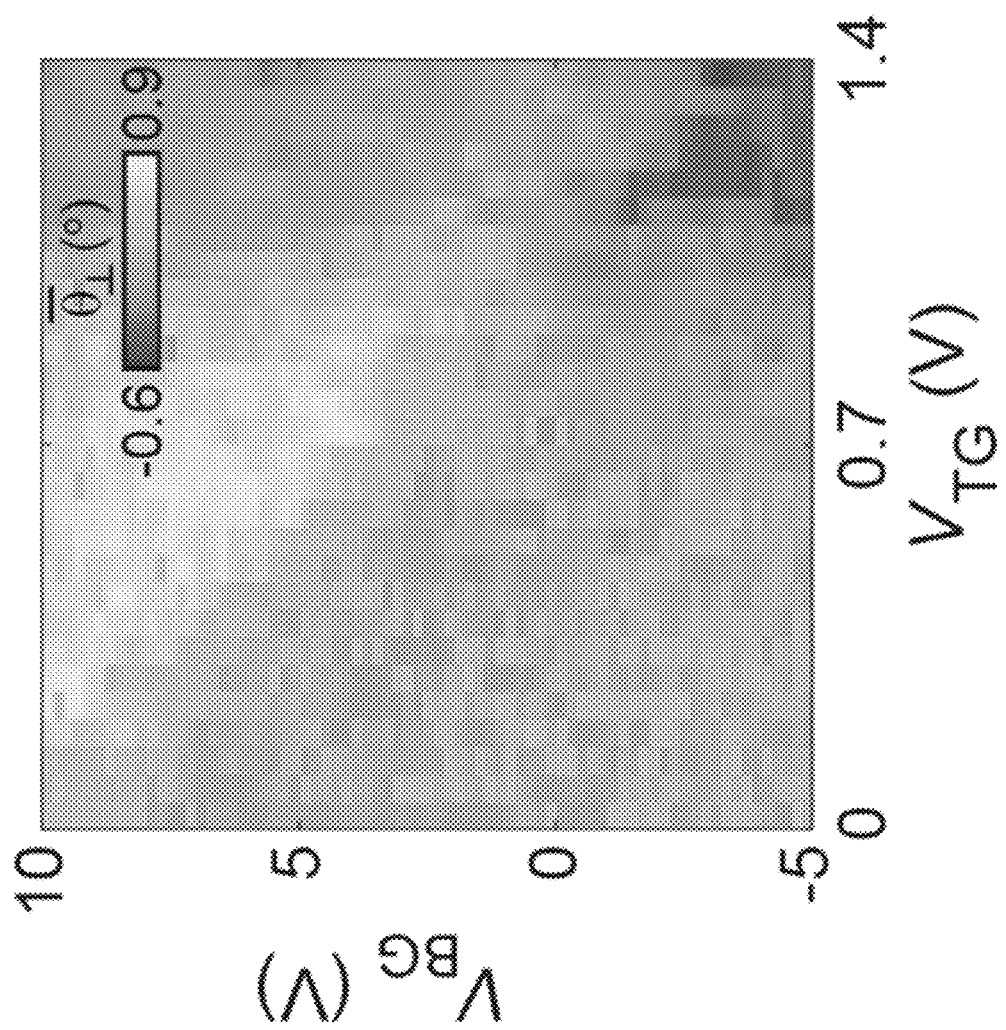
FIG. 12A is a heatmap of beam deflection according to voltage in an exemplary embodiment of the present disclosure.
Figure 12B:
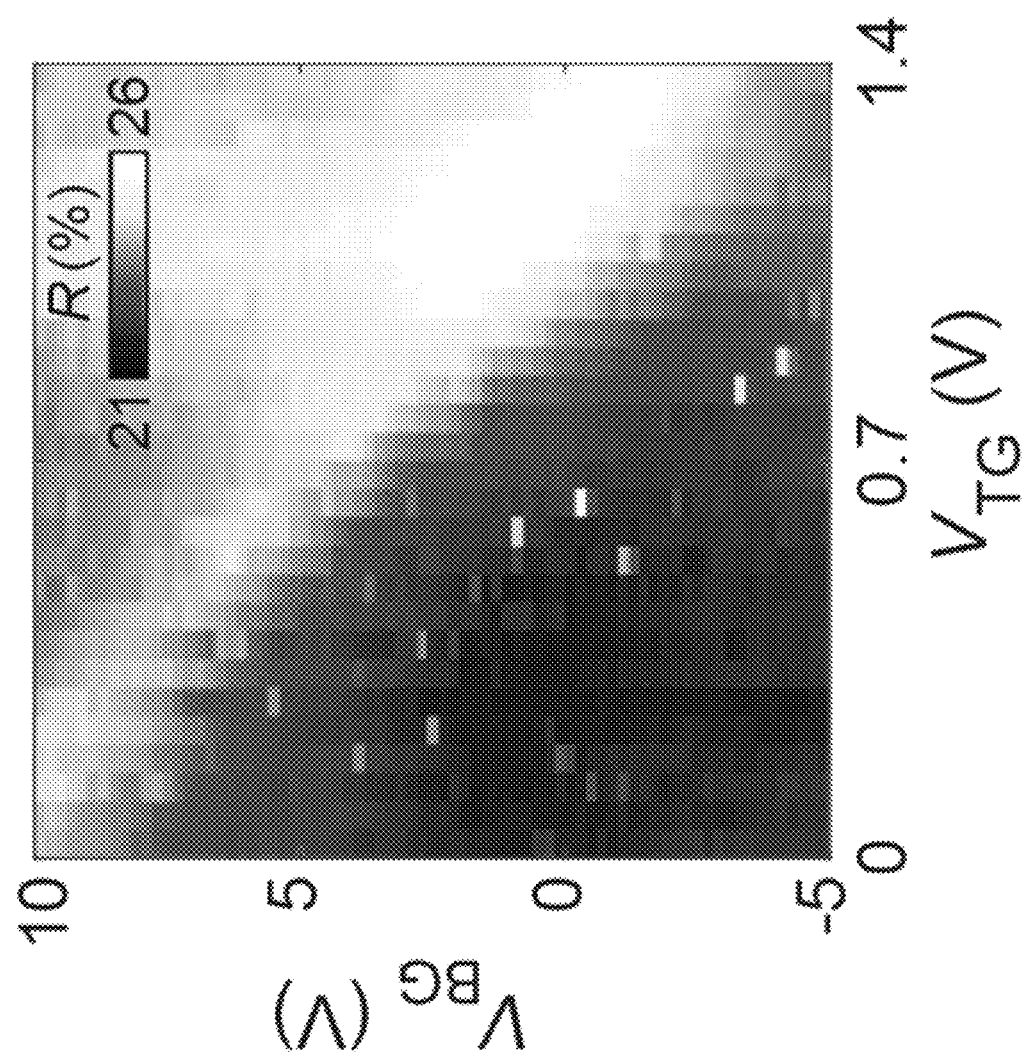
FIG. 12B is a heatmap of reflection according to voltage in an exemplary embodiment of the present disclosure.
Figure 13A:
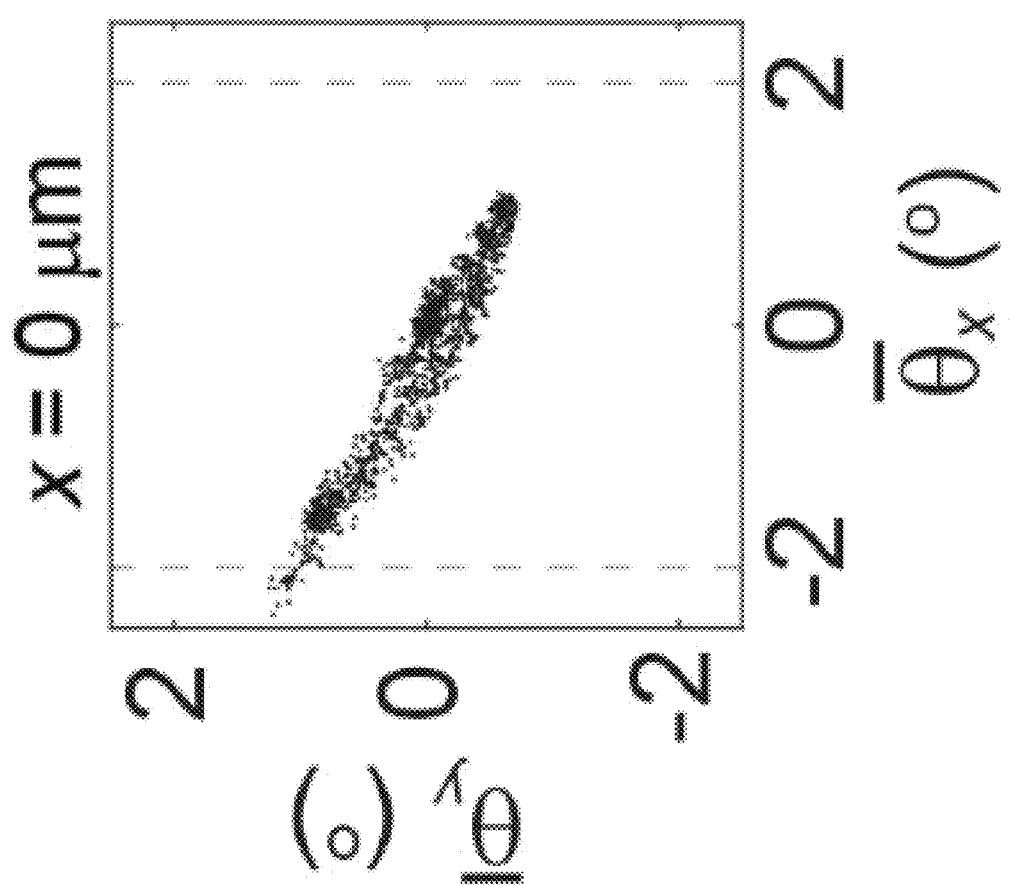
FIGS. 13A-D are scatter plot of center-of-mass deflection in an exemplary embodiment of the present disclosure.
Figure 13B:
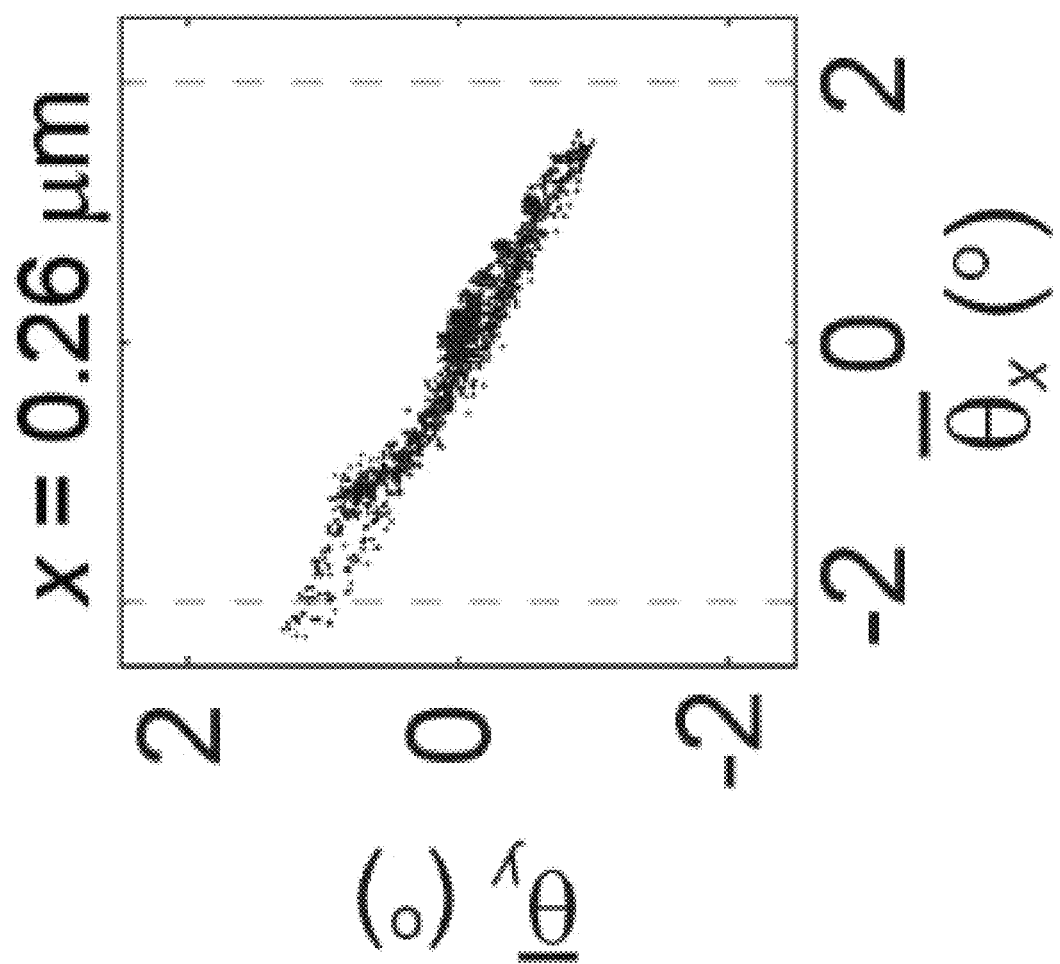
Figure 13C:
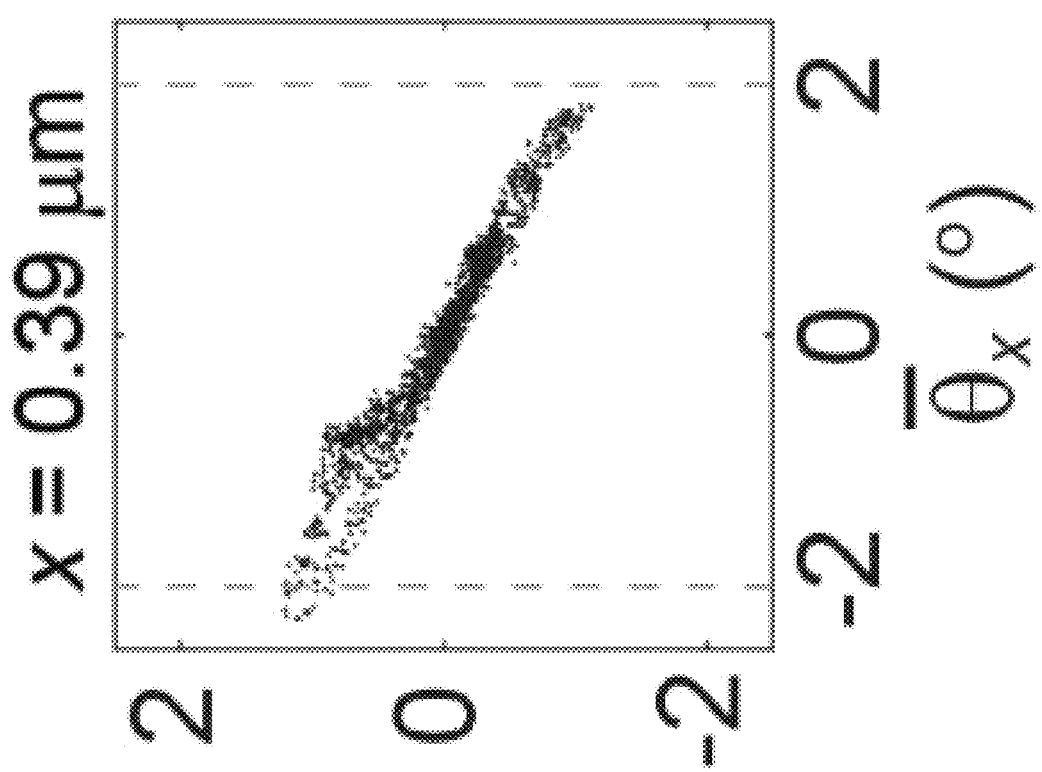
Figure 13D:
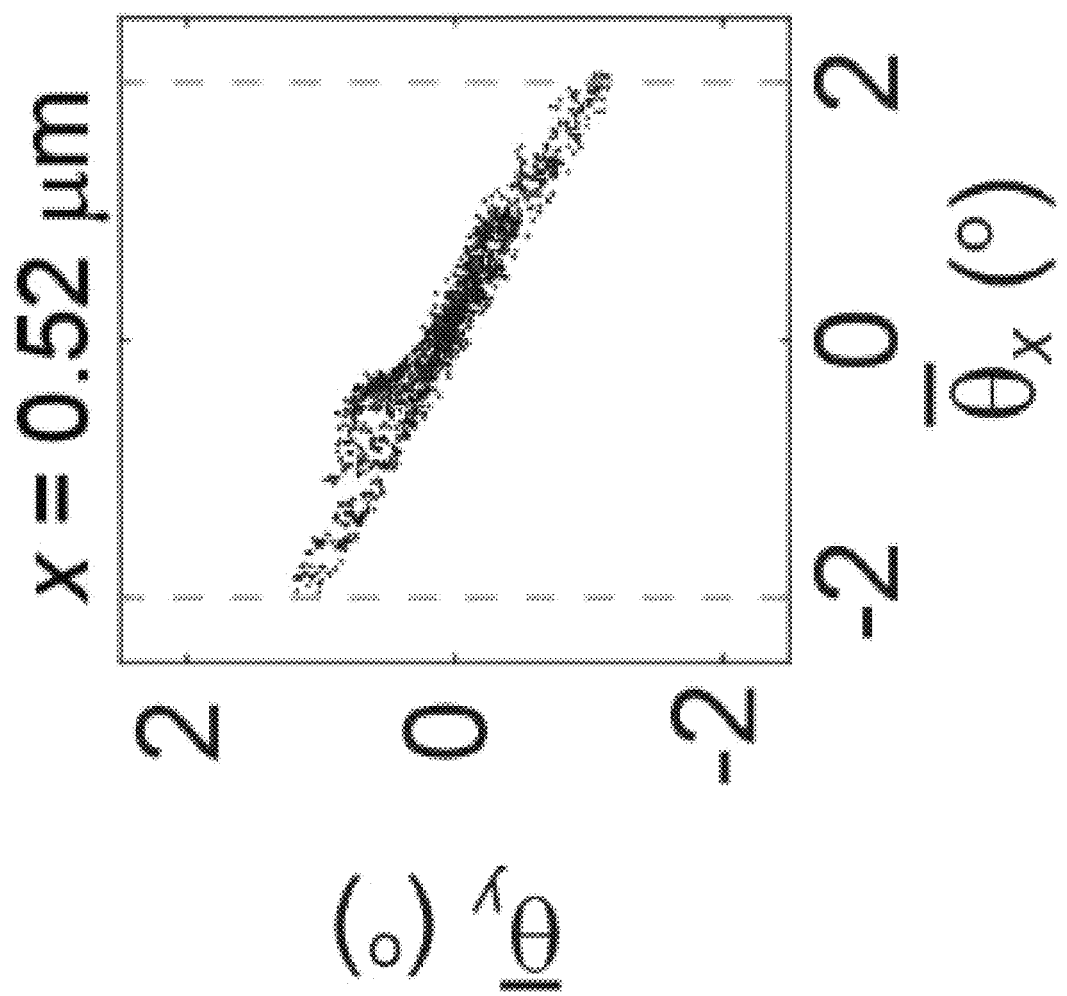
Figure 13E:
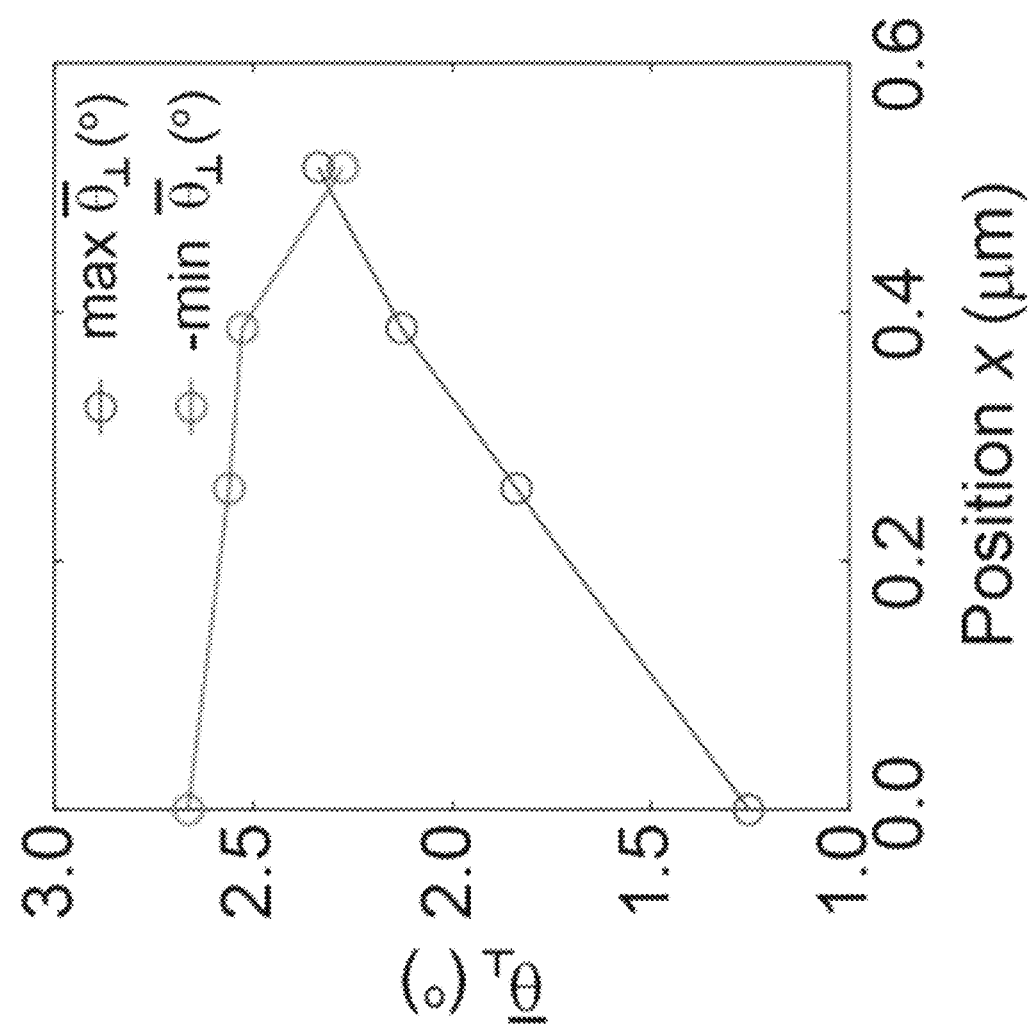
FIGS. 13E-F are graphs of beam deflection by position in an exemplary embodiment of the present disclosure.
Figure 13F:
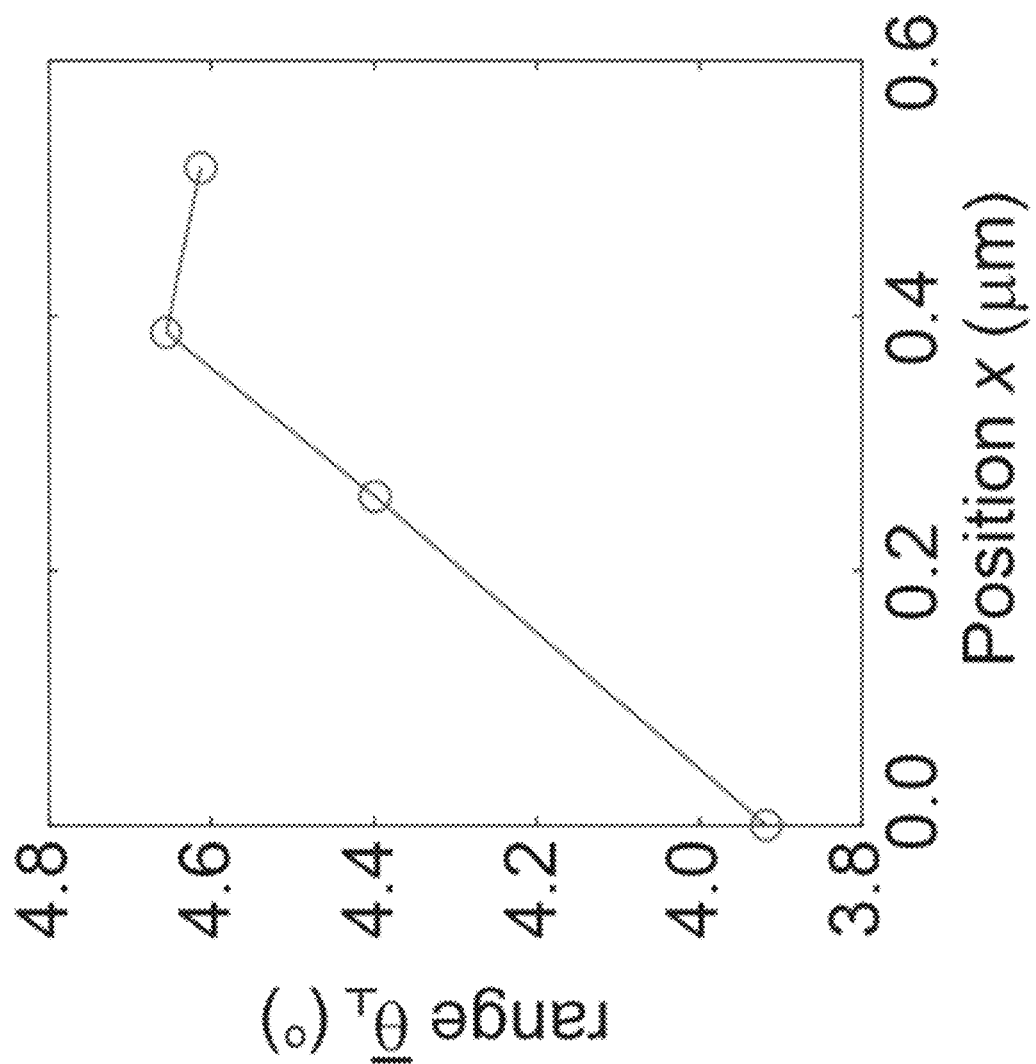

Referring to FIG. 12, beam steering at $\lambda_0$=752 nm is illustrated. FIG. 12A-B show gate voltage dependence of deflection perpendicular to gate edge (FIG. 12A) and integrated reflection (FIG. 12B). At this short wavelength, larger voltages are required to blue-shift the exciton resonance through $\lambda_0$, compared to wavelengths closer to the intrinsic exciton resonance.

Referring to FIG. 13, an example of gate edge localization is provided. FIGS. 13A-D are scatter plot of center-of-mass deflection ($\bar{\theta}_x$, $\bar{\theta}_y$) for the same set of gate voltages as above in four different positions along a line crossing the gate edge ($\lambda_0$=758.4 nm, T=80 K). (x=0 is arbitrarily defined). FIGS. 13E-F show position dependence of the extrema (FIG. 13E) and range (FIG. 13F) of the beam deflection perpendicular to the gate edge. The contributions from the two sides vary across the gate edge, and are balanced by making the deflection range as large and symmetric as possible (around x=0.4 µm).

Figure 14A:
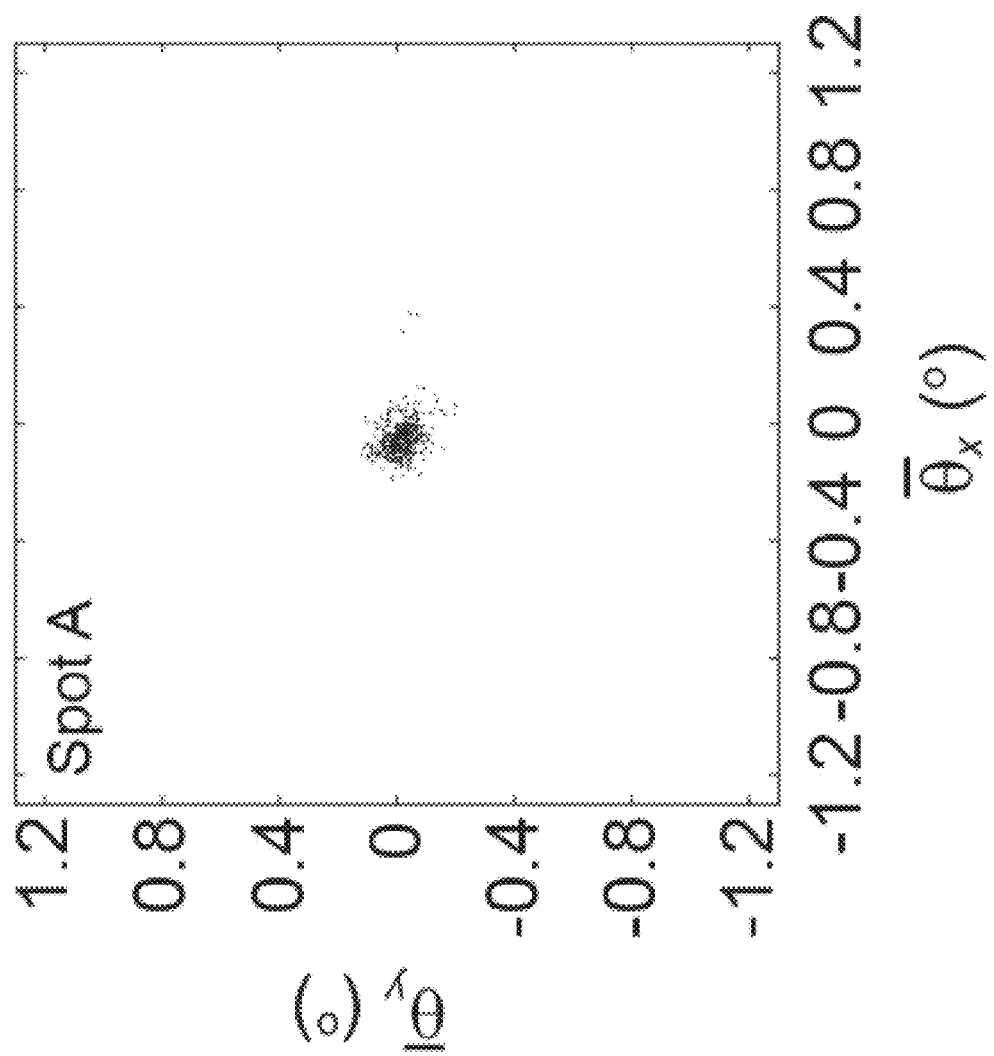
FIGS. 14A-C are scatter plots of center-of-mass deflection in an exemplary embodiment of the present disclosure.
Figure 14B:
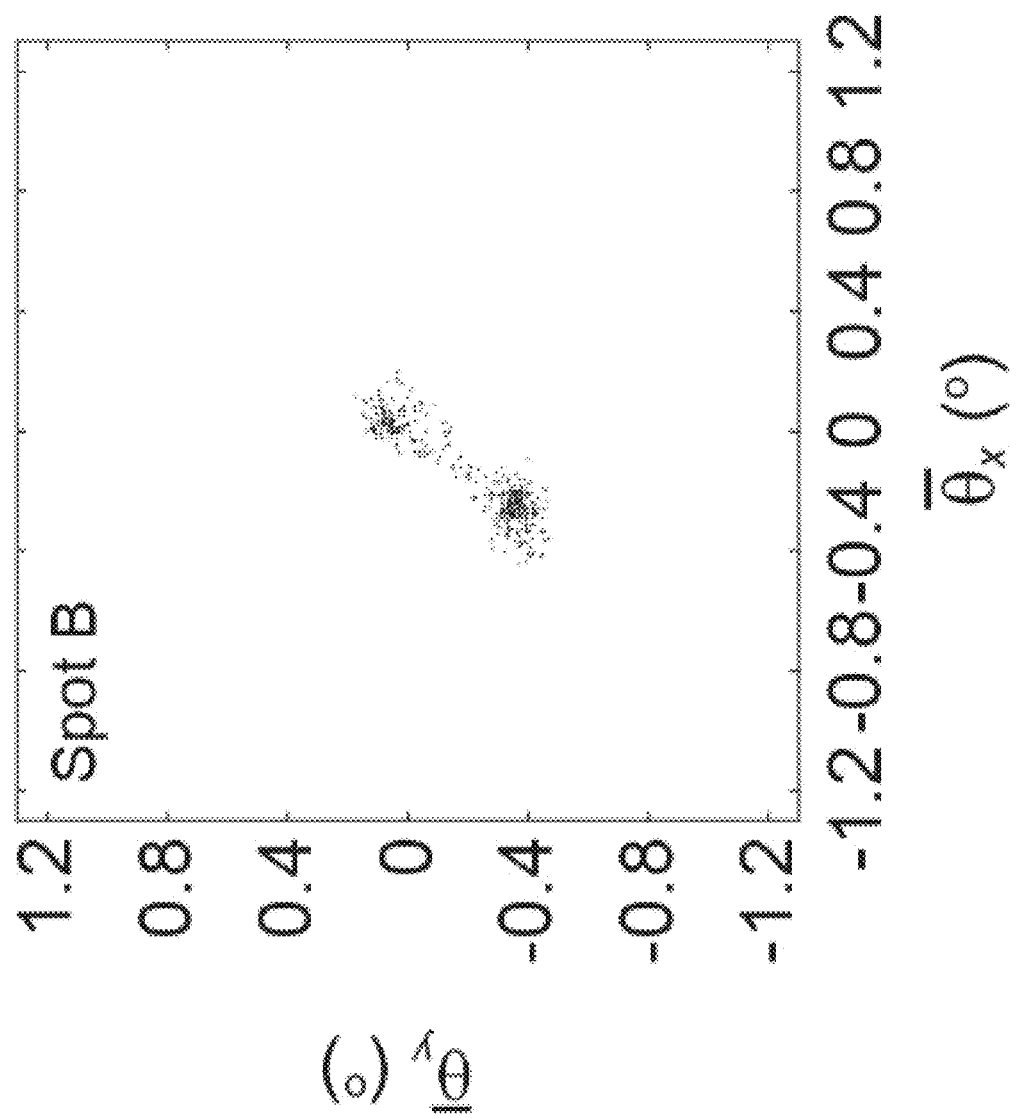
Figure 14C:
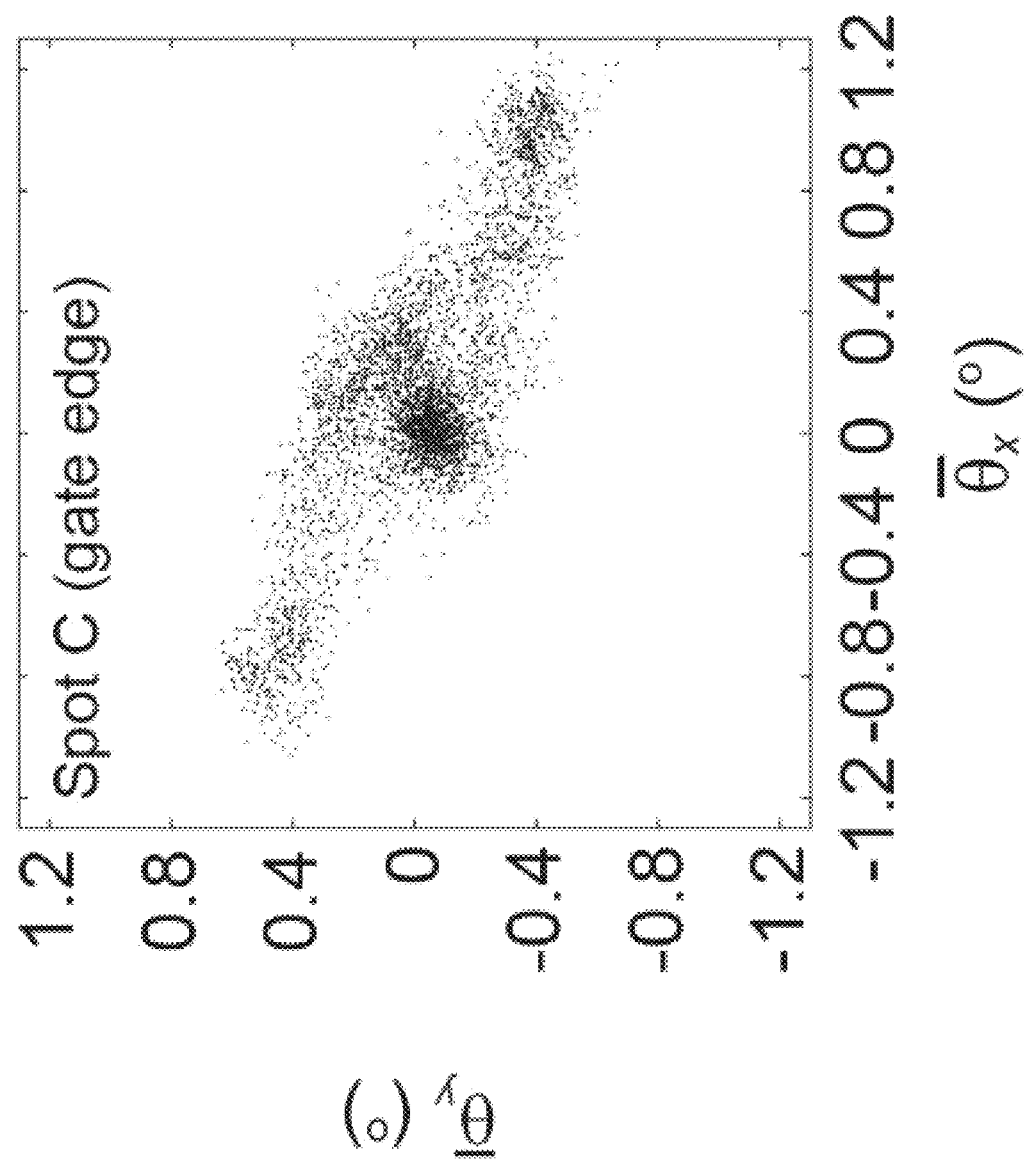

Referring to FIG. 14, deflection behavior away from gate edge is illustrated. FIGS. 14A-B are scatter plots of center-of-mass deflection ($\lambda_0$=754.5 nm) in two spots that are 2 µm to the left and right of the gate edge, respectively. All doping regimes are covered by sweeping the full range of the (global) top gate (0 V<$V_{TG}$<1.4 V). The deflection is found to be very small far away from the gate edge, with only small deviations in arbitrary directions (example shown in FIG. 14B), likely caused by inhomogeneity. Inhomogeneity is likely the cause of the non-zero width of the deflection path at the gate edge. FIG. 14C is a scatter plot of center-of-mass deflection ($\lambda_0$=754.5 nm) with the beam spot centered at the gate edge, for the same set of gate voltages as in the main text.

Figure 15:
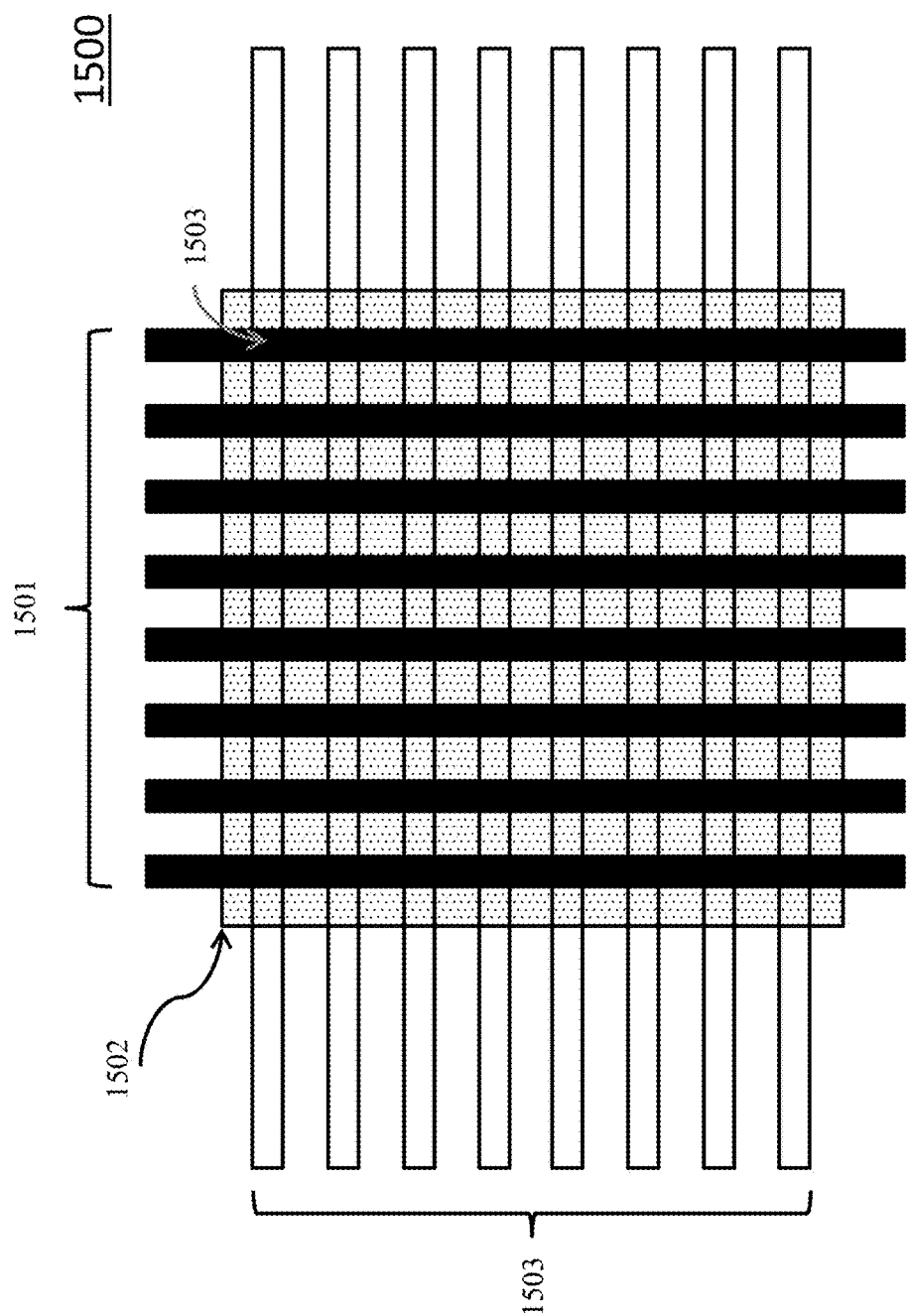
FIG. 15 is a schematic view of a crossbar array according to embodiments of the present disclosure.

Referring to FIG. 15, an exemplary crossbar array 1500 for beam steering is illustrated. In this example, a first plurality of electrodes 1501 is disposed on one side of a semiconductor layer 1502. A second plurality of electrodes 1503 is disposed on the other side of semiconductor layer 1503. An insulating layers are disposed between the electrodes and the semiconductor layer. In this way, a similar cross-section is provided to that described in further detail with regard to FIG. 1B. Voltage may be applied to the first plurality of electrodes, and different voltage may be applied to the second plurality of electrodes separately from the first plurality of electrodes. In some embodiments, the voltage applied to individual electrodes may be controlled, for example, individually, while in some embodiments groups of electrodes are controlled together. As such, multiple different voltages can be applied to different electrodes. At each junction 1503 between electrodes, multiple regions of the semiconductor layer are formed, each of which is in one of four configurations: covered by both electrodes; covered by one electrode from group 1501; covered by one electrode from group 1502, or covered by no electrodes. Accordingly, by varying the voltage in the electrodes, an electric field may be selectively applied to neighboring regions in the semiconductor layer, enabling beam forming as set forth above (particularly with regard to FIGS. 1A-B and 3A). It will be appreciated that the grid depicted in FIG. 15 is merely exemplary, and a variety of other electrode patterns may be employed as set forth herein.

Figure 16:
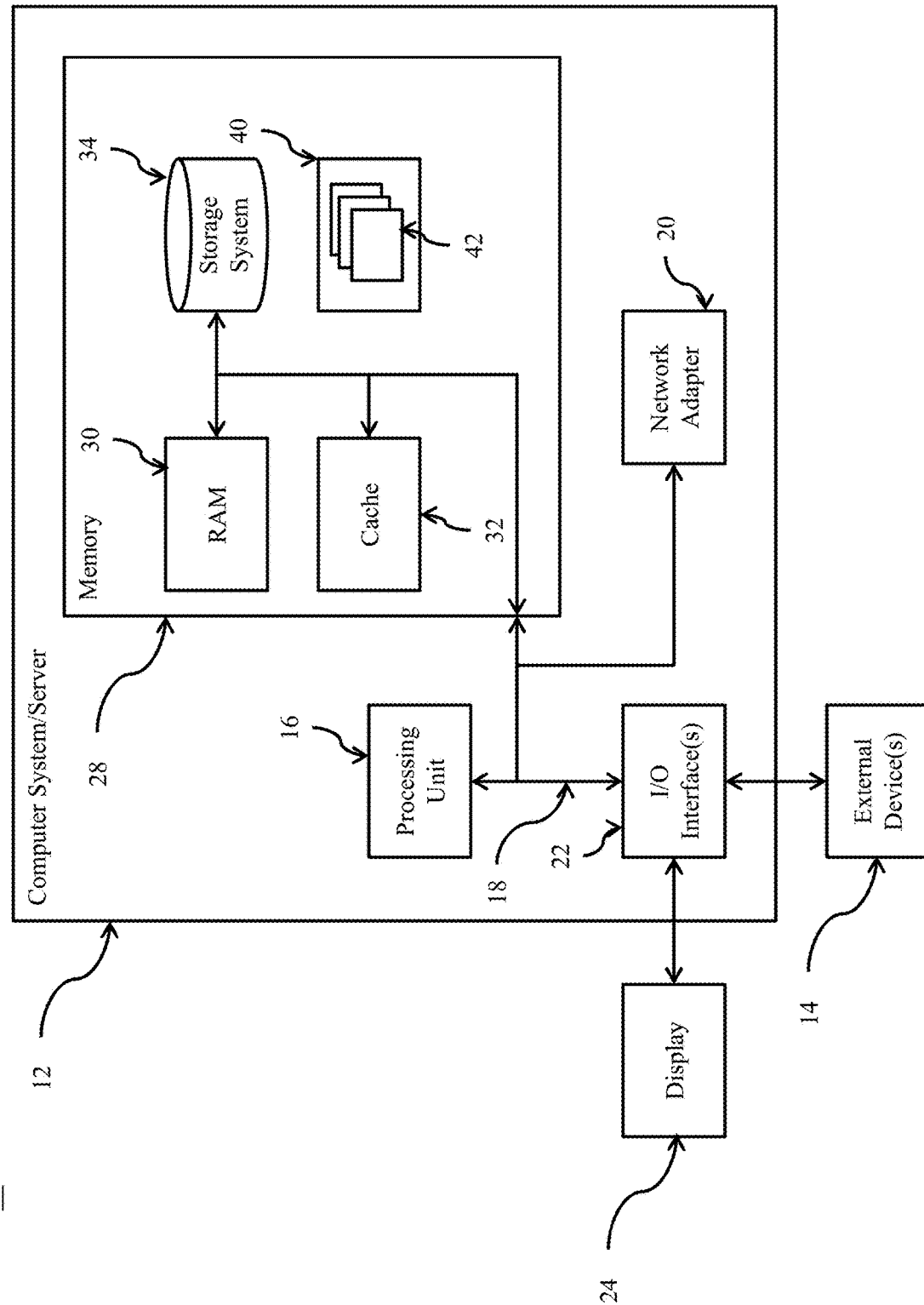
FIG. 16 depicts a computing node according to an embodiment of the present disclosure.

Referring now to FIG. 16, a schematic of an example of a computing node is shown. Computing node 10 is only one example of a suitable computing node and is not intended to suggest any limitation as to the scope of use or functionality of embodiments described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 16, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, Peripheral Component Interconnect Express (PCIe), and Advanced Microcontroller Bus Architecture (AMBA).

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present disclosure may be embodied as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Accordingly, in a first example embodiment, the present invention is an optical device. In a $1^{st}$ aspect of the $1^{st}$ example embodiment, the device comprises a semiconductor layer having a first surface and a second surface, the semiconductor having an electric field-dependent resonance wavelength; a first electrode electrically connected to the semiconductor layer; a first insulating layer adjacent to the first surface of the semiconductor layer, and a second insulating layer adjacent to the second surface of the semiconducting layer, the first and the second insulating layers each being optically transparent at the resonance wavelength; a first group of at least one gate electrodes disposed adjacent to the first insulating layer, and a second group of at least one gate electrodes disposed adjacent to the second insulating layer, each gate electrode being at least 80% optically transparent at the resonance wavelength; wherein the first and the second groups of gate electrodes, taken together, form at least two regions in the semiconductor layer, an electrostatic field in each of the at least two regions being independently controllable by application of voltage to the first and the second groups of gate electrodes, the at least two regions abutting each other along at least one boundary.

As used herein, an "optically transparent" layer refers to a layer having at least 90% transparency at the measurement wavelength.

In a $2^{nd}$ aspect of the $1^{st}$ example embodiment, the semiconductor is a semiconductor having electrostatic doping level-dependent resonance wavelength. The remainder of the features and example features of the $1^{st}$ example embodiment are as described above with respect to the $1^{st}$ aspect.

In a $3^{rd}$ aspect of the $1^{st}$ example embodiment, the semiconductor layer comprises a transition metal dichalcogenide (TMD). The remainder of the features and example features of the $1^{st}$ example embodiment are as described above with respect to the $1^{st}$ through $2^{nd}$ aspects.

In a $4^{th}$ aspect of the $1^{st}$ example embodiment, the TMD is selected from $MoSe_2$, $WSe_2$, $MoS_2$, or $WS_2$. The remainder of the features and example features of the $1^{st}$ example embodiment are as described above with respect to the $1^{st}$ through $3^{rd}$ aspects.

In a $5^{th}$ aspect of the $1^{st}$ example embodiment, the first and second insulating layers each comprises a material independently selected from boron nitride (BN), $SiO_2$, $Al_2O_3$ (alumina), $TiO_2$, or SiN. The remainder of the features and example features of the $1^{st}$ example embodiment are as described above with respect to the $1^{st}$ through $4^{th}$ aspects.

In a $6^{th}$ aspect of the $1^{st}$ example embodiment, the first and second insulating layers are each atomically flat. The remainder of the features and example features of the $1^{st}$ example embodiment are as described above with respect to the $1^{st}$ through $5^{th}$ aspects.

In a $7^{th}$ aspect of the $1^{st}$ example embodiment, each of the plurality of electrodes comprises a material independently selected from graphene, indium tin oxide (ITO), fluorine doped tin oxide (FTO), or doped zinc oxide. The remainder of the features and example features of the $1^{st}$ example embodiment are as described above with respect to the $1^{st}$ through $6^{th}$ aspects.

In an $8^{th}$ aspect of the 1st example embodiment, the first group of gate electrodes and the second group of gate electrodes taken together form a rectangular grid, and wherein the boundaries are straight line segments. The remainder of the features and example features of the $1^{st}$ example embodiment are as described above with respect to the $1^{st}$ through $7^{th}$ aspects.

In a $9^{th}$ aspect of the $1^{st}$ example embodiment, the TMD is $MoSe_2$; the first and second insulating layers each comprises a hexagonal boron nitride (hBN); and each of the plurality of electrodes comprises graphene. The remainder of the features and example features of the $1^{st}$ example embodiment are as described above with respect to the $1^{st}$ through $8^{th}$ aspects.

In a $10^{th}$ aspect of the $1^{st}$ example embodiment, the semiconductor layer is atomically thin. The remainder of the features and example features of the $1^{st}$ example embodiment are as described above with respect to the $1^{st}$ through $9^{th}$ aspects.

In a $2^{nd}$ example embodiment, the present invention is a method of changing the reflective properties of a surface, the surface comprising an optical device of the $1^{st}$ example embodiment and any of its aspects. In a $1^{st}$ aspect of the $2^{nd}$ example embodiment, the method comprises applying a first voltage to the first group of gate electrodes and, optionally, applying a second voltage to the second group of gate electrodes, wherein the second voltage, if applied, is different from the first voltage, thereby shifting the resonance wavelength within the first region, and, optionally, the second region.

In a 3$^{rd}$ example embodiment, the present invention is a method of changing an angle of reflection of an optical beam. In a 1$^{st}$ aspect of the 3$^{rd}$ example embodiment, the method comprises directing an optical beam at the optical device of the 1$^{st}$ example embodiment or any of its aspects, wherein the optical beam is directed at the at least one boundary; applying a first voltage to the first group of gate electrodes and, optionally, applying a second voltage to the second group of gate electrodes, wherein the second voltage, if applied, is different from the first voltage.

In a 2$^{nd}$ aspect of either the 2$^{nd}$ or the 3$^{rd}$ example embodiments, at least one of the first voltage and, if applied, the second voltage, is time-variable. The remainder of the features and example features of the 2$^{nd}$ and the 3$^{rd}$ example embodiments are as described above with respect to any of their respective aspects.

In a 3$^{rd}$ aspect of either the 2$^{nd}$ or the 3$^{rd}$ example embodiments, at least one of the first voltage and, if applied, the second voltage, is periodic. The remainder of the features and example features of the 2$^{nd}$ and the 3$^{rd}$ example embodiments are as described above with respect to any of their respective aspects.

In a 4$^{th}$ example embodiment, the present invention is an optical device. The device comprises at least one optical device of the 1$^{st}$ example embodiment or any of its aspects; at least one voltage source electrically connected to the first and second groups of gate electrodes; a computing node, operatively coupled to the at least one voltage source, the computing node configured to cause the at least one voltage source to apply a first voltage to the first group of gate electrodes and, optionally, to apply a second voltage to the second group of gate electrodes, wherein the second voltage, if applied, is different from the first voltage, thereby shifting the resonant wavelength within the first region, and, optionally, the second region.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An optical device, comprising:
   a semiconductor layer having a first surface and a second surface, the semiconductor having an electric field-dependent resonance wavelength;
   a first electrode electrically connected to the semiconductor layer;
   a first insulating layer adjacent to the first surface of the semiconductor layer, and a second insulating layer adjacent to the second surface of the semiconducting layer, the first and the second insulating layers each being optically transparent at the resonance wavelength;
   a first group of at least one gate electrodes disposed adjacent to the first insulating layer, and a second group of at least one gate electrodes disposed adjacent to the second insulating layer, each gate electrode being at least 80% optically transparent at the resonance wavelength, wherein
   the first and the second groups of gate electrodes, taken together, form at least two regions in the semiconductor layer, an electrostatic field in each of the at least two regions being independently controllable by application of voltage to the first and the second groups of gate electrodes, the at least two regions abutting each other along at least one boundary.

2. The optical device of claim 1, wherein the semiconductor is a semiconductor having electrostatic doping level-dependent resonance wavelength.

3. The optical device of claim 1, wherein the semiconductor layer comprises a transition metal dichalcogenide (TMD).

4. The optical device of claim 3, wherein the TMD is selected from $MoSe_2$, $WSe_2$, $MoS_2$, or $WS_2$.

5. The optical device of claim 1, wherein the first and second insulating layers each comprises a material independently selected from boron nitride (BN), $SiO_2$, $Al_2O_3$ (alumina), $TiO_2$, or SiN.

6. The optical device of claim 1, wherein the first and second insulating layers are each atomically flat.

7. The optical device of claim 1, wherein each of the plurality of electrodes comprises a material independently selected from graphene, indium tin oxide (ITO), fluorine doped tin oxide (FTO), or doped zinc oxide.

8. The optical device of claim 1, wherein the first group of gate electrodes and the second group of gate electrodes taken together form a rectangular grid, and wherein the boundaries are straight line segments.

9. The optical device of claim 1, wherein:
   the TMD is $MoSe_2$;
   the first and second insulating layers each comprises a hexagonal boron nitride (hBN); and
   each of the plurality of electrodes comprises graphene.

10. The optical device of claim 1, wherein the semiconductor layer is atomically thin.

11. A method of changing the reflective properties of a surface, the surface comprising an optical device, the optical device comprising:
    a semiconductor layer having a first surface and a second surface, the semiconductor having an electric field-dependent resonance wavelength;
    a first electrode electrically connected to the semiconductor layer;
    a first insulating layer adjacent to the first surface of the semiconductor layer, and a second insulating layer adjacent to the second surface of the semiconducting layer, the first and the second insulating layers each being optically transparent at the resonance wavelength;
    a first group of at least one gate electrodes disposed adjacent to the first insulating layer, and a second group of at least one gate electrodes disposed adjacent to the second insulating layer, each gate electrode being at least 80% optically transparent at the resonance wavelength, wherein
    the first and the second groups of gate electrodes, taken together, form at least two regions in the semiconductor layer, an electrostatic field in each of the at least two regions being independently controllable by application of voltage to the first and the second groups of gate electrodes, the at least two regions abutting each other along at least one boundary, the method comprising:

applying a first voltage to the first group of gate electrodes and, optionally, applying a second voltage to the second group of gate electrodes, wherein the second voltage, if applied, is different from the first voltage, thereby shifting the resonance wavelength within the first region, and, optionally, the second region.

12. A method of changing an angle of reflection of an optical beam, the method comprising:

directing an optical beam at an optical device comprising:
a semiconductor layer having a first surface and a second surface, the semiconductor having an electric field-dependent resonance wavelength;
a first electrode electrically connected to the semiconductor layer;
a first insulating layer adjacent to the first surface of the semiconductor layer, and a second insulating layer adjacent to the second surface of the semiconducting layer, the first and the second insulating layers each being optically transparent at the resonance wavelength;
a first group of at least one gate electrodes disposed adjacent to the first insulating layer, and a second group of at least one gate electrodes disposed adjacent to the second insulating layer, each gate electrode being at least 80% optically transparent at the resonance wavelength, wherein
the first and the second groups of gate electrodes, taken together, form at least two regions in the semiconductor layer, an electrostatic field in each of the at least two regions being independently controllable by application of voltage to the first and the second groups of gate electrodes, the at least two regions abutting each other along at least one boundary, wherein the optical beam is directed at the at least one boundary; and applying a first voltage to the first group of gate electrodes and, optionally, applying a second voltage to the second group of gate electrodes, wherein the second voltage, if applied, is different from the first voltage.

13. The method of claim 11, wherein at least one of the first voltage and, if applied, the second voltage, is time-variable.

14. The method of claim 1, wherein at least one of the first voltage and, if applied, the second voltage, is periodic.

15. An optical device, comprising:

a semiconductor layer having a first surface and a second surface, the semiconductor having an electric field-dependent resonance wavelength;
a first electrode electrically connected to the semiconductor layer;
a first insulating layer adjacent to the first surface of the semiconductor layer, and a second insulating layer adjacent to the second surface of the semiconducting layer, the first and the second insulating layers each being optically transparent at the resonance wavelength;
a first group of at least one gate electrodes disposed adjacent to the first insulating layer, and a second group of at least one gate electrodes disposed adjacent to the second insulating layer, each gate electrode being at least 80% optically transparent at the resonance wavelength, wherein
the first and the second groups of gate electrodes, taken together, form at least two regions in the semiconductor layer, an electrostatic field in each of the at least two regions being independently controllable by application of voltage to the first and the second groups of gate electrodes, the at least two regions abutting each other along at least one boundary;
at least one voltage source electrically connected to the first and second groups of gate electrodes;
a computing node, operatively coupled to the at least one voltage source, the computing node configured to cause the at least one voltage source to apply a first voltage to the first group of gate electrodes and, optionally, to apply a second voltage to the second group of gate electrodes, wherein the second voltage, if applied, is different from the first voltage,
thereby shifting the resonant wavelength within the first region, and, optionally, the second region.

\* \* \* \* \*